(12) United States Patent
Zhu et al.

(10) Patent No.: US 12,720,863 B2
(45) Date of Patent: Aug. 25, 2026

(54) ARRAY SUBSTRATE AND DISPLAY APPARATUS

(71) Applicant: BOE Technology Group Co., Ltd., Beijing (CN)

(72) Inventors: Jianchao Zhu, Beijing (CN); Tuo Sun, Beijing (CN); Shiming Shi, Beijing (CN); Libin Liu, Beijing (CN); Hao Liu, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 213 days.

(21) Appl. No.: 18/689,411

(22) PCT Filed: Apr. 28, 2023

(86) PCT No.: PCT/CN2023/091550

§ 371 (c)(1),
(2) Date: Mar. 5, 2024

(87) PCT Pub. No.: WO2024/221398

PCT Pub. Date: Oct. 31, 2024

(65) Prior Publication Data

US 2026/0047204 A1 Feb. 12, 2026

(51) Int. Cl.
*H10D 86/40* (2025.01)
*G09G 3/3233* (2016.01)

(52) U.S. Cl.
CPC ......... *H10D 86/481* (2025.01); *G09G 3/3233* (2013.01); *H10D 86/441* (2025.01);
(Continued)

(58) Field of Classification Search
CPC .. H10D 86/481; H10D 86/441; G09G 3/3233; G09G 2300/0426;
(Continued)

(56) References Cited

U.S. PATENT DOCUMENTS

2016/0141351 A1 5/2016 You
2021/0074786 A1 3/2021 Jeon et al.
(Continued)

FOREIGN PATENT DOCUMENTS

CN 105609521 A 5/2016
CN 107369690 A 11/2017
(Continued)

OTHER PUBLICATIONS

Extended European Search Report in the European Patent Application No. 23934590.3, dated Sep. 9, 2025.
(Continued)

*Primary Examiner* — Deeprose Subedi
(74) *Attorney, Agent, or Firm* — Intellectual Valley Law, P.C.

(57) ABSTRACT

An array substrate includes a plurality of pixel driving circuits. A respective pixel driving circuit includes a driving transistor, a data write transistor, a first capacitor including a first capacitor electrode and a second capacitor electrode, and a second capacitor including a third capacitor electrode and a fourth capacitor electrode. The second capacitor electrode and the third capacitor electrode are coupled to a second electrode of the data write transistor. The array substrate includes a stacked structure of capacitor electrodes. The stacked structure includes the first capacitor electrode; an insulating layer on the first capacitor electrode; an electrode block including the second capacitor electrode and the third capacitor electrode on a side of the insulating layer away from the first capacitor electrode; an inter-layer dielectric layer on a side of the electrode block away from the insulating layer; and the fourth capacitor electrode on the inter-layer dielectric layer.

18 Claims, 83 Drawing Sheets

(52) U.S. Cl.
CPC ............... *G09G 2300/0426* (2013.01); *G09G 2300/0819* (2013.01); *G09G 2300/0852* (2013.01); *G09G 2300/0861* (2013.01); *G09G 2310/08* (2013.01); *G09G 2320/0214* (2013.01); *G09G 2320/0247* (2013.01)

(58) Field of Classification Search
CPC ... G09G 2300/0819; G09G 2300/0852; G09G 2300/0861; G09G 2310/08; G09G 2320/0214; G09G 2320/0247
See application file for complete search history.

(56) References Cited

U.S. PATENT DOCUMENTS

2023/0056897 A1 * 2/2023 Kim ..................... H10D 86/021
2023/0131089 A1 4/2023 Lee et al.

FOREIGN PATENT DOCUMENTS

CN 109004012 A 12/2018
CN 110634914 A 12/2019
CN 111243479 A 6/2020
CN 113436569 A 9/2021
CN 114582288 A 6/2022
CN 115668348 A 1/2023
CN 115707364 A 2/2023
CN 115942802 A 4/2023

OTHER PUBLICATIONS

International Search Report & Written Opinion mailed Jun. 23, 2023, regarding PCT/CN2023/091550.

* cited by examiner

ARRAY SUBSTRATE AND DISPLAY APPARATUS

CROSS-REFERENCE TO RELATED APPLICATION

This application is a national stage application under 35 U.S.C. § 371 of International Application No. PCT/CN2023/091550, filed Apr. 28, 2023, the contents of which are incorporated by reference in the entirety.

TECHNICAL FIELD

The present invention relates to display technology, more particularly, to an array substrate and a display apparatus.

BACKGROUND

Organic Light Emitting Diode (OLED) display is one of the hotspots in the field of flat panel display research today. Unlike Thin Film Transistor-Liquid Crystal Display (TFT-LCD), which uses a stable voltage to control brightness, OLED is driven by a driving current required to be kept constant to control illumination. The OLED display panel includes a plurality of pixel units configured with pixel-driving circuits arranged in multiple rows and columns. Each pixel-driving circuit includes a driving transistor having a gate terminal connected to one gate line per row and a drain terminal connected to one data line per column. When the row in which the pixel unit is gated is turned on, the switching transistor connected to the driving transistor is turned on, and the data voltage is applied from the data line to the driving transistor via the switching transistor, so that the driving transistor outputs a current corresponding to the data voltage to an OLED device. The OLED device is driven to emit light of a corresponding brightness.

SUMMARY

In one aspect, the present disclosure provides an array substrate, comprising a plurality of pixel driving circuits; wherein a respective pixel driving circuit of the plurality of pixel driving circuits comprises a driving transistor, a data write transistor, a first capacitor comprising a first capacitor electrode and a second capacitor electrode, and a second capacitor comprising a third capacitor electrode and a fourth capacitor electrode; wherein the second capacitor electrode and the third capacitor electrode are coupled to a second electrode of the data write transistor; wherein the array substrate comprises a stacked structure of capacitor electrodes; wherein the stacked structure comprises the first capacitor electrode; an insulating layer on the first capacitor electrode; an electrode block comprising the second capacitor electrode and the third capacitor electrode on a side of the insulating layer away from the first capacitor electrode; an inter-layer dielectric layer on a side of the electrode block away from the insulating layer; and the fourth capacitor electrode on a side of the inter-layer dielectric layer away from the electrode block.

Optionally, the fourth capacitor electrode is connected to a first voltage supply line.

Optionally, the first capacitor electrode, the insulating layer, and the electrode block form the first capacitor, and the electrode block, the inter-layer dielectric layer, and the fourth capacitor electrode form at least a part of the second capacitor.

Optionally, the array substrate further comprises a plurality of first voltage supply line third branches in a semiconductor material layer; wherein the stacked structure further comprises a gate insulating layer on a side of the first capacitor electrode away from the insulating layer; and a respective first voltage supply line third branch of the plurality of first voltage supply line third branches on a side of the gate insulating layer away from the first capacitor electrode.

Optionally, the first capacitor electrode, the insulating layer, and the electrode block form the first capacitor; the electrode block, the inter-layer dielectric layer, and the fourth capacitor electrode form a first part of the second capacitor; and the electrode block, the insulating layer, the gate insulating layer, a portion of the respective first voltage supply line third branch form a second part of the second capacitor.

Optionally, the array substrate further comprises a first node connecting line and a second node connecting line in a first signal line layer, wherein the respective pixel driving circuit further comprises a compensating transistor, a first reset transistor, and a second reset transistor; the first node connecting line connects the first capacitor electrode with a second electrode of the compensating transistor and/or a second electrode of the first reset transistor; and the second node connecting line connects the electrode block with a second electrode of the data write transistor and/or a second electrode of the second reset transistor.

Optionally, the first node connecting line and the second node connecting line are on a side of the fourth capacitor electrode away from the electrode block.

Optionally, the first node connecting line and the second node connecting line are in a same layer as the fourth capacitor electrode.

Optionally, the array substrate further comprises a fourth node portion in a semiconductor material layer; wherein the respective pixel driving circuit further comprises a compensating transistor and a second light emitting control transistor; wherein the fourth node portion comprises at least a portion of a second electrode of the driving transistor, at least a portion of a first electrode of the compensating transistor, and at least a portion of a first electrode of the second light emitting control transistor; and an orthographic projection of the fourth node portion on a base substrate at least partially overlaps with an orthographic projection of a respective data line of a plurality of data lines on the base substrate.

Optionally, the orthographic projection of the fourth node portion on the base substrate is at least 50% covered by an orthographic projection of a combination of the fourth capacitor electrode and a respective first reset signal line of a plurality of first reset signal lines on the base substrate.

Optionally, the fourth capacitor electrode comprises a first portion and a second portion; an orthographic projection of the first portion on the base substrate substantially covers an orthographic projection of the electrode block on the base substrate; an orthographic projection of the second portion on the base substrate is non-overlapping with the orthographic projection of the electrode block on the base substrate; and the orthographic projection of the fourth node portion on the base substrate partially overlaps with the orthographic projection of the second portion on the base substrate.

Optionally, the orthographic projection of the second portion on the base substrate partially overlaps with an orthographic projection of a respective reset control signal line of a plurality of reset control signal lines on the base substrate, and partially overlaps with an orthographic projection of a respective second compensation control signal line of a plurality of second compensation control signal lines on the base substrate.

Optionally, the respective first reset signal line comprises a main body, a first protrusion extending away from the main body, and a second protrusion extending away from the main body; the first protrusion and the second protrusion extend away from the main body along substantially opposite directions; and the orthographic projection of the fourth node portion on a base substrate partially overlaps with an orthographic projection of the first protrusion and the second protrusion on the base substrate, and partially overlaps with an orthographic projection of a portion of the main body connecting the first protrusion and the second protrusion on the base substrate.

Optionally, the array substrate further comprises a first data line configured to provide data signals to a first subpixel; a second data line configured to provide data signals to a second subpixel; a third data line configured to provide data signals to a third subpixel; a first anode in the first subpixel; a second anode in the second subpixel; and a third anode in the third subpixel; wherein an orthographic projection of a combination of the first anode, the second anode, and the third anode on a base substrate partially overlaps with an orthographic projection of the first data line on the base substrate, partially overlaps with an orthographic projection of the second data line on the base substrate, and is non-overlapping with an orthographic projection of the third data line on the base substrate.

Optionally, the orthographic projection of the first data line on the base substrate partially overlaps with an orthographic projection of the first anode on the base substrate, and partially overlaps with an orthographic projection of the second anode on the base substrate; and the orthographic projection of the second data line on the base substrate partially overlaps with an orthographic projection of the third anode on the base substrate.

Optionally, a length of a first overlapping area where an orthographic projection of the first anode on the base substrate overlaps with an orthographic projection of a first corresponding data line on the base substrate along an extension direction of the first corresponding data line is less than a total length of the first anode along the extension direction of the first corresponding data line; a length of a second overlapping area where an orthographic projection of the second anode on the base substrate overlaps with an orthographic projection of a second corresponding data line on the base substrate along an extension direction of the second corresponding data line is less than a total length of the second anode along the extension direction of the second corresponding data line; a length of a third overlapping area where an orthographic projection of the third anode on the base substrate overlaps with an orthographic projection of a third corresponding data line on the base substrate along an extension direction of the third corresponding data line is less than a total length of the third anode along the extension direction of the third corresponding data line; and the first corresponding data line, the second corresponding data line, and the third corresponding data line are selected from the first data line and the second data line.

Optionally, the array substrate further comprises an interconnected first voltage supply network; wherein the interconnected first voltage supply network comprises a plurality of first voltage supply line third branches in a semiconductor material layer; a unitary structure comprising multiple fourth capacitor electrodes in a same row in a first signal line layer on a side of the semiconductor material layer away from a base substrate; and a plurality of first voltage supply line second branches in a second signal line layer on a side of the first signal line layer away from the semiconductor material layer.

Optionally, a portion of a respective first voltage supply line third branch of the plurality of first voltage supply line third branches, the electrode block, and one or more insulating material layers between the respective first voltage supply line third branch and the electrode block form a part of the second capacitor.

Optionally, the respective pixel driving circuit further comprises a compensating transistor, a first reset transistor, a first light emitting control transistor, a second light emitting control transistor, a second reset transistor, a third reset transistor, a fourth reset transistor, a first node, a second node, a third node, and a fourth node; wherein the first node is connected to the first capacitor electrode of the first capacitor, a second electrode of the compensating transistor, and a gate electrode of the driving transistor; the second node is connected to the second capacitor electrode of the first capacitor, the third capacitor electrode of the second capacitor, a second electrode of the data write transistor, and a second electrode of the second reset transistor; the third node is connected to a second electrode of the first light emitting control transistor, a second electrode of the fourth reset transistor, and a first electrode of the driving transistor; and the fourth node is connected to a second electrode of the driving transistor, a first electrode of the compensating transistor, and a first electrode of the second light emitting control transistor.

In another aspect, the present disclosure provides a display apparatus, comprising the array substrate described herein or fabricated by a method described herein, and one or more integrated circuits connected to the array substrate.

BRIEF DESCRIPTION OF THE FIGURES

The following drawings are merely examples for illustrative purposes according to various disclosed embodiments and are not intended to limit the scope of the present invention.

DETAILED DESCRIPTION

The disclosure will now be described more specifically with reference to the following embodiments. It is to be noted that the following descriptions of some embodiments are presented herein for purpose of illustration and description only. It is not intended to be exhaustive or to be limited to the precise form disclosed.

The present disclosure provides, inter alia, an array substrate and a display apparatus that substantially obviate one or more of the problems due to limitations and disadvantages of the related art. In one aspect, the present disclosure provides an array substrate. In some embodiments, the array substrate includes a plurality of pixel driving circuits. Optionally, a respective pixel driving circuit of the plurality of pixel driving circuits comprises a driving transistor, a data write transistor, a first capacitor comprising a first capacitor electrode and a second capacitor electrode, and a second capacitor comprising a third capacitor electrode and a fourth capacitor electrode. Optionally, the second capacitor electrode and the third capacitor electrode are coupled to a second electrode of the data write transistor. Optionally, the array substrate comprises a stacked structure of capacitor electrodes. Optionally, the stacked structure comprises the first capacitor electrode; an insulating layer on the first capacitor electrode; an electrode block comprising the second capacitor electrode and the third capacitor electrode on a side of the insulating layer away from the first capacitor electrode; an inter-layer dielectric layer on a side of the electrode block away from the insulating layer; and the fourth capacitor electrode on a side of the inter-layer dielectric layer away from the electrode block.

Various appropriate pixel driving circuits may be used in the present array substrate. Examples of appropriate driving circuits include 3T1C, 2T1C, 4T1C, 4T2C, 5T2C, 6T1C, 7T1C, 7T2C, 8T1C, and 8T2C. In some embodiments, the respective one of the plurality of pixel driving circuits is a 9T2C driving circuit. Various appropriate light emitting elements may be used in the present array substrate. Examples of appropriate light emitting elements include organic light emitting diodes, quantum dots light emitting diodes, and micro light emitting diodes. Optionally, the light emitting element is micro light emitting diode. Optionally, the light emitting element is an organic light emitting diode including an organic light emitting layer.

Figure 1:
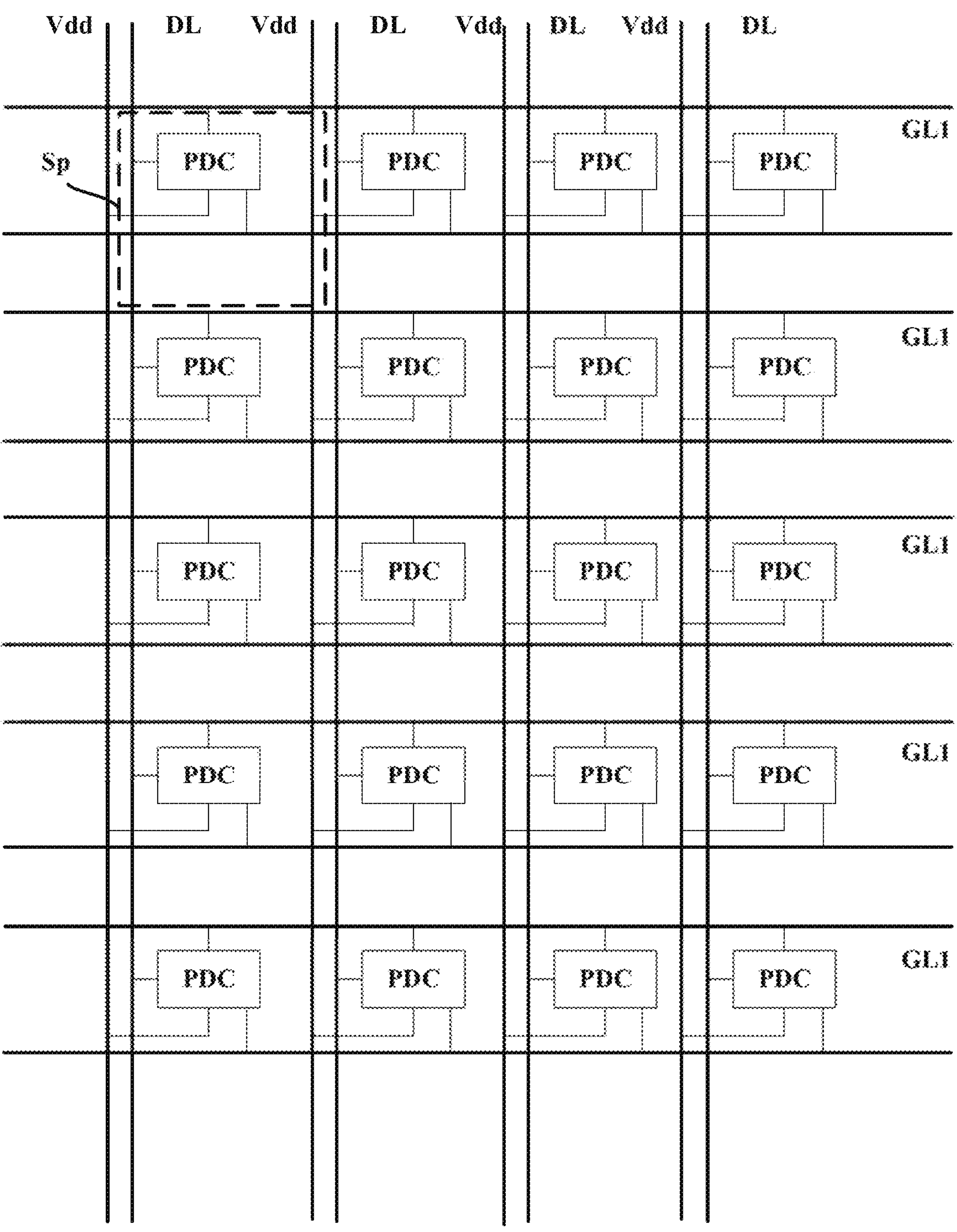
FIG. 1 is a plan view of an array substrate in some embodiments according to the present disclosure.

FIG. 1 is a plan view of an array substrate in some embodiments according to the present disclosure. Referring to FIG. 1, the array substrate includes an array of subpixels Sp. Each subpixel includes an electronic component, e.g., a light emitting element. In one example, the light emitting element is driven by a respective pixel driving circuit PDC. The array substrate includes a plurality of gate lines GL, a plurality of data lines DL, a plurality of first voltage supply line Vdd, and a respective second voltage supply line (e.g., a low voltage supply line). Light emission in a respective subpixel Sp is driven by a respective pixel driving circuit PDC. In one example, a high voltage signal (e.g., a VDD signal) is input, through the respective first voltage supply line of the plurality of first voltage supply line Vdd, to the respective pixel driving circuit PDC connected to an anode of the light emitting element; a low voltage signal (e.g., a VSS signal) is input, through a low voltage supply line, to a cathode of the light emitting element. A voltage difference between the high voltage signal (e.g., the VDD signal) and the low voltage signal (e.g., the VSS signal) is a driving voltage ΔV that drives light emission in the light emitting element.

Figure 2:
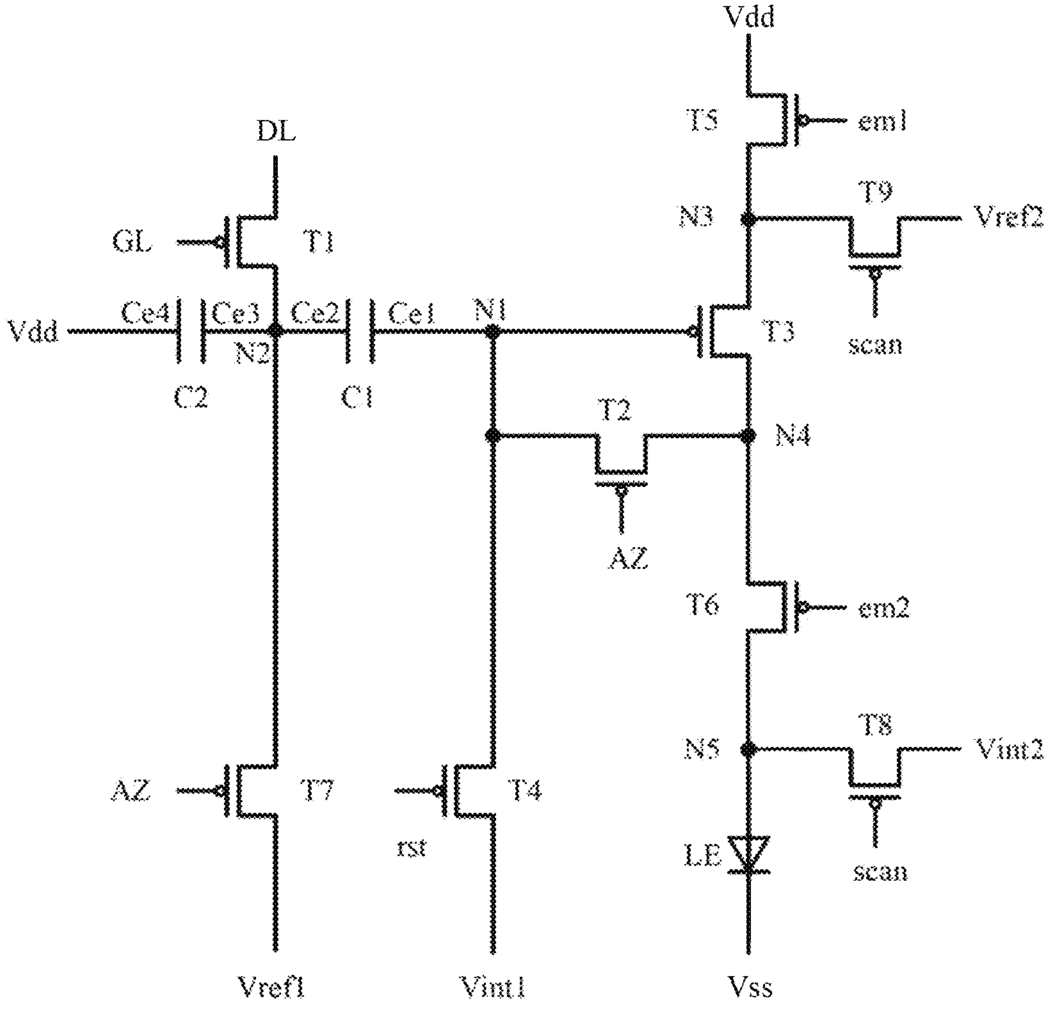
FIG. 2 is a circuit diagram illustrating the structure of a pixel driving circuit in some embodiments according to the present disclosure.

In some embodiments, the pixel driving circuit includes a data write sub-circuit configured to receive a data signal, a storage capacitor sub-circuit, a reset sub-circuit, a threshold compensating sub-circuit, a driving sub-circuit, and a light emitting control sub-circuit. FIG. 2 is a circuit diagram illustrating the structure of a pixel driving circuit in some embodiments according to the present disclosure. Referring to FIG. 2, in some embodiments, the respective pixel driving circuit includes a first transistor T1 (a data write transistor), a second transistor T2 (a compensating transistor), a third transistor T3 (a driving transistor), a fourth transistor T4 (a first reset transistor), a fifth transistor T5 (a first light emitting control transistor), a sixth transistor T6 (a second light emitting control transistor), a seventh transistor T7 (a second reset transistor), an eighth transistor T8 (a third reset transistor), a ninth transistor T9 (a fourth reset transistor), a first capacitor C1, and a second capacitor C2. In some embodiments, the data write sub-circuit include the first transistor T1; the storage capacitor sub-circuit includes the first capacitor C1 and the second capacitor C2; the reset sub-circuit includes the fourth transistor T4, the seventh transistor T7, the eighth transistor T8, and the ninth transistor T9; the threshold compensating sub-circuit includes the second transistor T2, the driving sub-circuit includes the third transistor T3, and the light emitting control sub-circuit includes the fifth transistor T5 and the sixth transistor T6.

In some embodiments, the pixel driving circuit includes a first node N1, a second node N2, a third node N3, a fourth node N4, and a fifth node N5. In some embodiments, the first node N1 is connected to a first capacitor electrode Ce1 of the first capacitor C1, a second electrode of the second transistor T2, and a gate electrode of the third transistor T3. In some embodiments, the second node N2 is connected to a second capacitor electrode Ce2 of the first capacitor C1, a third capacitor electrode Ce3 of the second capacitor C2, a second electrode of the first transistor T1, and a second electrode of the seventh transistor T7. In some embodiments, the third node N3 is connected to a second electrode of the fifth transistor T5, a second electrode of the ninth transistor T9, and a first electrode of the third transistor T3. In some embodiments, the fourth node N4 is connected to a second electrode of the third transistor T3, a first electrode of the second transistor T2, and a first electrode of the sixth transistor T6. In some embodiments, the fifth node N5 is connected to a second electrode of the sixth transistor T6, a second electrode of the eighth transistor T8, and an anode of a light emitting element LE.

In some embodiments, a gate electrode of the first transistor T1 is connected to a respective gate line of a plurality of gate lines GL, a first electrode of the first transistor T1 is connected to a respective data line of a plurality of data lines DL, and a second electrode of the first transistor T1 is connected to the second capacitor electrode Ce2 of the first capacitor C1, the third capacitor electrode Ce3 of the second capacitor C2, and the second electrode of the seventh transistor T7.

In some embodiments, a gate electrode of the second transistor T2 is connected to a respective compensation control signal line of a plurality of compensation control signal lines AZ, a first electrode of the second transistor T2 is connected to a second electrode of the third transistor T3 and a first electrode of the sixth transistor T6, and a second electrode of the second transistor T2 is connected to a first capacitor electrode Ce1 of the first capacitor C1 and a gate electrode of the third transistor T3.

In some embodiments, a gate electrode of the third transistor T3 is connected to a first capacitor electrode Ce1 of the first capacitor C1, a second electrode of the second transistor T2, and a second electrode of the fourth transistor T4; a first electrode of the third transistor T3 is connected to a second electrode of the fifth transistor T5 and a second electrode of the ninth transistor T9; and a second electrode of the third transistor T3 is connected to a first electrode of the second transistor T2 and a first electrode of the sixth transistor T6.

In some embodiments, a gate electrode of the fourth transistor T4 is connected to a respective reset control signal line of a plurality of reset control signal lines rst; a first electrode of the fourth transistor T4 is connected to a respective first reset signal line of a plurality of first reset signal lines Vint1; and a second electrode of the fourth transistor T4 is connected to a second electrode of the second transistor T2, a first capacitor electrode Ce1 of the first capacitor C1, and a gate electrode of the third transistor T3.

In some embodiments, a gate electrode of the fifth transistor T5 is connected to a respective first light emitting control signal line of a plurality of first light emitting control signal lines em1; a first electrode of the fifth transistor T5 is connected to a first voltage supply line of a plurality of first voltage supply lines Vdd; and a second electrode of the fifth transistor T5 is connected to a first electrode of the third transistor T3 and a second electrode of the ninth transistor T9.

In some embodiments, a gate electrode of the sixth transistor T6 is connected to a respective second light emitting control signal line of a plurality of second light emitting control signal lines em2; a first electrode of the sixth transistor T6 is connected to a first electrode of the second transistor T2 and a second electrode of the third transistor T3; and a second electrode of the sixth transistor T6 is connected to a second electrode of the eighth transistor T8 and an anode of a light emitting element LE.

In some embodiments, a gate electrode of the seventh transistor T7 is connected to a respective compensation control signal line of a plurality of compensation control signal lines AZ; a first electrode of the seventh transistor T7 is connected to a respective first reference signal line of a plurality of first reference signal lines Vref1; and a second electrode of the seventh transistor T7 is connected to a second capacitor electrode Ce2 of the first capacitor C1, a third capacitor electrode Ce3 of the second capacitor C2, and a second electrode of the first transistor T1.

In some embodiments, a gate electrode of the eighth transistor T8 is connected to a respective scan line of a plurality of scan lines scan; a first electrode of the eighth transistor T8 is connected to a respective second reset signal line of a plurality of second reset signal lines Vint2; and a second electrode of the eighth transistor T8 is connected to a second electrode of the sixth transistor T6 and an anode of the light emitting element LE.

In some embodiments, a gate electrode of the ninth transistor T9 is connected to a respective scan line of a plurality of scan lines scan; a first electrode of the ninth transistor T9 is connected to a respective second reference signal line of a plurality of second reference signal lines Vref2; and a second electrode of the ninth transistor T9 is connected to a second electrode of the fifth transistor T5 and a first electrode of the third transistor T3.

In some embodiments, a first capacitor electrode Ce1 of the first capacitor C1 is connected to a gate electrode of the third transistor T3, a second electrode of the second transistor T2, and a second electrode of the fourth transistor T4; and a second capacitor electrode Ce2 of the first capacitor C1 is connected to a second electrode of the first transistor T1, a third capacitor electrode Ce3 of the second capacitor C2, and a second electrode of the seventh transistor T7.

In some embodiments, a third capacitor electrode Ce3 of the second capacitor C2 is connected to a second electrode of the first transistor T1, a second capacitor electrode Ce2 of the first capacitor C1, and a second electrode of the seventh transistor T7; and a fourth capacitor electrode Ce4 of the second capacitor C2 is connected to a first voltage supply line of a plurality of first voltage supply lines Vdd.

As used herein, a first electrode or a second electrode refers to one of a first terminal and a second terminal of a transistor, the first terminal and the second terminal being connected to an active layer of the transistor. A direction of a current flowing through the transistor may be configured to be from a first electrode to a second electrode, or from a second electrode to a first electrode. Accordingly, depending on the direction of the current flowing through the transistor, in one example, the first electrode is configured to receive an input signal and the second electrode is configured to output an output signal; in another example, the second electrode is configured to receive an input signal and the first electrode is configured to output an output signal.

In some embodiments, one or more transistors in the pixel driving circuit may be a "double gate" transistor. Optionally, in a "double gate" transistor, the active layer of the transistor crosses over a gate electrode twice (alternatively, the gate electrode crosses over the active layer of the transistor twice). In one example, at least one of the first transistor T1, the second transistor T2, the fourth transistor T4, the fifth transistor T5, the sixth transistor T6, or the seventh transistor T7 is a "double gate" transistor. In another example, the first transistor T1, the second transistor T2, the fourth transistor T4, the fifth transistor T5, the sixth transistor T6, and the seventh transistor T7 are "double gate" transistors.

The present disclosure may be implemented in pixel driving circuit having transistors of various types, including a pixel driving circuit having p-type transistors such as polysilicon transistors, a pixel driving circuit having n-type transistors such as a metal oxide transistor, and a pixel driving circuit having one or more p-type transistors and one or more n-type transistors. For a p-type transistor, an effective control signal (e.g., a turn-on control signal) is a low voltage signal, and an ineffective control signal (e.g., a turn-off control signal) is a high voltage signal. For an n-type transistor, an effective control signal (e.g., a turn-on control signal) is a high voltage signal, and an ineffective control signal (e.g., a turn-off control signal) is a low voltage signal. Referring to FIG. 2, in some embodiments, the transistors in the pixel driving circuit are p-type transistors.

Figure 3A:
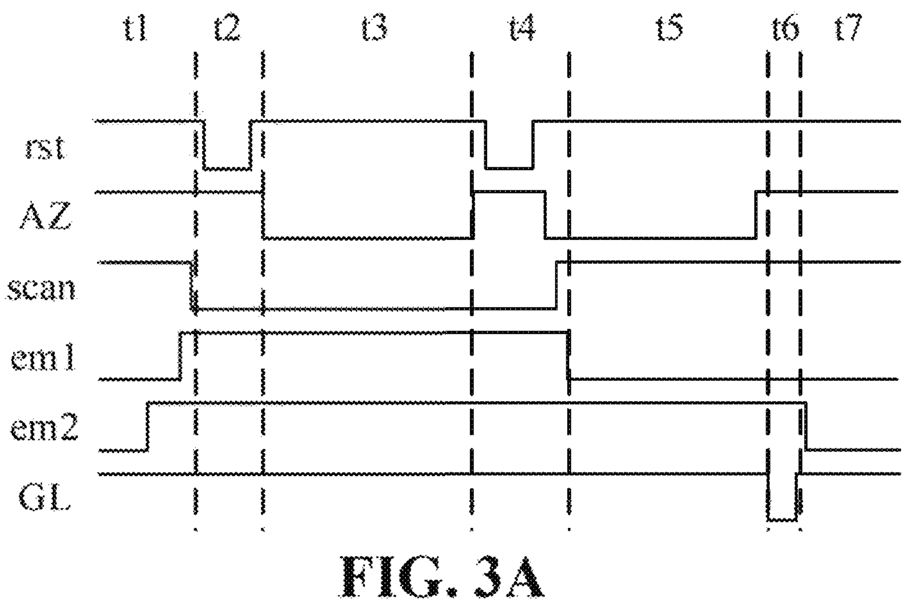
FIG. 3A is a timing diagram illustrating the operation of a pixel driving circuit in some embodiments according to the present disclosure.
Figure 3B:
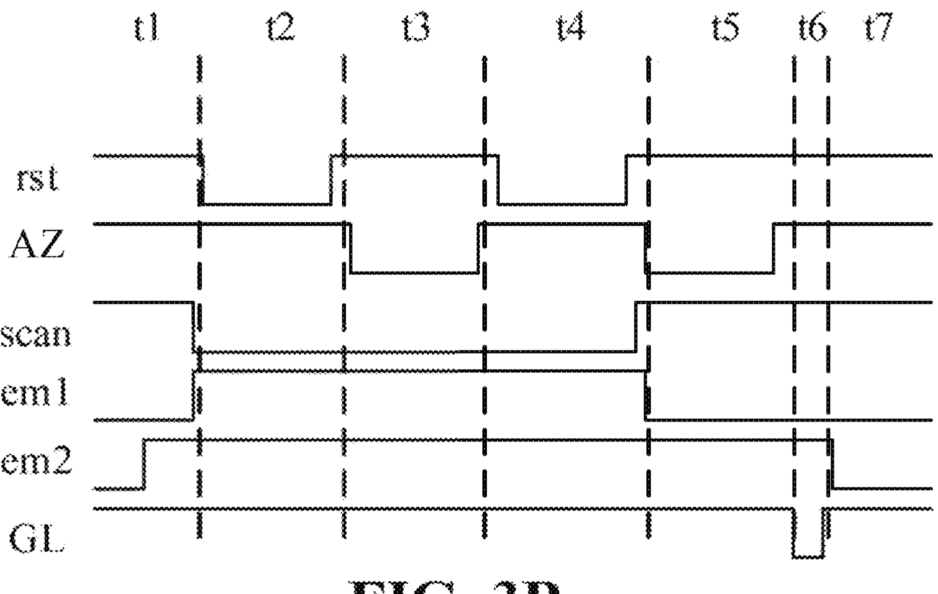
FIG. 3B is a timing diagram illustrating the operation of a pixel driving circuit in some embodiments according to the present disclosure.

FIG. 3A is a timing diagram illustrating the operation of a pixel driving circuit in some embodiments according to the present disclosure. FIG. 3B is a timing diagram illustrating the operation of a pixel driving circuit in some embodiments according to the present disclosure. Referring to FIG. 2, FIG. 3A, and FIG. 3B, during one frame of image, the operation of the pixel driving circuit includes a first phase t1, a second phase t2, a third phase t3, a fourth phase t4, a fifth phase t5, a sixth phase t6, and a seventh phase t7. In the first phase t1, a turning-off reset control signal is provided through the respective reset control signal line of the plurality of reset control signal lines rst to the gate electrode of the fourth transistor T4 to turn off the fourth transistor T4. In the first phase t1, the respective gate line of the plurality of gate lines GL is provided with a turning-off signal, thus the first transistor T1 is turned off.

In the second phase t2, a turning-on reset control signal is provided through the respective reset control signal line of the plurality of reset control signal lines rst to the gate electrode of the fourth transistor T4 to turn on the fourth transistor T4; allowing an initialization voltage signal from the respective first reset signal line of the plurality of first reset signal lines Vint1 to pass from a first electrode of the fourth transistor T4 to a second electrode of the fourth transistor T4, and in turn to the first capacitor electrode Ce1 and the gate electrode of the third transistor T3. The first node N1 is reset. The gate electrode of the third transistor T3 is initialized.

In the second phase t2, a turning-on scan signal is provided through the respective scan signal line of the plurality of scan signal lines scan to a gate electrode of the eighth transistor T8 to turn on the eighth transistor T8; allowing an initialization voltage signal from the respective second reset signal line of the plurality of second reset signal lines Vint2 to pass from a first electrode of the eighth transistor T8 to a second electrode of the eighth transistor T8, and in turn to the second electrode of the sixth transistor T6 and an anode of the light emitting element LE. The fifth node N5 is reset.

In the second phase t2, a turning-on scan signal is provided through the respective scan signal line of the plurality of scan signal lines scan to a gate electrode of the ninth transistor T9 to turn on the ninth transistor T9; allowing a second reference voltage signal from the respective second reference signal line of the plurality of second reference signal lines Vref2 to pass from a first electrode of the ninth transistor T9 to a second electrode of the ninth transistor T9, and in turn to the second electrode of the fifth transistor T5 and the first electrode of the third transistor T3. The third node N3 is reset.

In the third phase t3, a turning-on scan signal is provided through the respective compensation control signal line of the plurality of compensation control signal lines AZ to turn on the seventh transistor T7; allowing a first reference voltage signal from the respective first reference signal line of the plurality of first reference signal lines Vref1 to pass from a first electrode of the seventh transistor T7 to a second electrode of the seventh transistor T7, and in turn to the second capacitor electrode Ce2 of the first capacitor C1, the third capacitor electrode Ce3 of the second capacitor C2, and the second electrode of the first transistor T1. The second node N2 is reset.

In the fourth phase t4, a turning-on reset control signal is provided through the respective reset control signal line of the plurality of reset control signal lines rst to the gate electrode of the fourth transistor T4 to turn on the fourth transistor T4; allowing an initialization voltage signal from the respective first reset signal line of the plurality of first reset signal lines Vint1 to pass from a first electrode of the fourth transistor T4 to a second electrode of the fourth transistor T4, and in turn to the first capacitor electrode Ce1 and the gate electrode of the third transistor T3. The first node N1 is reset. The gate electrode of the third transistor T3 is initialized.

In the fourth phase t4, a turning-on scan signal is provided through the respective scan signal line of the plurality of scan signal lines scan to a gate electrode of the eighth transistor T8 to turn on the eighth transistor T8; allowing an initialization voltage signal from the respective second reset signal line of the plurality of second reset signal lines Vint2 to pass from a first electrode of the eighth transistor T8 to a second electrode of the eighth transistor T8, and in turn to the second electrode of the sixth transistor T6 and an anode of the light emitting element LE. The fifth node N5 is reset.

In the fourth phase t4, a turning-on scan signal is provided through the respective scan signal line of the plurality of scan signal lines scan to a gate electrode of the ninth transistor T9 to turn on the ninth transistor T9; allowing a second reference voltage signal from the respective second reference signal line of the plurality of second reference signal lines Vref2 to pass from a first electrode of the ninth transistor T9 to a second electrode of the ninth transistor T9, and in turn to the second electrode of the fifth transistor T5 and the first electrode of the third transistor T3. The third node N3 is reset.

In the fifth phase t5, a turning-on scan signal is provided through the respective first light emitting control signal line of the plurality of first light emitting control signal lines em1 to a gate electrode of the fifth transistor T5 to turn on the fifth transistor T5; allowing a first voltage supply signal from the respective first voltage supply signal line of the plurality of first voltage supply signal lines Vdd to pass from a first electrode of the fifth transistor T5 to a second electrode of the fifth transistor T5, and in turn to the first electrode of the third transistor T3. A second electrode of the third transistor T3 is connected with the first electrode of the second transistor T2. A gate electrode of the third transistor T3 is electrically connected with the second electrode of the second transistor T2. Because the second transistor T2 is turned on in the fifth phase t5, the gate electrode and the second electrode of the third transistor T3 are connected and short circuited, and only the PN junction between the gate electrode and a first electrode of the third transistor T3 is effective, thus rendering the third transistor T3 in a diode connecting mode. The first node N1 is written to (Vdd−Vth), wherein Vth is the threshold voltage of the third transistor T3.

In the fifth phase t5, a turning-on scan signal is provided through the respective compensation control signal line of the plurality of compensation control signal lines AZ to turn on the seventh transistor T7 and the second transistor T2; allowing a first reference voltage signal from the respective first reference voltage signal line of the plurality of first reference voltage signal lines Vref1 to pass from a first electrode of the seventh transistor T7 to a second electrode of the seventh transistor T7, and in turn to the second node N2. The voltage stored in the first capacitor C1 is Vdd−Vth−Vref2. The second transistor writes the voltage information of the respective first voltage supply line and the voltage information of the threshold voltage of the third transistor T3 into one end of the first capacitor C1.

In the sixth phase t6, turning-off signals are provided to the respective scan line of the plurality of scan lines scan, the respective second light emitting control signal line of the plurality of second light emitting control signal lines em2, the respective compensation control signal line of the plurality of compensation control signal lines AZ, thereby turning off the second transistor T2, the sixth transistor T6, and the ninth transistor T9. The voltage of the first node N1 maintains at (Vdd−Vth) by the first capacitor C1. In the sixth phase t6, the respective gate line of the plurality of gate lines GL is provided with a turning-on signal, thus the first transistor T1 is turned on. The data voltage of a data signal is written to the second node N2. Due to the bootstrap action of the first capacitor C1, the voltage of the first node N1 is bootstrapped to (Vdd−Vth+Vdt), thereby turning on the third transistor T3.

In the seventh phase t7, turning-off signals are provided to the respective gate line of the plurality of gate lines GL, the respective scan line of the plurality of scan lines scan, the respective compensation control signal line of the plurality of compensation control signal lines AZ, and the respective reset control signal line of the plurality of reset control signal lines rst, thereby turning off the first transistor T1, the second transistor T2, the fourth transistor T4, the seventh transistor T7, the eighth transistor T8, and the ninth transistor T9. In the seventh phase t7, turning-on signals are provided to the respective first light emitting control signal line of the plurality of first light emitting control signal lines em1 and the respective second light emitting control signal line of the plurality of second light emitting control signal lines em2, turning on the fifth transistor T5 and the sixth transistor T6. The third transistor T3 is turned on by (Vdd−Vth+Vdt), and working in the saturation area. A path is formed through the fifth transistor T5, the third transistor T3, the sixth transistor T6, to the light emitting element LE. The driving transistor Td generates a driving current for driving the light emitting element LE to emit light. A voltage level at the fifth node N5 connected to the second electrode of the sixth transistor T6 equals to a light emitting voltage of the light emitting element LE.

The respective compensation control signal line of the plurality of compensation control signal lines AZ may have various appropriate duty cycles. The respective compensation control signal line of the plurality of compensation control signal lines AZ may have various appropriate durations of effective voltage (turning-on voltage). In one example as depicted in FIG. 3A, a duration of the effective voltage of the respective compensation control signal line of the plurality of compensation control signal lines AZ is greater than a duration of an effective voltage of the respective reset control signal line of the plurality of reset control signal lines rst. In another example as depicted in FIG. 3B, a duration of the effective voltage of the respective compensation control signal line of the plurality of compensation control signal lines AZ is substantially the same as a duration of an effective voltage of the respective reset control signal line of the plurality of reset control signal lines rst. As used herein, the term "substantially the same" refers to a difference between two values not exceeding 10% of a base value (e.g., one of the two values), e.g., not exceeding 8%, not exceeding 6%, not exceeding 4%, not exceeding 2%, not exceeding 1%, not exceeding 0.5%, not exceeding 0.1%, not exceeding 0.05%, and not exceeding 0.01%, of the base value.

The array substrate in some embodiments includes a plurality of subpixels. In some embodiments, the plurality of subpixels includes a respective first subpixel, a respective second subpixel, and a respective third subpixel. Optionally, a respective pixel of the array substrate includes the respective first subpixel, the respective second subpixel, and the respective third subpixel. The plurality of subpixels in the array substrate are arranged in an array. In one example, the array of the plurality of subpixels includes a S1-S2-S3 format repeating array, in which S1 stands for the respective first subpixel, S2 stands for the respective second subpixel, and S3 stands for the respective third subpixel. In another example, the S1-S2-S3 format is a C1-C2-C3 format, in which C1 stands for the respective first subpixel of a first color, C2 stands for the respective second subpixel of a second color, and C3 stands for the respective third subpixel of a third color. In another example, the C1-C2-C3 format is an R-G-B format, in which the respective first subpixel is a red subpixel, the respective second subpixel is a green subpixel, and the respective third subpixel is a blue subpixel.

In another example, the array of the plurality of subpixels includes a S1-S2-S3-S4 format repeating array, in which S1 stands for the respective first subpixel, S2 stands for the respective second subpixel, S3 stands for the respective third subpixel, and S4 stands for the respective fourth subpixel. In another example, the S1-S2-S3-S4 format is a C1-C2-C3-C4 format, in which C1 stands for the respective first subpixel of a first color, C2 stands for the respective second subpixel of a second color, C3 stands for the respective third subpixel of a third color, and C4 stands for the respective fourth subpixel of a fourth color. In another example, the S1-S2-S3-S4 format is a C1-C2-C3-C2' format, in which C1 stands for the respective first subpixel of a first color, C2 stands for the respective second subpixel of a second color, C3 stands for the respective third subpixel of a third color, and C2' stands for the respective fourth subpixel of the second color. In another example, the C1-C2-C3-C2' format is a R-G-B-G format, in which the respective first subpixel is a red subpixel, the respective second subpixel is a green subpixel, the respective third subpixel is a blue subpixel, and the respective fourth subpixel is a green subpixel.

In some embodiments, a minimum repeating unit of the plurality of subpixels of the array substrate includes a respective first subpixel, a respective second subpixel, and a respective third subpixel. Optionally, each of the respective first subpixel, the respective second subpixel, and the respective third subpixel, includes the first transistor T1, the second transistor T2, the third transistor T3, the fourth transistor T4, the fifth transistor T5, the sixth transistor T6, the seventh transistor T7, the eighth transistor T8, the ninth transistor T9, the first capacitor C1, and the second capacitor C2.

In alternative embodiments, a minimum repeating unit of the plurality of subpixels of the array substrate includes a respective first subpixel, a respective second subpixel, a respective third subpixel, and a respective fourth subpixel. Optionally, each of the respective first subpixel, the respective second subpixel, the respective third subpixel, and the respective fourth subpixel, includes the first transistor T1, the second transistor T2, the third transistor T3, the fourth transistor T4, the fifth transistor T5, the sixth transistor T6, the seventh transistor T7, the eighth transistor T8, the ninth transistor T9, the first capacitor C1, and the second capacitor C2.

Figure 4A:
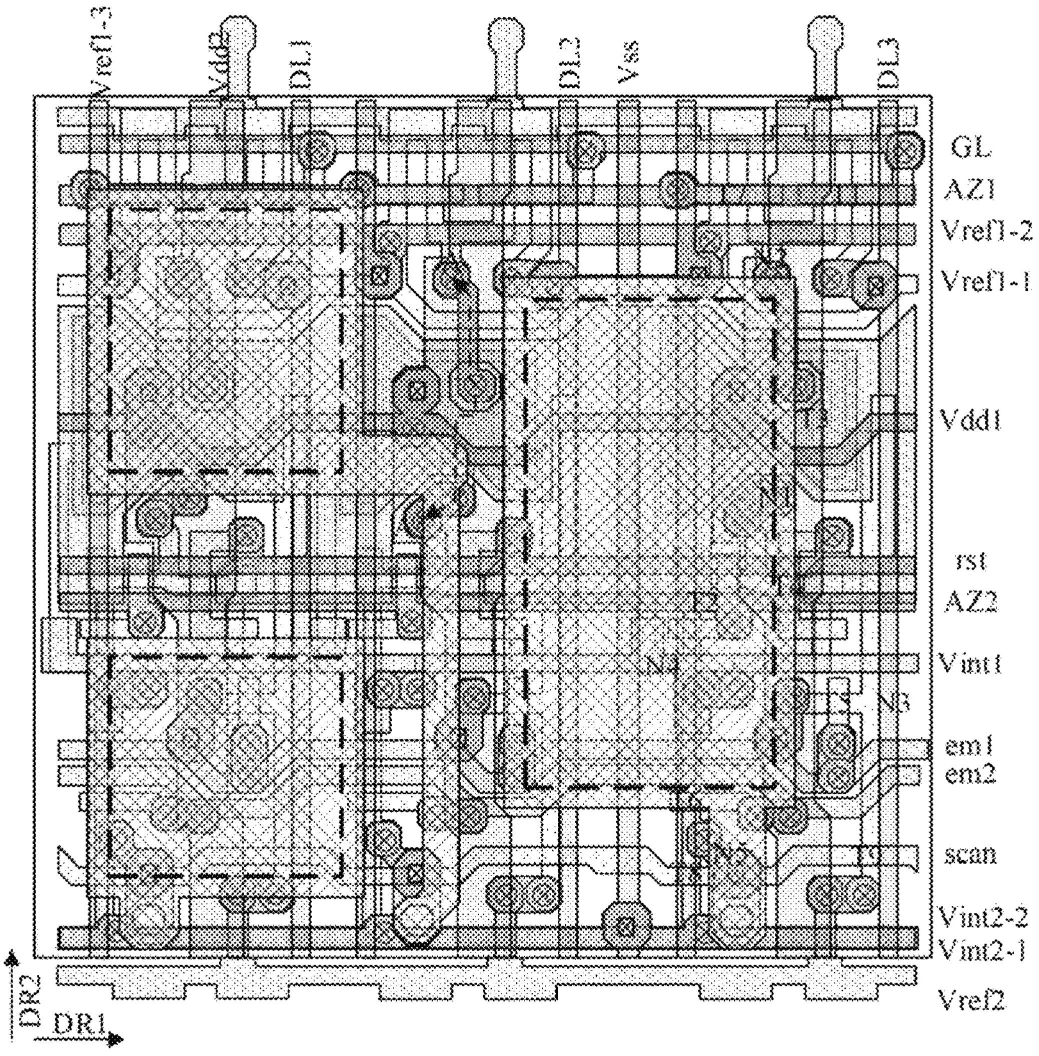
FIG. 4A is a diagram illustrating the structure of an array substrate in some embodiments according to the present disclosure.
Figure 4B:
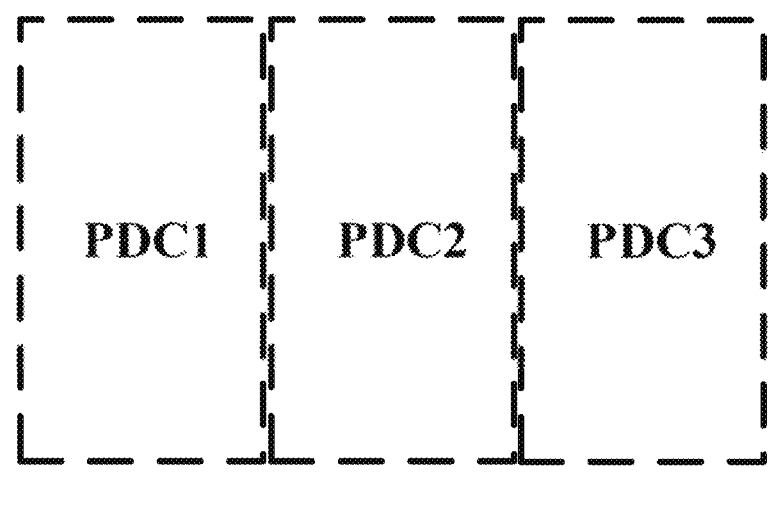
FIG. 4B is a schematic diagram illustrating an arrangement of a plurality of pixel driving circuits in an array substrate depicted in FIG. 4A.

FIG. 4A is a diagram illustrating the structure of an array substrate in some embodiments according to the present disclosure. FIG. 4B is a schematic diagram illustrating an arrangement of a plurality of pixel driving circuits in an array substrate depicted in FIG. 4A. FIG. 4A and FIG. 4B depicts a portion of the array substrate having three pixel driving circuits, including PDC1, PDC2, and PDC3.

Figure 4C:
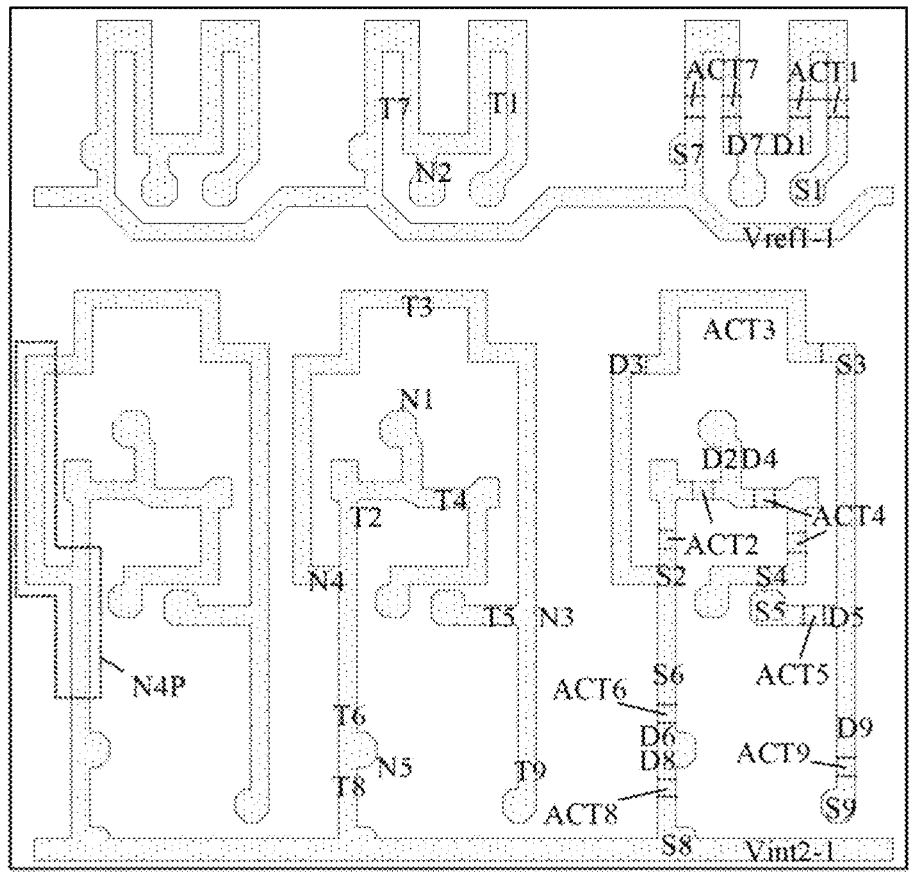
FIG. 4C is a diagram illustrating the structure of a semiconductor material layer in an array substrate depicted in FIG. 4A.
Figure 4D:
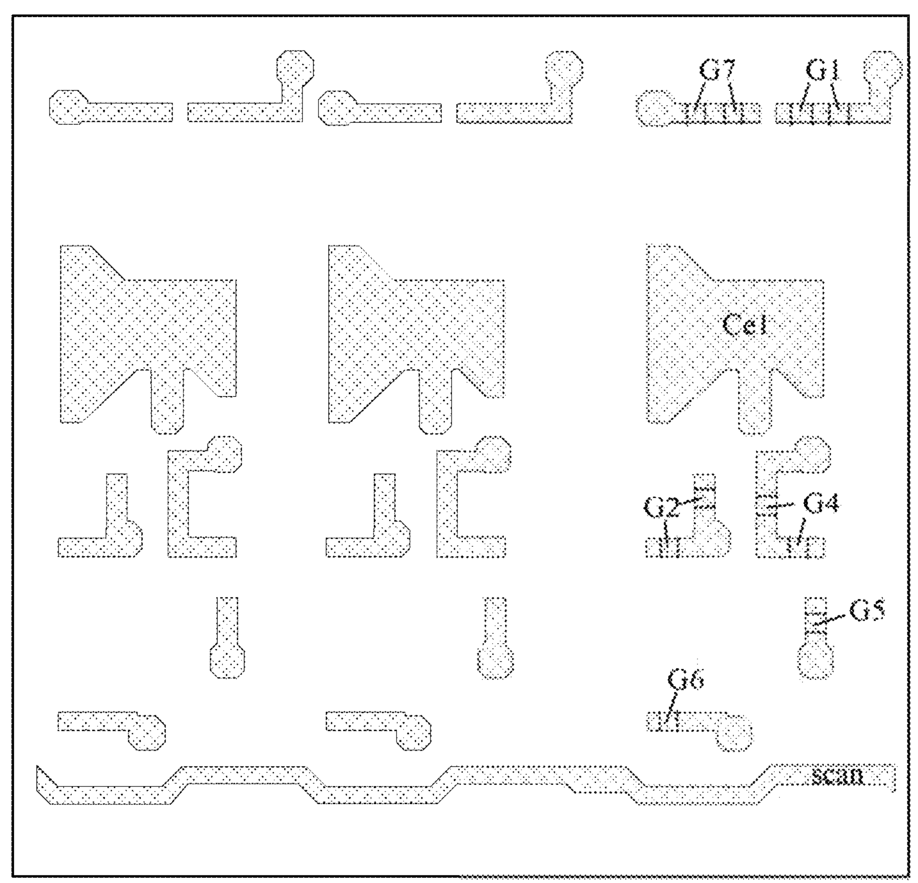
FIG. 4D is a diagram illustrating the structure of a first conductive layer in an array substrate depicted in FIG. 4A.
Figure 4E:
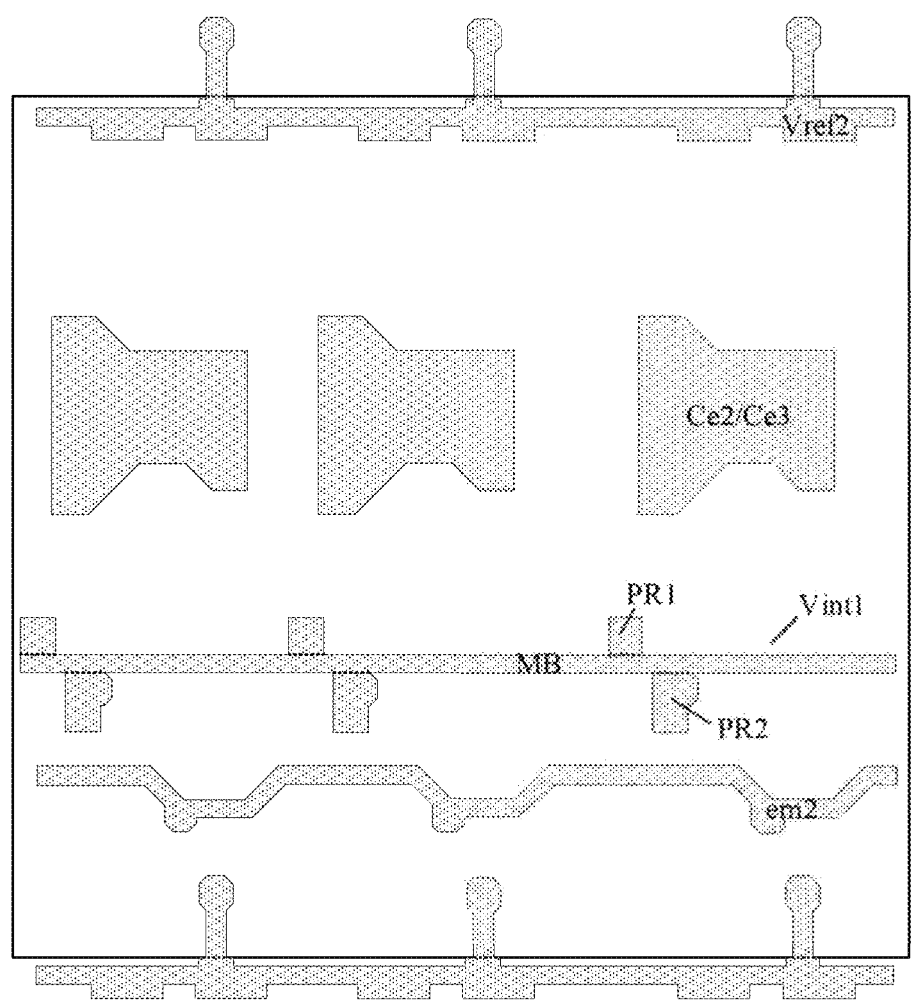
FIG. 4E is a diagram illustrating the structure of a second conductive layer in an array substrate depicted in FIG. 4A.
Figure 4F:
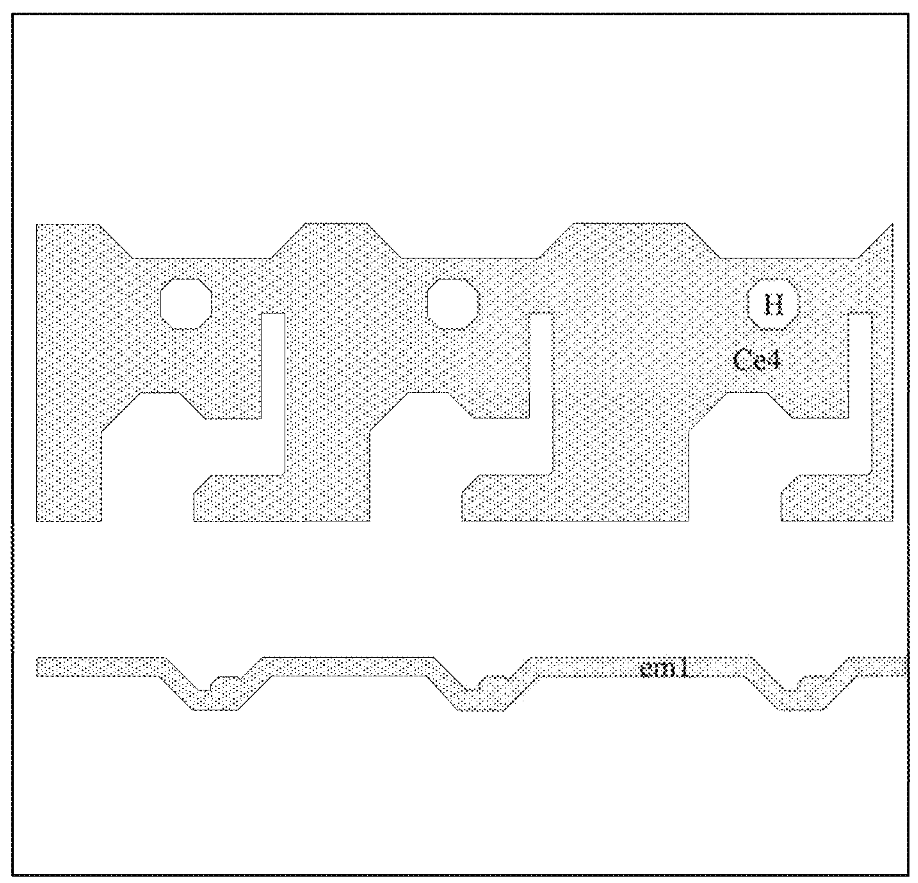
FIG. 4F is a diagram illustrating the structure of a third conductive layer in an array substrate depicted in FIG. 4A.
Figure 4G:
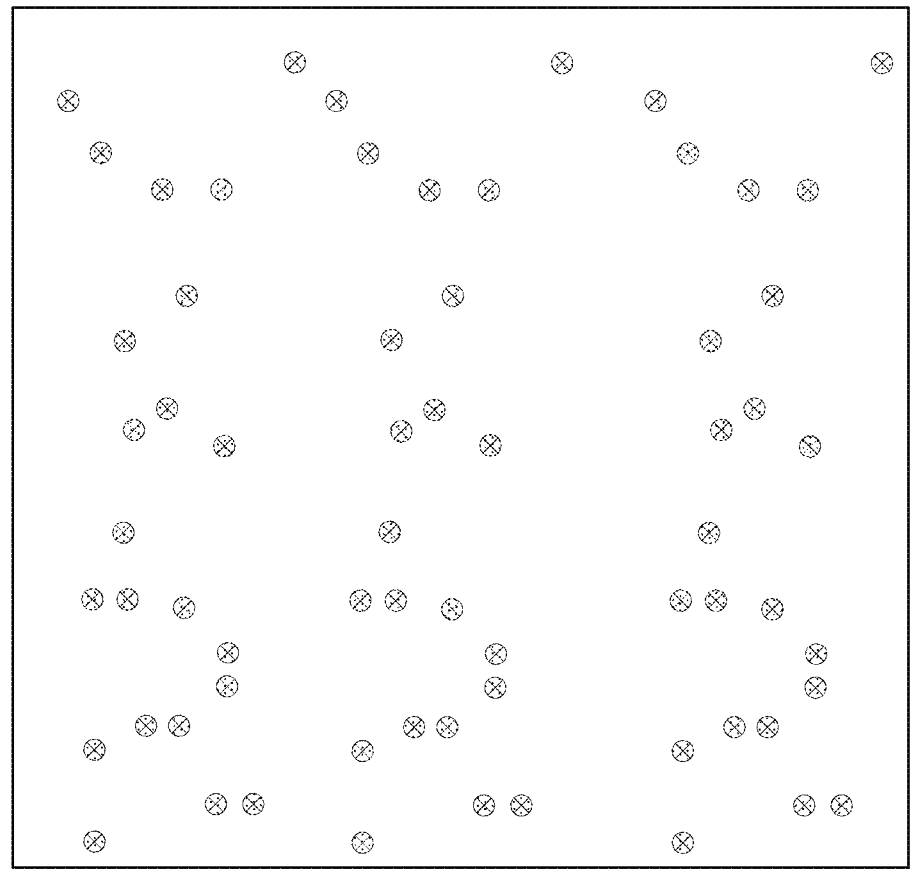
FIG. 4G is a diagram illustrating the structure of a first planarization layer in an array substrate depicted in FIG. 4A.
Figure 4H:
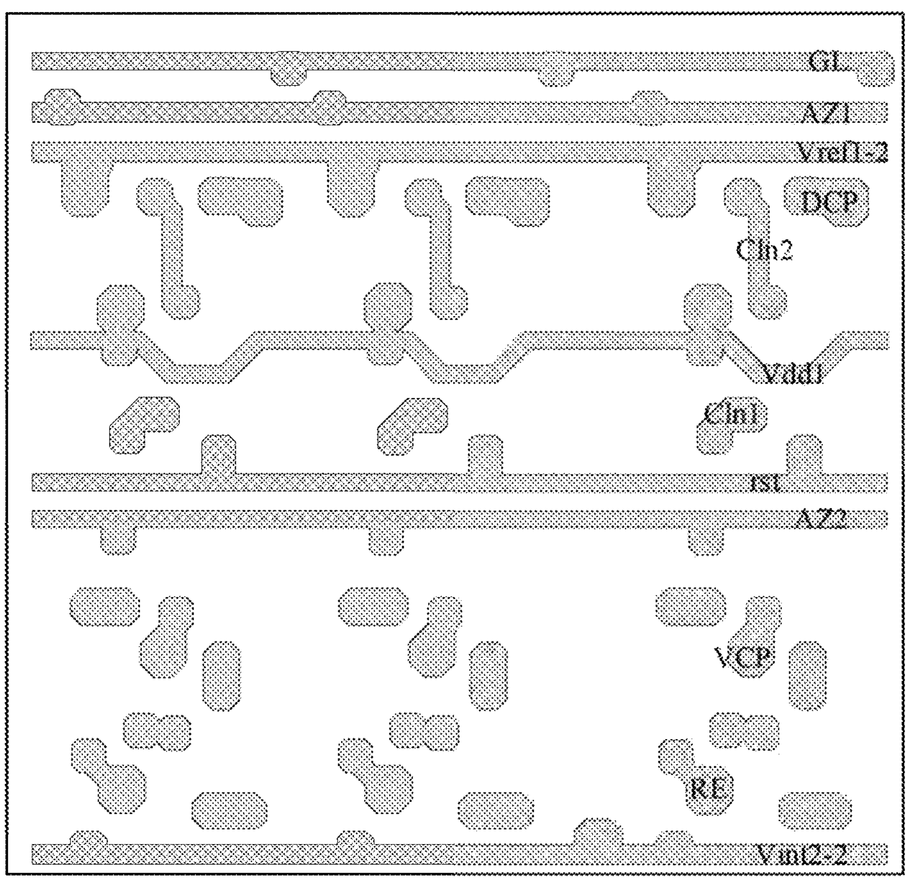
FIG. 4H is a diagram illustrating the structure of a first signal line layer in an array substrate depicted in FIG. 4A.
Figure 4I:
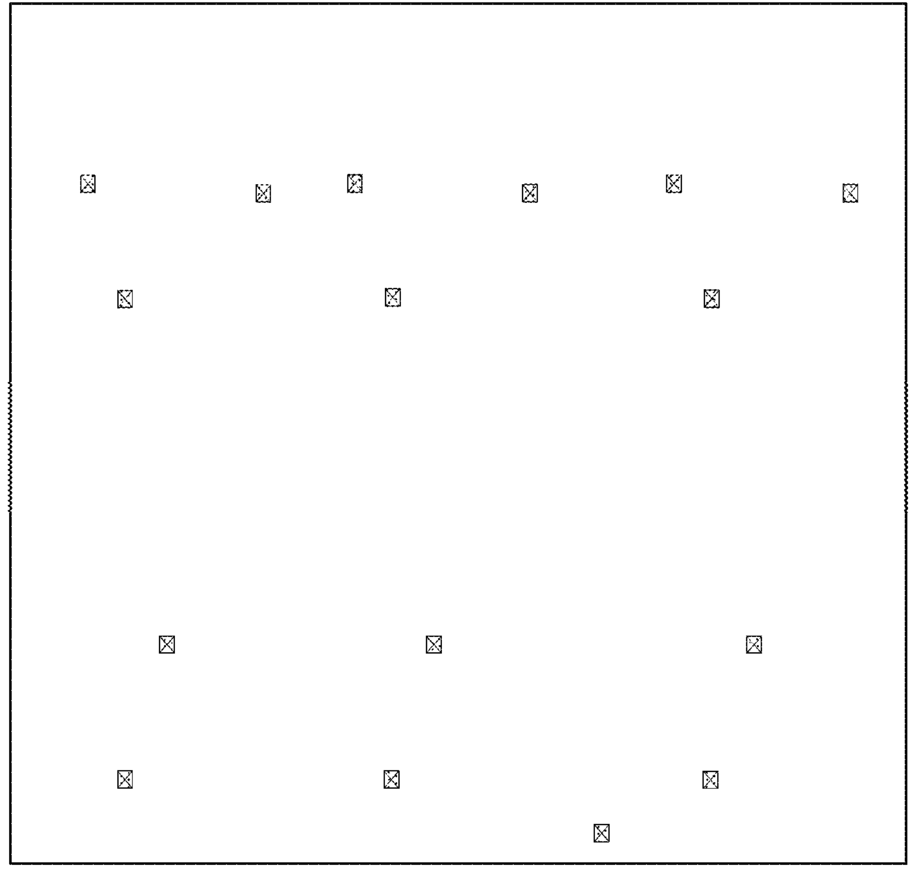
FIG. 4I is a diagram illustrating the structure of a second planarization layer in an array substrate depicted in FIG. 4A.
Figure 4J:
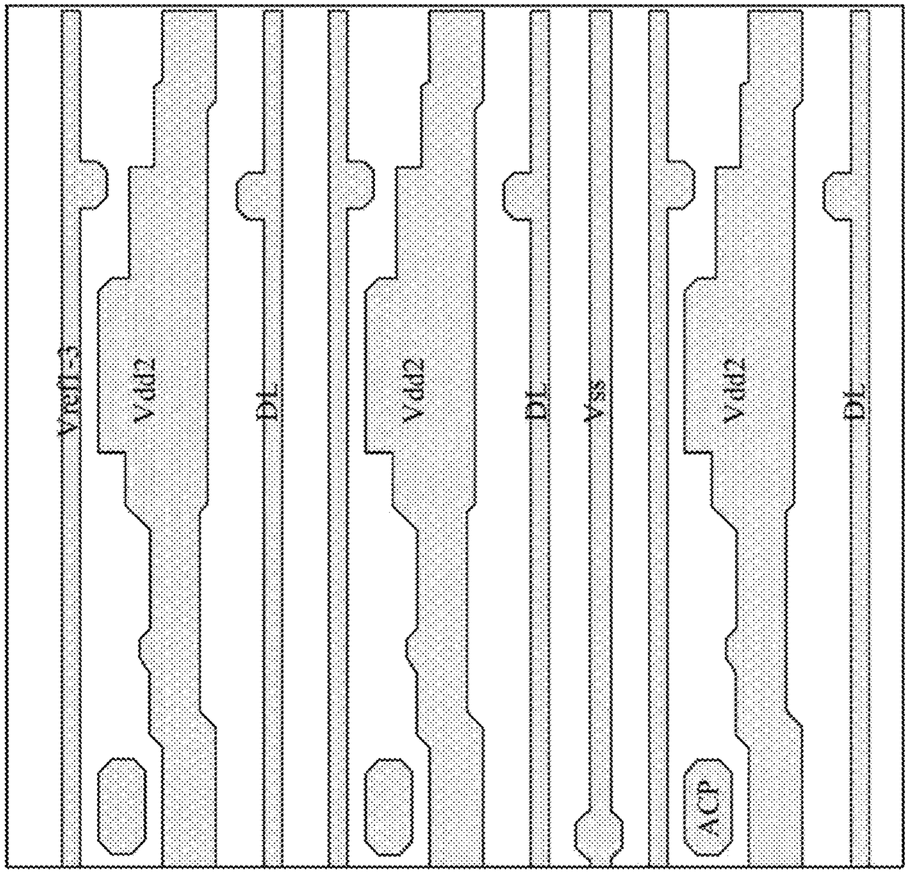
FIG. 4J is a diagram illustrating the structure of a second signal line layer in an array substrate depicted in FIG. 4A.
Figure 4K:
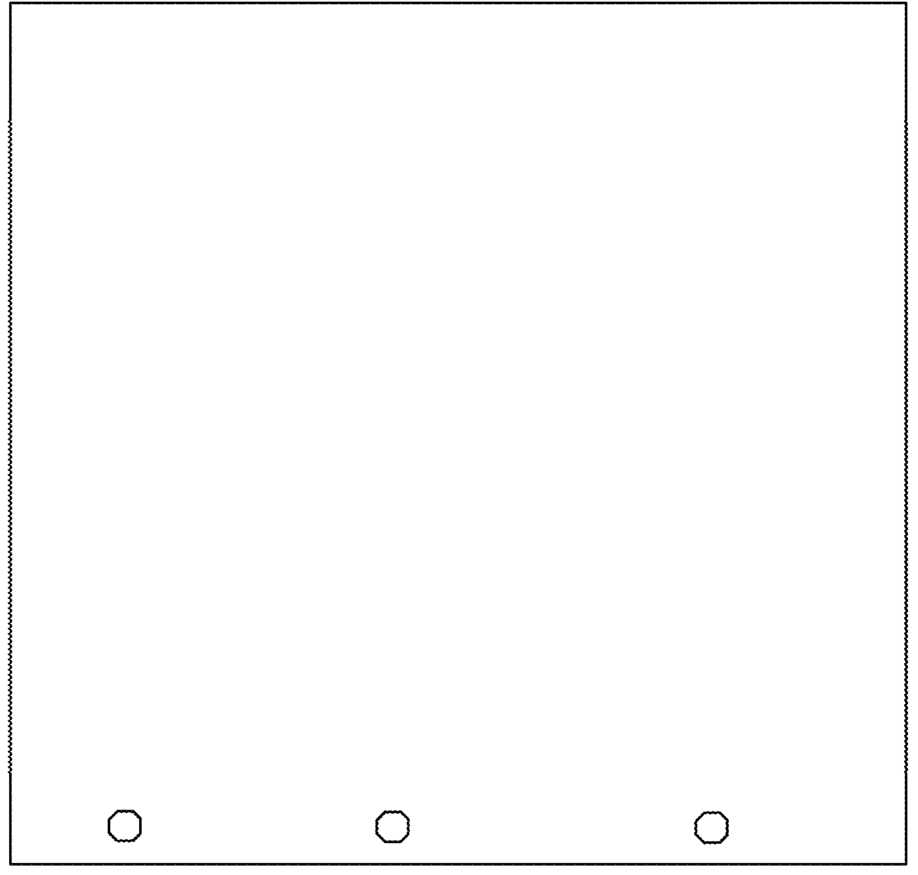
FIG. 4K is a diagram illustrating the structure of a third planarization layer in an array substrate depicted in FIG. 4A.
Figure 4L:
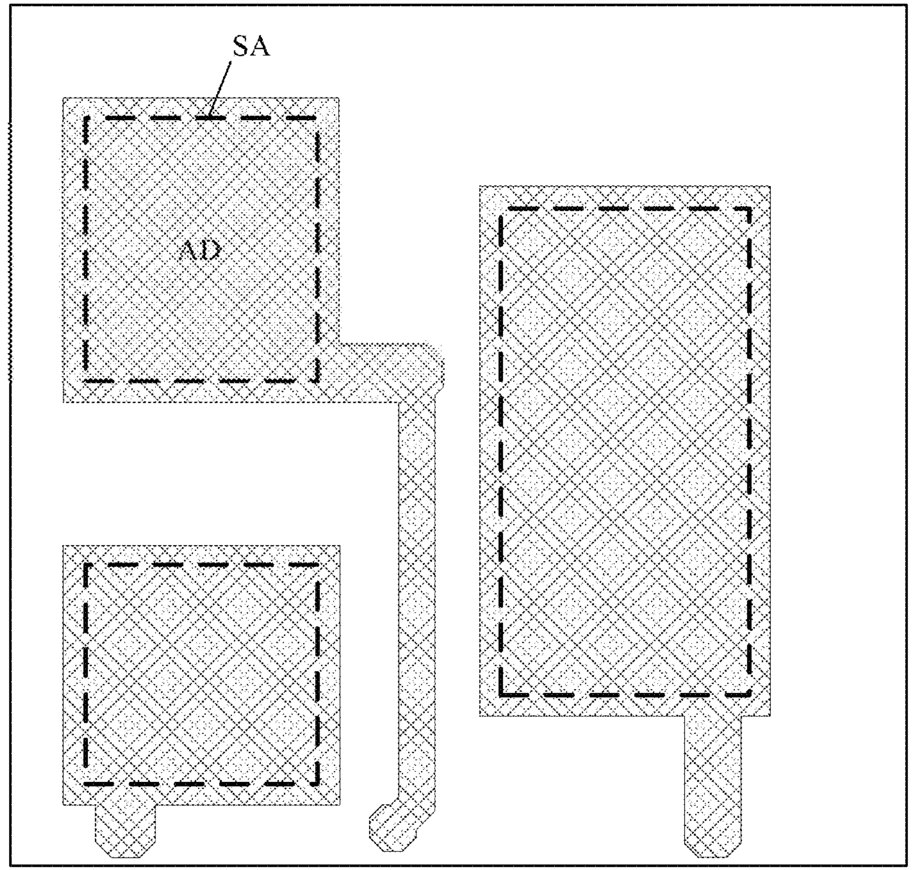
FIG. 4L is a diagram illustrating the structure of an anode layer in an array substrate depicted in FIG. 4A.
Figure 4M:
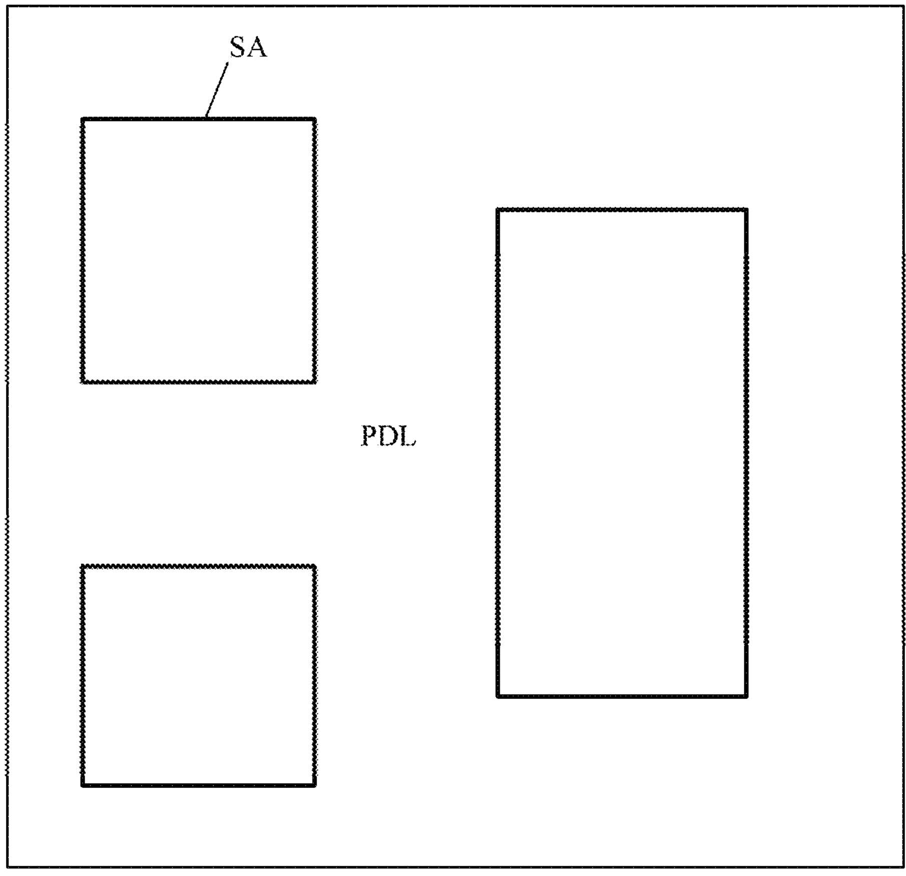
FIG. 4M is a diagram illustrating the structure of a pixel definition layer in an array substrate depicted in FIG. 4A.
Figure 5:
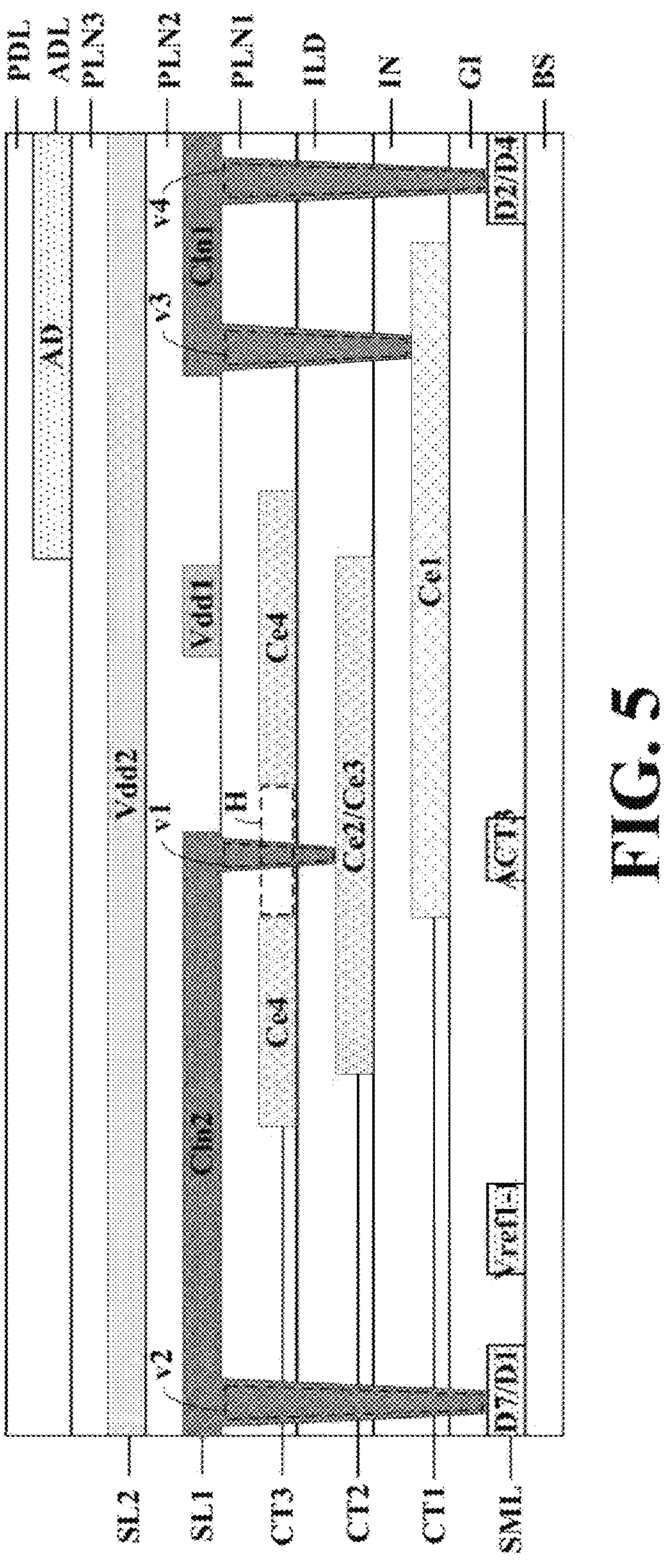
FIG. 5 is a cross-sectional view along an A-A' line in FIG. 4A.

FIG. 4C is a diagram illustrating the structure of a semiconductor material layer in an array substrate depicted in FIG. 4A. FIG. 4D is a diagram illustrating the structure of a first conductive layer in an array substrate depicted in FIG. 4A. FIG. 4E is a diagram illustrating the structure of a second conductive layer in an array substrate depicted in FIG. 4A. FIG. 4F is a diagram illustrating the structure of a third conductive layer in an array substrate depicted in FIG. 4A. FIG. 4G is a diagram illustrating the structure of a first planarization layer in an array substrate depicted in FIG. 4A. FIG. 4H is a diagram illustrating the structure of a first signal line layer in an array substrate depicted in FIG. 4A. FIG. 4I is a diagram illustrating the structure of a second planarization layer in an array substrate depicted in FIG. 4A. FIG. 4J is a diagram illustrating the structure of a second signal line layer in an array substrate depicted in FIG. 4A. FIG. 4K is a diagram illustrating the structure of a third planarization layer in an array substrate depicted in FIG. 4A. FIG. 4L is a diagram illustrating the structure of an anode layer in an array substrate depicted in FIG. 4A. FIG. 4M is a diagram illustrating the structure of a pixel definition layer in an array substrate depicted in FIG. 4A. FIG. 5 is a cross-sectional view along an A-A' line in FIG. 4A.

Referring to FIG. 4A to FIG. 4M, and FIG. 5, in some embodiments, the array substrate includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer CT1 away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a third conductive layer CT3 on a side of the inter-layer dielectric layer ILD away from the second conductive layer CT2, a first planarization layer PLN1 on a side of the third conductive layer CT3 away from the inter-layer dielectric layer ILD, a first signal line layer SL1 on a side of the first planarization layer PLN1 away from the third conductive layer CT3, a second planarization layer PLN2 on a side of the first signal line layer SL1 away from the first planarization layer PLN1, a second signal line layer SL2 on a side of the second planarization layer PLN2 away from the first signal line layer SL1, a third planarization layer PLN3 on a side of the second signal line layer SL2 away from the second planarization layer PLN2, an anode layer ADL on a side of the third planarization layer PLN3 away from the second signal line layer SL2, and a pixel definition layer PDL on a side of the anode layer ADL away from the base substrate BS.

Referring to FIG. 2, FIG. 4A, and FIG. 4C, a respective pixel driving circuit is annotated with labels indicating regions corresponding to the plurality of transistors in the respective pixel driving circuit, including the first transistor T1, the second transistor T2, the third transistor T3, the fourth transistor T4, the fifth transistor T5, the sixth transistor T6, the seventh transistor T7, the eighth transistor T8, the ninth transistor T9. The respective pixel driving circuit is further annotated with labels indicating components of each of the plurality of transistors in the pixel driving circuit. For example, the first transistor T1 includes an active layer ACT1, a first electrode S1, and a second electrode D1. The second transistor T2 includes an active layer ACT2, a first electrode S2, and a second electrode D2. The third transistor T3 includes an active layer ACT3, a first electrode S3, and a second electrode D3. The fourth transistor T4 includes an active layer ACT4, a first electrode S4, and a second electrode D4. The fifth transistor T5 includes an active layer ACT5, a first electrode S5, and a second electrode D5. The sixth transistor T6 includes an active layer ACT6, a first electrode S6, and a second electrode D6. The seventh transistor T7 includes an active layer ACT7, a first electrode S7, and a second electrode D7. The eighth transistor T8 includes an active layer ACT8, a first electrode S8, and a second electrode D8. The ninth transistor T9 includes an active layer ACT9, a first electrode S9, and a second electrode D9. In one example, the active layers (ACT2, ACT3, ACT4, ACT5, ACT6, ACT8, and ACT9) of the transistors (T2, T3, T4, T5, T6, T8, and T9) in the respective pixel driving circuit are parts of a unitary structure. In another example, the active layers (ACT2, ACT3, ACT4, ACT5, ACT6, ACT8, and ACT9), the first electrodes (S2, S3, S4, S5, S6, S8, and S9), and the second electrodes (D2, D3, D4, D5, D6, D8, and D9) of the transistors (T2, T3, T4, T5, T6, T8, and T9) in the respective pixel driving circuit are parts of a unitary structure. In another example, the active layers (ACT1 and ACT7) of the transistors (T1 and T7) in the respective pixel driving circuit are parts of a unitary structure. In another example, the active layers (ACT1 and ACT7), the first electrodes (S1 and S7), and the second electrodes (D1 and D7) of the transistors (T1 and T7) in the respective pixel driving circuit are parts of a unitary structure. In another example, the active layers (ACT1, ACT2, ACT3, ACT4, ACT5, ACT6, ACT7, ACT8, and ACT9) of the transistors (T1, T2, T3, T4, T5, T6, T7, T8, and T9) are in a same layer. In another example, the active layers (ACT1, ACT2, ACT3, ACT4, ACT5, ACT6, ACT7, ACT8, and ACT9), the first electrodes (S1, S2, S3, S4, S5, S6, S7, S8, and S9), and the second electrodes (D1, D2, D3, D4, D5, D6, D7, D8, and D9) of the transistors (T1, T2, T3, T4, T5, T6, T7, T8, and T9) are in a same layer.

As used herein, the active layer refers to a component of the transistor comprising at least a portion of the semiconductor material layer whose orthographic projection on the base substrate overlaps with an orthographic projection of a gate electrode on the base substrate. A first electrode refers to a component of the transistor connected to one side of the active layer, and a second electrode refers to a component of the transistor connected to another side of the active layer. In the context of a double-gate type transistor (for example, the third transistor T3), the active layer refers to a component of the transistor comprising a first portion of the semiconductor material layer whose orthographic projection on the base substrate overlaps with an orthographic projection of a first gate on the base substrate, a second portion of the semiconductor material layer whose orthographic projection on the base substrate overlaps with an orthographic projection of a second gate on the base substrate, and a third portion between the first portion and the second portion. In the context of a double-gate type transistor, a first electrode refers to a component of the transistor connected to a side of the first portion distal to the third portion, and a second electrode refers to a component of the transistor connected to a side of the second portion distal to the third portion.

Referring to FIG. 2, FIG. 4A, and FIG. 4C, the semiconductor material layer in some embodiments further includes a plurality of first reference signal line first branches Vref1-1 and a plurality of second reset signal line first branches Vint2-1. In some embodiments, the plurality of first reference signal lines include the plurality of first reference signal line first branches Vref1-1, a plurality of first reference signal line second branches, and a plurality of first reference signal line third branches. Optionally, at least two of the plurality of first reference signal line first branches Vref1-1, the plurality of first reference signal line second branches, and the plurality of first reference signal line third branches are in different layers. In some embodiments, the plurality of second reset signal lines include the plurality of second reset signal line first branches Vint2-1 and a plurality of second reset signal line second branches. Optionally, the plurality of second reset signal line first branches Vint2-1 and the plurality of second reset signal line second branches are in different layers.

In some embodiments, a respective first reference signal line first branch of the plurality of first reference signal line first branches Vref1-1 is connected to first electrodes of seventh transistors of pixel driving circuits in a same row. In one example, the active layers (ACT2, ACT3, ACT4, ACT5, ACT6, ACT8, and ACT9), the first electrodes (S2, S3, S4, S5, S6, S8, and S9), and the second electrodes (D2, D3, D4, D5, D6, D8, and D9) of the transistors (T2, T3, T4, T5, T6, T8, and T9) in the respective pixel driving circuit, and the respective second reset signal line first branch are parts of a unitary structure. In some embodiments, a respective second reset signal line first branch of the plurality of second reset signal line first branches Vint2-1 is connected to first electrodes of eighth transistors of pixel driving circuits in a same row. In another example, the active layers (ACT1 and ACT7), the first electrodes (S1 and S7), and the second electrodes (D1 and D7) of the transistors (T1 and T7) in the respective pixel driving circuit, and the respective first reference signal line first branch are parts of a unitary structure.

Referring to FIG. 2, FIG. 4A, and FIG. 4D, the first conductive layer in some embodiments includes a plurality of scan lines scan, an electrode block comprising one or more gate electrodes G7 of the seventh transistor, an electrode block comprising one or more gate electrodes G1 of the first transistor, an electrode block comprising one or more gate electrodes G2 of the second transistor, an electrode block comprising one or more gate electrodes G4 of the fourth transistor, an electrode block comprising one or more gate electrodes G5 of the fifth transistor, an electrode block comprising one or more gate electrodes G6 of the sixth transistor, and a first capacitor electrode Ce1 of the first capacitor C1. Optionally, at least a portion of the first capacitor electrode Ce1 is the gate electrode of the third transistor T3 (the driving transistor of the pixel driving circuit). Various appropriate electrode materials and various appropriate fabricating methods may be used to make the first conductive layer. For example, a conductive material may be deposited on the substrate by a plasma-enhanced chemical vapor deposition (PECVD) process and patterned. Examples of appropriate conductive materials for making the first conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of scan lines scan, the electrode block comprising one or more gate electrodes G7 of the seventh transistor, the electrode block comprising one or more gate electrodes G1 of the first transistor, the electrode block comprising one or more gate electrodes G2 of the second transistor, the electrode block comprising one or more gate electrodes G4 of the fourth transistor, the electrode block comprising one or more gate electrodes G5 of the fifth transistor, the electrode block comprising one or more gate electrodes G6 of the sixth transistor, and the first capacitor electrode Ce1 of the first capacitor C1 are in a same layer.

As used herein, the term "same layer" refers to the relationship between the layers simultaneously formed in the same step. In one example, the plurality of scan lines scan and the first capacitor electrode Ce1 are in a same layer when they are formed as a result of one or more steps of a same patterning process performed in a same layer of material. In another example, the plurality of scan lines scan and the first capacitor electrode Ce1 can be formed in a same layer by simultaneously performing the step of forming the plurality of scan lines scan, and the step of forming the first capacitor electrode Ce1. The term "same layer" does not always mean that the thickness of the layer or the height of the layer in a cross-sectional view is the same.

Referring to FIG. 2, FIG. 4A, and FIG. 4E, the second conductive layer in some embodiments includes a plurality of second reference signal lines Vref2, a plurality of first reset signal lines Vint1, a plurality of second light emitting control signal lines em2, and an electrode block which functions as a second capacitor electrode Ce2 of the first capacitor C1 and a third capacitor electrode Ce3 of the second capacitor C2. Various appropriate conductive materials and various appropriate fabricating methods may be used to make the second conductive layer. For example, a conductive material may be deposited on the substrate by a plasma-enhanced chemical vapor deposition (PECVD) process and patterned. Examples of appropriate conductive materials for making the second conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of second reference signal lines Vref2, the plurality of first reset signal lines Vint1, the plurality of second light emitting control signal lines em2, and the electrode block which functions as the second capacitor electrode Ce2 of the first capacitor C1 and the third capacitor electrode Ce3 of the second capacitor C2 are in a same layer.

Referring to FIG. 2, FIG. 4A, and FIG. 4F, the third conductive layer in some embodiments includes a plurality of first light emitting control signal lines em1 and a fourth capacitor electrode Ce4 of the second capacitor C2. Optionally, fourth capacitor electrodes of multiple pixel driving circuits in a same row are parts of a unitary structure. Various appropriate conductive materials and various appropriate fabricating methods may be used to make the third conductive layer. For example, a conductive material may be deposited on the substrate by a plasma-enhanced chemical vapor deposition (PECVD) process and patterned. Examples of appropriate conductive materials for making the third conductive layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of first light emitting control signal lines em1 and the fourth capacitor electrode Ce4 of the second capacitor C2 are in a same layer.

Vias extending through the first planarization layer PLN1 are depicted in FIG. 4G.

Referring to FIG. 2, FIG. 4A, and FIG. 4H, the first signal line layer in some embodiments includes a first node connecting line Cln1, a second node connecting line Cln2, a plurality of gate lines GL, a plurality of first compensation control signal lines AZ1, a plurality of second compensation control signal lines AZ2, a plurality of first reference signal line second branches Vref1-2, a plurality of first voltage supply line first branches Vdd1, a plurality of reset control signal lines rst, a plurality of second reset signal line second branches Vint2-2, a voltage signal connecting pad VCP, a data signal connecting pad DCP, and a relay electrode RE.

The data signal connecting pad DCP is configured to connect a respective data line of the plurality of data lines to a first electrode of the first transistor T1.

The relay electrode RE is connected to second electrodes of the sixth transistor T6 and the eighth transistor T8. The relay electrode RE is further connected to an anode connecting pad in the second signal line layer. The anode connecting pad is connected to an anode of a light emitting element in the anode layer.

The voltage signal connecting pad VCP is configured to connect a respective first voltage supply line second branch of the plurality of first voltage supply line second branches with a first electrode of the fifth transistor T5. A respective first voltage supply line first branch of the plurality of first voltage supply line first branches Vdd1 is connected to the respective first voltage supply line second branch of the plurality of first voltage supply line second branches, and is connected to the fourth capacitor electrode of the second capacitor. The plurality of first voltage supply line first branches Vdd1 and the plurality of first voltage supply line second branches form an interconnected first voltage supply network.

A respective first reference signal line second branch of the plurality of first reference signal line second branches Vref1-2 is connected to first electrodes of seventh transistors in pixel driving circuits in a same row, which are parts of a unitary structure having a respective first reference signal line first branch of the plurality of first reference signal line first branches. The respective first reference signal line second branch of the plurality of first reference signal line second branches Vref1-2 is further connected to one or more first reference signal line third branches of a plurality of first reference signal line third branches in a second signal line layer. The plurality of first reference signal line first branches, the plurality of first reference signal line second branches Vref1-2, and the plurality of first reference signal line third branches form an interconnected reference signal network.

A respective second reset signal line second branch of the plurality of second reset signal line second branches Vint2-2 is connected to a respective second reset signal line first branch of the plurality of second reset signal line first branches in the semiconductor material layer. Optionally, an orthographic projection of the respective second reset signal line second branch on a base substrate at least partially overlaps with an orthographic projection of the respective second reset signal line first branch on the base substrate. Optionally, the orthographic projection of the respective second reset signal line second branch on the base substrate substantially covers (e.g., covers at least 80%, covers at least 85%, covers at least 90%, covers at least 95%, covers at least 99%, or completely covers) the orthographic projection of the respective second reset signal line first branch on the base substrate.

In some embodiments, the plurality of compensation control signal lines includes the plurality of first compensation control signal lines AZ1 and the plurality of second compensation control signal lines AZ2.

In some embodiments, the plurality of first voltage supply lines include the plurality of first voltage supply line first branches Vdd1 and a plurality of first voltage supply line second branches. Optionally, the plurality of first voltage supply line first branches Vdd1 extend along a direction substantially parallel to a first direction DR1. Optionally, the plurality of first voltage supply line second branches extend along a direction substantially parallel to a second direction DR2. As used herein, the term "substantially parallel" means that an angle is in the range of 0 degree to approximately 45 degrees, e.g., 0 degree to approximately 5 degrees, 0 degree to approximately 10 degrees, 0 degree to approximately 15 degrees, 0 degree to approximately 20 degrees, 0 degree to approximately 25 degrees, 0 degree to approximately 30 degrees. Optionally, the plurality of first voltage supply line first branches Vdd1 and plurality of first voltage supply line second branches are in different layers.

In some embodiments, the plurality of first reference signal lines include the plurality of first reference signal line first branches, a plurality of first reference signal line second branches Vref1-2, and a plurality of first reference signal line third branches. Optionally, the plurality of first reference signal line first branches, the plurality of first reference signal line second branches Vref1-2, and the plurality of first reference signal line third branches are in different layers. Optionally, the plurality of first reference signal line first branches and the plurality of first reference signal line second branches Vref1-2 extend along a direction substantially parallel to the first direction DR1. Optionally, the plurality of first reference signal line third branches extend along a direction substantially parallel to a second direction DR2.

In some embodiments, the plurality of second reset signal lines include the plurality of second reset signal line first branches and the plurality of second reset signal line second branches Vint2-2. Optionally, the plurality of second reset signal line first branches and the plurality of second reset signal line second branches Vint2-2 are in different layers.

Various appropriate conductive materials and various appropriate fabricating methods may be used to make the first signal line layer. For example, a conductive material may be deposited on the substrate by a plasma-enhanced chemical vapor deposition (PECVD) process and patterned. Examples of appropriate conductive materials for making the first signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the first node connecting line Cln1, the second node connecting line Cln2, the plurality of gate lines GL, the plurality of first compensation control signal lines AZ1, the plurality of second compensation control signal lines AZ2, the plurality of first reference signal line second branches Vref1-2, the plurality of first voltage supply line first branches Vdd1, the plurality of reset control signal lines rst, the plurality of second reset signal line second branches Vint2-2, the voltage signal connecting pad VCP, the data signal connecting pad DCP, and the relay electrode RE are in a same layer.

Vias extending through the second planarization layer PLN2 are depicted in FIG. 4I.

Referring to FIG. 2, FIG. 4A, and FIG. 4J, the second signal line layer in some embodiments includes a plurality of data lines DL, a plurality of plurality of first reference signal line third branches Vref1-3, a plurality of first voltage supply line second branches Vdd2, a plurality of second voltage supply lines Vss, and an anode connecting pad ACP.

The anode connecting pad ACP is connected to an anode of a light emitting element in the anode layer. The anode connecting pad ACP is connected to a relay electrode RE in the first signal line layer. The relay electrode RE is further connected to second electrodes of the sixth transistor T6 and the eighth transistor T8.

A respective first voltage supply line second branch of the plurality of first voltage supply line second branches Vdd2 is connected to a respective first voltage supply line first branch of the plurality of first voltage supply line first branches in the first signal line layer. The respective first voltage supply line first branch of the plurality of first voltage supply line first branches is further connected to the fourth capacitor electrode of the second capacitor in the third conductive layer. The respective first voltage supply line second branch of the plurality of first voltage supply line second branches Vdd2 is further connected to a voltage signal connecting pad VCP in the first signal line layer. The voltage signal connecting pad VCP is configured to connect the respective first voltage supply line second branch of the plurality of first voltage supply line second branches with a first electrode of the fifth transistor T5. The plurality of first voltage supply line first branches Vdd1 and the plurality of first voltage supply line second branches form an interconnected first voltage supply network.

A respective first reference signal line third branch of the plurality of first reference signal line third branches Vref1-3 is connected to a respective first reference signal line second branch of the plurality of first reference signal line second branches in the first signal line layer. The respective first reference signal line second branch of the plurality of first reference signal line second branches is further connected to first electrodes of seventh transistors in pixel driving circuits in a same row, which are parts of a unitary structure having a respective first reference signal line first branch of the plurality of first reference signal line first branches. The plurality of first reference signal line first branches, the plurality of first reference signal line second branches, and the plurality of first reference signal line third branches Vref1-3 form an interconnected reference signal network.

In some embodiments, the plurality of first voltage supply lines include the plurality of first voltage supply line first branches and a plurality of first voltage supply line second branches Vdd2. Optionally, the plurality of first voltage supply line first branches extend along a direction substantially parallel to a first direction DR1. Optionally, the plurality of first voltage supply line second branches Vdd2 extend along a direction substantially parallel to a second direction DR2.

A respective second voltage supply line of the plurality of second voltage supply lines Vss is connected to one or more second reset signal line second branches of the plurality of second reset signal line second branches in the first signal line layer. A respective second reset signal line second branch of the plurality of second reset signal line second branches is then connected to a respective second reset signal line first branch of the plurality of second reset signal line first branches in the semiconductor material layer. The plurality of second voltage supply lines Vss, the plurality of second reset signal line first branches, and the plurality of second reset signal line second branches form an interconnected second voltage supply network.

In some embodiments, the plurality of first reference signal lines include the plurality of first reference signal line first branches, a plurality of first reference signal line second branches, and a plurality of first reference signal line third branches Vref1-3. Optionally, the plurality of first reference signal line first branches, the plurality of first reference signal line second branches, and the plurality of first reference signal line third branches Vref1-3 are in different layers. Optionally, the plurality of first reference signal line first branches and the plurality of first reference signal line second branches extend along a direction substantially parallel to the first direction DR1. Optionally, the plurality of first reference signal line third branches Vref1-3 extend along a direction substantially parallel to a second direction DR2.

Various appropriate conductive materials and various appropriate fabricating methods may be used to make the second signal line layer. For example, a conductive material may be deposited on the substrate by a plasma-enhanced chemical vapor deposition (PECVD) process and patterned. Examples of appropriate conductive materials for making the second signal line layer include, but are not limited to, aluminum, copper, molybdenum, chromium, aluminum copper alloy, copper molybdenum alloy, molybdenum aluminum alloy, aluminum chromium alloy, copper chromium alloy, molybdenum chromium alloy, copper molybdenum aluminum alloy, and the like. Optionally, the plurality of data lines DL, the plurality of first reference signal line third branches Vref1-3, the plurality of first voltage supply line second branches Vdd2, the plurality of second voltage supply lines Vss, and the anode connecting pad ACP are in a same layer.

Vias extending through the third planarization layer PLN3 are depicted in FIG. 4K.

Referring to FIG. 2, FIG. 4A, and FIG. 4L, the array substrate further includes an anode layer ADL. A plurality of subpixel apertures SA respectively corresponding to a plurality of anodes are denoted in FIG. 4L. Vias extending through the third planarization layer PLN3 are depicted in FIG. 4K. A respective anode is connected to a respective anode contact pad through a respective via extending through the third planarization layer PLN3.

Referring to FIG. 2, FIG. 4A, and FIG. 4M, the array substrate further includes a pixel definition layer PDL defining a plurality of subpixel apertures SA.

Referring to FIG. 2, FIG. 4A, FIG. 4D, FIG. 4E, and FIG. 5, in some embodiments, an orthographic projection of the electrode block comprising the second capacitor electrode Ce2 and the third capacitor electrode Ce3 on a base substrate BS substantially covers (e.g., covers at least 80%, covers at least 85%, covers at least 90%, covers at least 95%, covers at least 99%, or completely covers) an orthographic projection of the first capacitor electrode Ce1 on the base substrate BS.

Referring to FIG. 2, FIG. 4A, FIG. 4E, FIG. 4F, and FIG. 5, in some embodiments, an orthographic projection of the fourth capacitor electrode Ce4 on a base substrate BS completely covers, with a margin, an orthographic projection of the electrode block comprising the second capacitor electrode Ce2 and the third capacitor electrode Ce3 on the base substrate BS except for a hole region H in which a portion of the fourth capacitor electrode Ce4 is absent. In some embodiments, the first signal line layer includes a second node connecting line Cln2 on a side of the first planarization layer PLN1 away from the electrode block comprising the second capacitor electrode Ce2 and the third capacitor electrode Ce3. The second node connecting line Cln2 is in a same layer as at least one of the first node connecting line Cln1, the plurality of gate lines GL, the plurality of first compensation control signal lines AZ1, the plurality of second compensation control signal lines AZ2, the plurality of first reference signal line second branches Vref1-2, the plurality of first voltage supply line first branches Vdd1, the plurality of reset control signal lines rst, the plurality of second reset signal line second branches Vint2-2, the voltage signal connecting pad VCP, the data signal connecting pad DCP, or the relay electrode RE.

In some embodiments, the array substrate further includes a first via v1 and a second via v2. The first via v1 is in the hole region H and extends through the first planarization layer PLN1 and the inter-layer dielectric layer ILD. The second via v2 extends through the first planarization layer PLN1, the inter-layer dielectric layer ILD, the insulating layer IN, and the gate insulating layer GI. Optionally, the second node connecting line Cln2 is connected to the electrode block comprising the second capacitor electrode Ce2 and the third capacitor electrode Ce3 through the first via v1, and is connected to the semiconductor material layer SML through the second via v2. Optionally, the second node connecting line Cln2 is connected to the second electrode D7 of the seventh transistor and/or the second electrode D1 of the first transistor, as depicted in FIG. 5. In one example, the second node connecting line Cln2 corresponds to the second node N2.

In some embodiments, the array substrate further includes a third via v3 and a fourth via v4. The third via v3 extends through the first planarization layer PLN1, the inter-layer dielectric layer ILD, and the insulating layer IN. The fourth via v4 extends through the first planarization layer PLN1, the inter-layer dielectric layer ILD, the insulating layer IN, and the gate insulating layer GI. Optionally, the first node connecting line Cln1 is connected to the first capacitor electrode Ce1 through the third via v3, and is connected to the semiconductor material layer SML through the fourth via v4. Optionally, the first node connecting line Cln1 is connected to the second electrode D2 of the second transistor and/or the second electrode D4 of the fourth transistor, as depicted in FIG. 5. In one example, the first node connecting line Cln1 corresponds to the first node N1.

Figure 6:
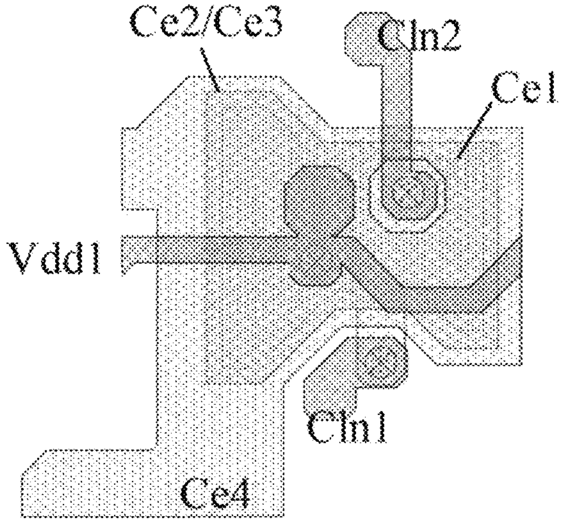
FIG. 6 illustrates a stacked structure of capacitor electrodes in an array substrate in some embodiments according to the present disclosure.

FIG. 6 illustrates a stacked structure of capacitor electrodes in an array substrate in some embodiments according to the present disclosure. Referring to FIG. 5 and FIG. 6, the array substrate in some embodiments includes a stacked structure comprising the first capacitor electrode Ce1, the insulating layer IN, the electrode block comprising the second capacitor electrode Ce2 and the third capacitor electrode Ce3, the inter-layer dielectric layer ILD, and the fourth capacitor electrode Ce4. The first capacitor electrode Ce1, the insulating layer IN, and the electrode block comprising the second capacitor electrode Ce2 and the third capacitor electrode Ce3 form the first capacitor. The electrode block comprising the second capacitor electrode Ce2 and the third capacitor electrode Ce3, the inter-layer dielectric layer ILD, and the fourth capacitor electrode Ce4 form the second capacitor.

In some embodiments, the first capacitor electrode Ce1 is in the first conductive layer CT1; the electrode block comprising the second capacitor electrode Ce2 and the third capacitor electrode Ce3 is in the second conductive layer CT2 on a side of the insulating layer IN away from the first conductive layer CT1; and the fourth capacitor electrode Ce4 is in the third conductive layer CT3 on a side of the inter-layer dielectric layer ILD away from the second conductive layer CT2.

The inventors of the present disclosure discover that, by having the unique stacked structure of capacitor electrodes, capacitance areas can be effectively increased, crosstalk and flicker due to electric leakage can be reduced. By having an increased capacitance, noise interference to the gate electrode and drain electrode of the third transistor (the driving transistor) during the threshold voltage compensation phase can be reduced, thereby reducing the block crosstalk.

Referring to FIG. 4A to FIG. 4J, in some embodiments, the semiconductor material layer includes a portion corresponding to the fourth node N4. In some embodiments, the semiconductor material layer includes a fourth node portion N4P comprising at least a portion of a second electrode of the third transistor T3, at least a portion of a first electrode of the second transistor T2, and at least a portion of a first electrode of the sixth transistor T6. In some embodiments, an orthographic projection of the fourth node portion N4P on a base substrate at least partially overlaps with an orthographic projection of a respective data line of the plurality of data lines DL on the base substrate.

In some embodiments, an orthographic projection of the fourth node portion N4P on a base substrate is substantially covered (e.g., at least 50% covered, at least 55% covered, at least 60% covered, at least 65% covered, at least 70% covered, at least 75% covered, at least 80% covered, at least 85% covered, at least 90% covered, at least 95% covered, at least 99% covered, or completely covered) by an orthographic projection of a combination of the fourth capacitor electrode Ce4 and a respective first reset signal line of the plurality of first reset signal lines Vint1 on the base substrate. The inventors of the present disclosure discover that by having the orthographic projection of the fourth node portion N4P substantially covered by components having constant voltage level, parasitic capacitance between the fourth node portion N4P and a respective data line of the plurality of data lines DL can be reduced, thereby preventing interference from the data signal to the fourth node portion N4P.

Figure 7:
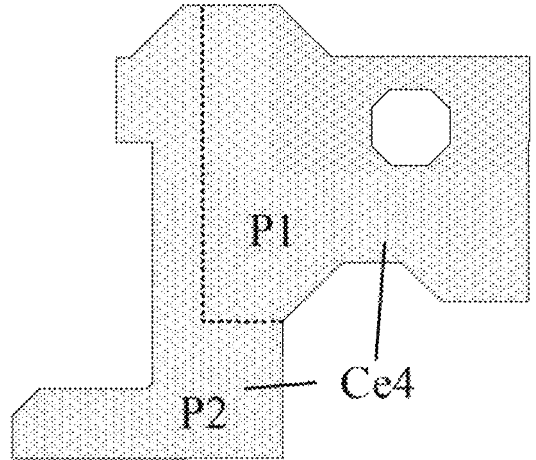
FIG. 7 is a schematic diagram illustrating the structure of a fourth capacitor electrode in some embodiments according to the present disclosure.
Figure 8:
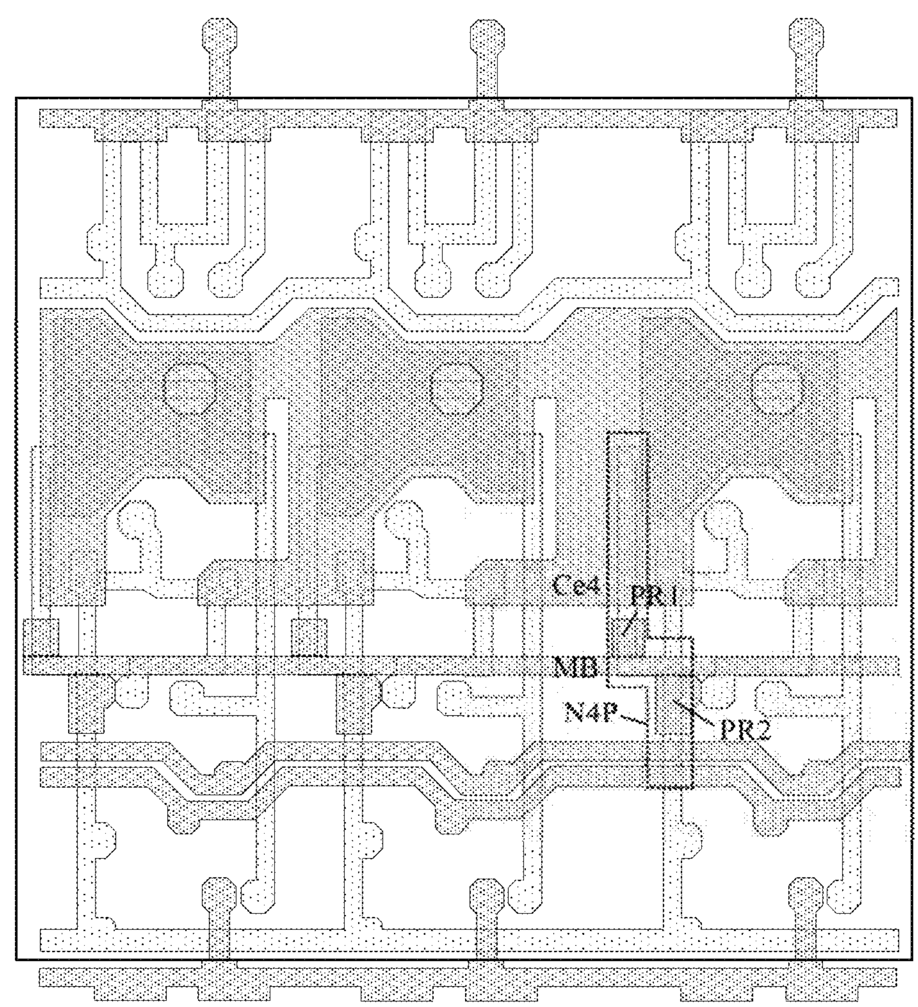
FIG. 8 is a schematic diagram illustrating the structure of a semiconductor material layer, a second conductive layer, and a third conductive layer in some embodiments according to the present disclosure.

FIG. 7 is a schematic diagram illustrating the structure of a fourth capacitor electrode in some embodiments according to the present disclosure. FIG. 8 is a schematic diagram illustrating the structure of a semiconductor material layer, a second conductive layer, and a third conductive layer in some embodiments according to the present disclosure. Referring to FIG. 4A to FIG. 4J, FIG. 6, FIG. 7, and FIG. 8, the fourth capacitor electrode Ce4 in some embodiments includes a first portion P1 and a second portion P2. An orthographic projection of the first portion P1 on a base substrate substantially covers an orthographic projection of the electrode block comprising the second capacitor electrode Ce2 and the third capacitor electrode Ce3 on the base substrate. An orthographic projection of the second portion P2 on the base substrate is non-overlapping with the orthographic projection of the electrode block comprising the second capacitor electrode Ce2 and the third capacitor electrode Ce3 on the base substrate. The orthographic projection of the fourth node portion N4P on the base substrate partially overlaps with the orthographic projection of the second portion P2 on the base substrate.

Optionally, the orthographic projection of the second portion P2 on the base substrate partially overlaps with an orthographic projection of a respective reset control signal line of the plurality of reset control signal lines rst on the base substrate, and partially overlaps with an orthographic projection of a respective second compensation control signal line of the plurality of second compensation control signal lines AZ2 on the base substrate.

Referring to FIG. 4E, the respective first reset signal line of the plurality of first reset signal lines Vint1 in some embodiments includes a main body MB, a first protrusion PR1 extending away from the main body MB, and a second protrusion PR2 extending away from the main body MB. The first protrusion PR1 and the second protrusion PR2 extend away from the main body MB along substantially opposite directions. Referring to FIG. 4A to FIG. 4J, FIG. 6, FIG. 7, and FIG. 8, the orthographic projection of the fourth node portion N4P on a base substrate partially overlaps with an orthographic projection of the first protrusion PR1 and the second protrusion PR2 on the base substrate. Optionally, the orthographic projection of the fourth node portion N4P on a base substrate partially overlaps with an orthographic projection of a portion of the main body MB connecting the first protrusion PR1 and the second protrusion PR2 on the base substrate.

Optionally, the orthographic projection of the fourth node portion N4P on the base substrate partially overlaps with an orthographic projection of a first light emitting control signal line of the plurality of first light emitting control signal lines em1 on the base substrate, and partially overlaps with an orthographic projection of a second light emitting control signal line of the plurality of second light emitting control signal lines em2 on the base substrate.

Figure 9:
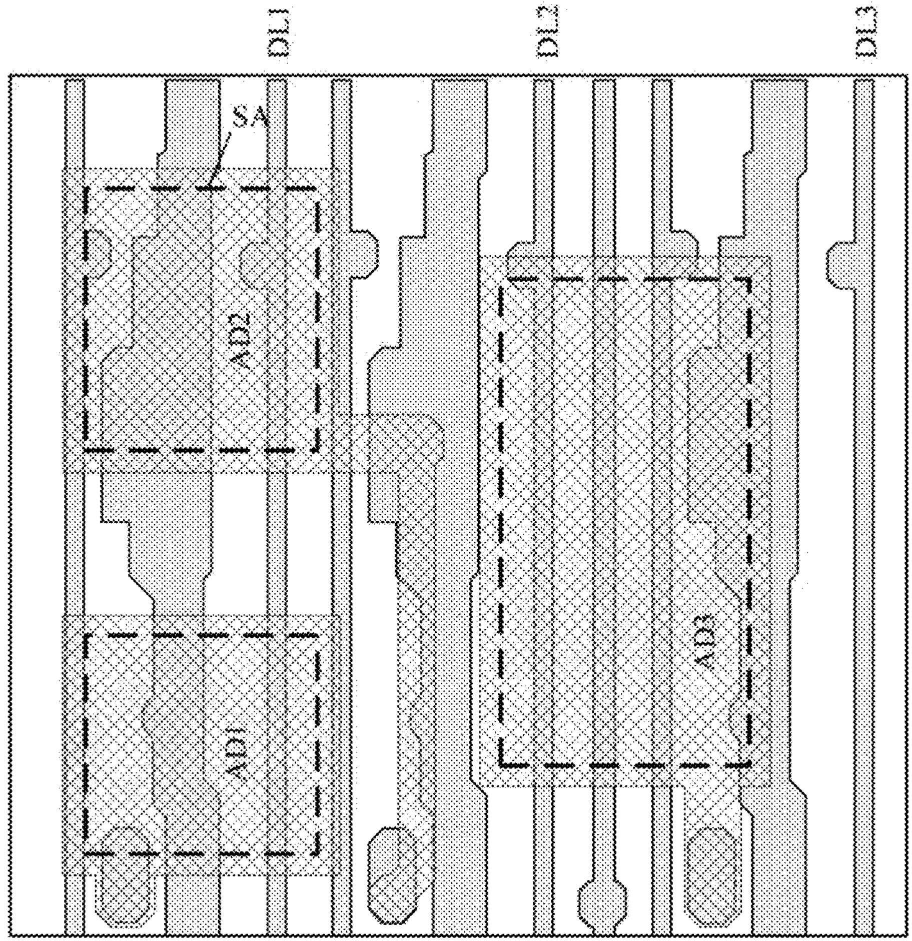
FIG. 9 is a schematic diagram illustrating the structure of a second signal line layer and an anode layer in some embodiments according to the present disclosure.

FIG. 9 is a schematic diagram illustrating the structure of a second signal line layer and an anode layer in some embodiments according to the present disclosure. Referring to FIG. 9, the plurality of data lines in some embodiments includes three adjacent data lines, including a first data line DL1, a second data line DL2, and a third data line DL3. In some embodiments, the first data line DL1 is configured to provide data signals to a first subpixel (e.g., a red subpixel), the second data line DL2 is configured to provide data signals to a second subpixel (e.g., a green subpixel), and the third data line DL3 is configured to provide data signals to a third subpixel (e.g., a blue subpixel).

In some embodiments, the anode layer includes a first anode AD1, a second anode AD2, and a third anode AD3. In some embodiments, the first anode AD1 is an anode in a first subpixel (e.g., a red subpixel), the second anode AD2 is an anode in a second subpixel (e.g., a green subpixel), and the third anode AD3 is an anode in a third subpixel (e.g., a blue subpixel).

In some embodiments, an orthographic projection of a combination of the anode layer on a base substrate partially overlaps with an orthographic projection of the first data line DL1 on the base substrate, partially overlaps with an orthographic projection of the second data line DL2 on the base substrate, and is non-overlapping with an orthographic projection of the third data line DL3 on the base substrate. The inventors of the present disclosure discover that by having the orthographic projection of the third data line DL3 non-overlapping with the orthographic projection of the anode layer, loading of the third data line DL3 can be reduced.

In some embodiments, the orthographic projection of the first data line DL1 on the base substrate partially overlaps with an orthographic projection of the first anode AD1 on the base substrate, and partially overlaps with an orthographic projection of the second anode AD2 on the base substrate. In some embodiments, the orthographic projection of the second data line DL2 on the base substrate partially overlaps with an orthographic projection of the third anode AD3 on the base substrate.

Optionally, the orthographic projection of the first anode AD1 on the base substrate is non-overlapping with the orthographic projection of the second data line DL2 on the base substrate, and is non-overlapping with an orthographic projection of the third data line DL3 on the base substrate.

Optionally, the orthographic projection of the second anode AD2 on the base substrate is non-overlapping with the orthographic projection of the second data line DL2 on the base substrate, and is non-overlapping with an orthographic projection of the third data line DL3 on the base substrate.

Optionally, the orthographic projection of the third anode AD3 on the base substrate is non-overlapping with is non-overlapping with the orthographic projection of the first data line DL1 on the base substrate, and is non-overlapping with an orthographic projection of the third data line DL3 on the base substrate.

Figure 10:
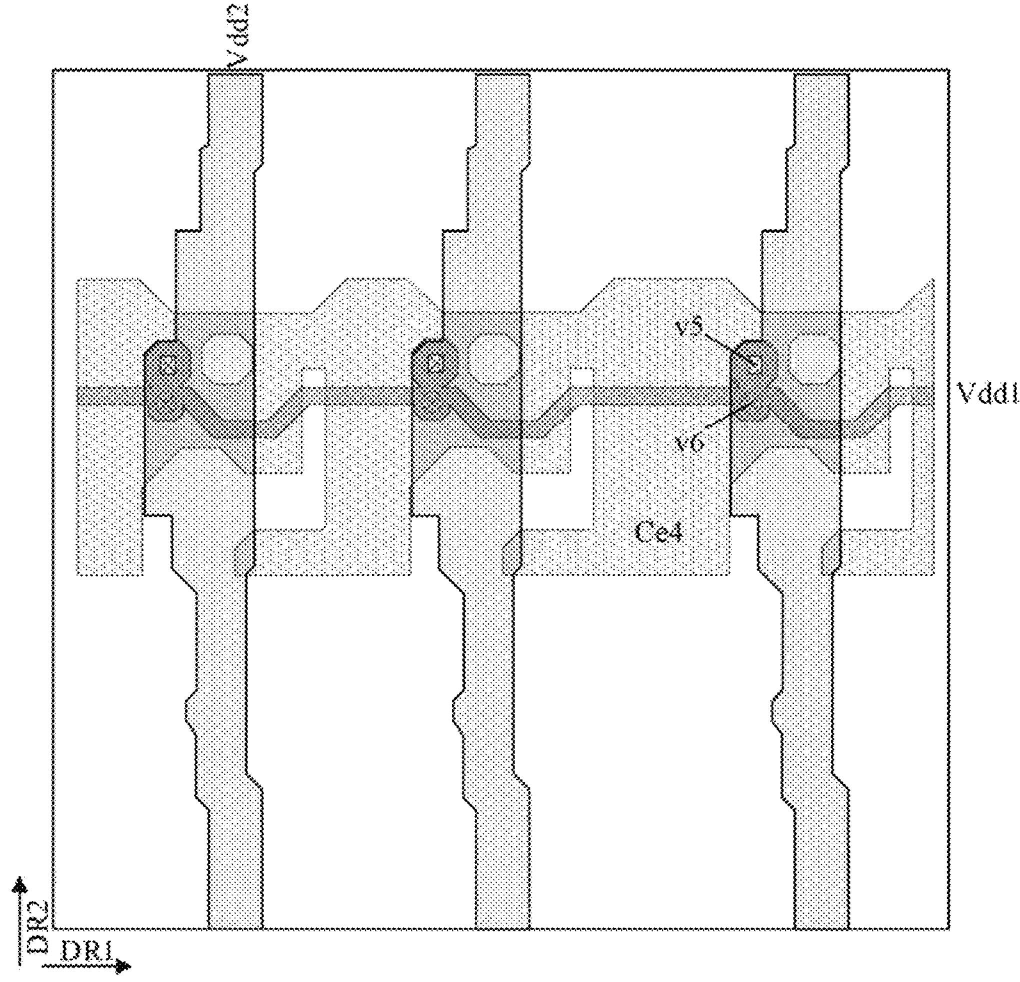
FIG. 10 is a schematic diagram illustrating the structure of an interconnected first voltage supply network in some embodiments according to the present disclosure.

FIG. 10 is a schematic diagram illustrating the structure of an interconnected first voltage supply network in some embodiments according to the present disclosure. Referring to FIG. 10, the interconnected first voltage supply network in some embodiments includes a plurality of first voltage supply line first branches Vdd1 and a plurality of first voltage supply line second branches Vdd2. Optionally, the interconnected first voltage supply network further includes a unitary structure comprising multiple fourth capacitor electrodes in a same row. Optionally, the plurality of first voltage supply line first branches Vdd1 extend along a direction substantially parallel to the first direction DR1. Optionally, the plurality of first voltage supply line second branches Vdd2 extend along a direction substantially parallel to the second direction DR2. Optionally, the unitary structure comprising multiple fourth capacitor electrodes in a same row extends along a direction substantially parallel to the first direction DR1.

Referring to FIG. 10, a first voltage supply line second branch of the plurality of first voltage supply line second branches Vdd2 is connected to a respective first voltage supply line first branch of the plurality of first voltage supply line first branches Vdd1 through a fifth via v5. A respective first voltage supply line first branch of the plurality of first voltage supply line first branches Vdd1 is connected to a fourth capacitor electrode Ce4 through a sixth via v6.

Figure 11:
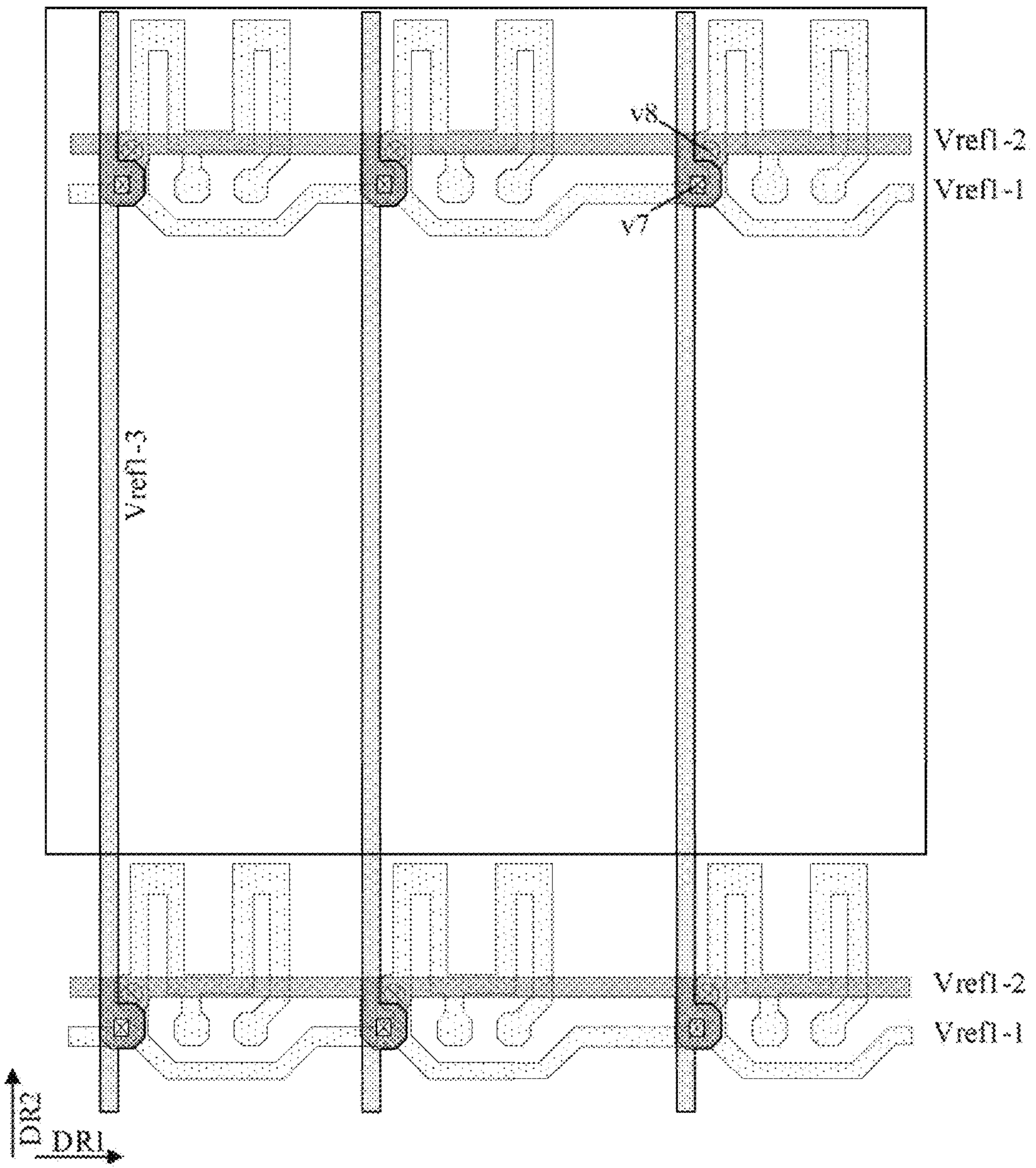
FIG. 11 is a schematic diagram illustrating the structure of an interconnected reference signal network in some embodiments according to the present disclosure.

FIG. 11 is a schematic diagram illustrating the structure of an interconnected reference signal network in some embodiments according to the present disclosure. Referring to FIG. 11, the interconnected reference signal network in some embodiments includes a plurality of first reference signal line first branches Vref1-1, the plurality of first reference signal line second branches Vref1-2, and the plurality of first reference signal line third branches Vref1-3. Optionally, the plurality of first reference signal line first branches Vref1-1 extend along a direction substantially parallel to the first direction DR1. Optionally, the plurality of first reference signal line second branches Vref1-2 extend along a direction substantially parallel to the first direction DR1. Optionally, the plurality of first reference signal line third branches Vref1-3 extend along a direction substantially parallel to the second direction DR2.

Referring to FIG. 11, a first reference signal line third branch of the plurality of first reference signal line third branches Vref1-3 is connected to a first reference signal line second branch of the plurality of first reference signal line second branches Vref1-2 through a seventh via v7. A first reference signal line second branch of the plurality of first reference signal line second branches Vref1-2 is connected to a first electrode of a seventh transistor through an eighth via v8. The first reference signal line second branch of the plurality of first reference signal line second branches Vref1-2 is connected to first electrodes of seventh transistors in pixel driving circuits in a same row, which are parts of a unitary structure having a first reference signal line first branch of the plurality of first reference signal line first branches Vref1-1.

Figure 12:
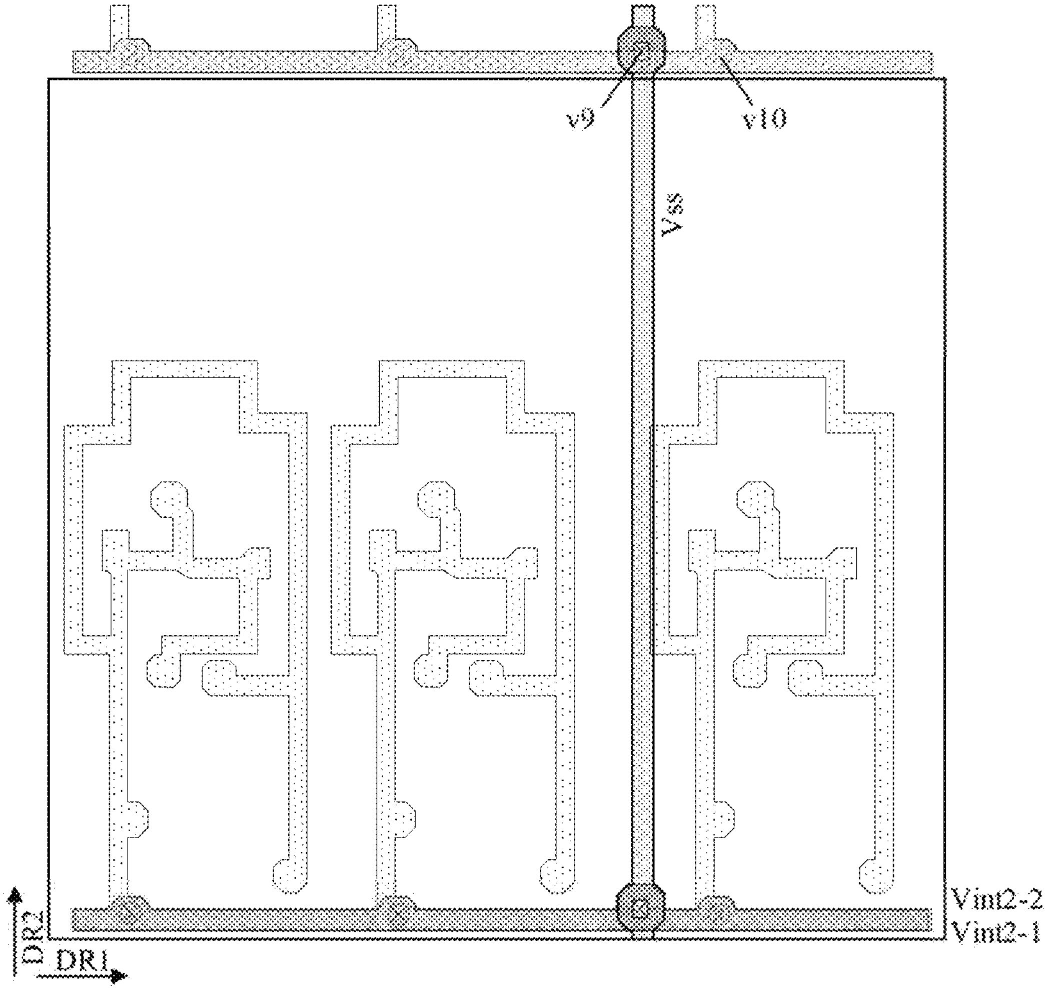
FIG. 12 is a schematic diagram illustrating the structure of an interconnected second voltage supply network in some embodiments according to the present disclosure.

FIG. 12 is a schematic diagram illustrating the structure of an interconnected second voltage supply network in some embodiments according to the present disclosure. Referring to FIG. 12, the interconnected second voltage supply network in some embodiments includes a plurality of second voltage supply lines Vss, a plurality of second reset signal line first branches Vint2-1, and a plurality of second reset signal line second branches Vint2-2. Optionally, the plurality of second reset signal line first branches Vint2-1 extend along a direction substantially parallel to the first direction DR1. Optionally, the plurality of second reset signal line second branches Vint2-2 extend along a direction substantially parallel to the first direction DR1. Optionally, the plurality of second voltage supply lines Vss extend along a direction substantially parallel to the second direction DR2.

Referring to FIG. 12, a second voltage supply line of the plurality of second voltage supply lines Vss is connected to a second reset signal line second branch of the plurality of second reset signal line second branches Vint2-2 through a ninth via v9. A second reset signal line second branch of the plurality of second reset signal line second branches Vint2-2 is connected to a second reset signal line first branch of the plurality of second reset signal line first branches Vint2-1 through a tenth via v10.

Optionally, an orthographic projection of a respective second reset signal line second branch of the plurality of second reset signal line second branches Vint2-2 on a base substrate substantially covers (e.g., covers at least 80%, covers at least 85%, covers at least 90%, covers at least 95%, covers at least 99%, or completely covers) an orthographic projection of a respective second reset signal line first branch of the plurality of second reset signal line first branches Vint2-1 on the base substrate.

Figure 13A:
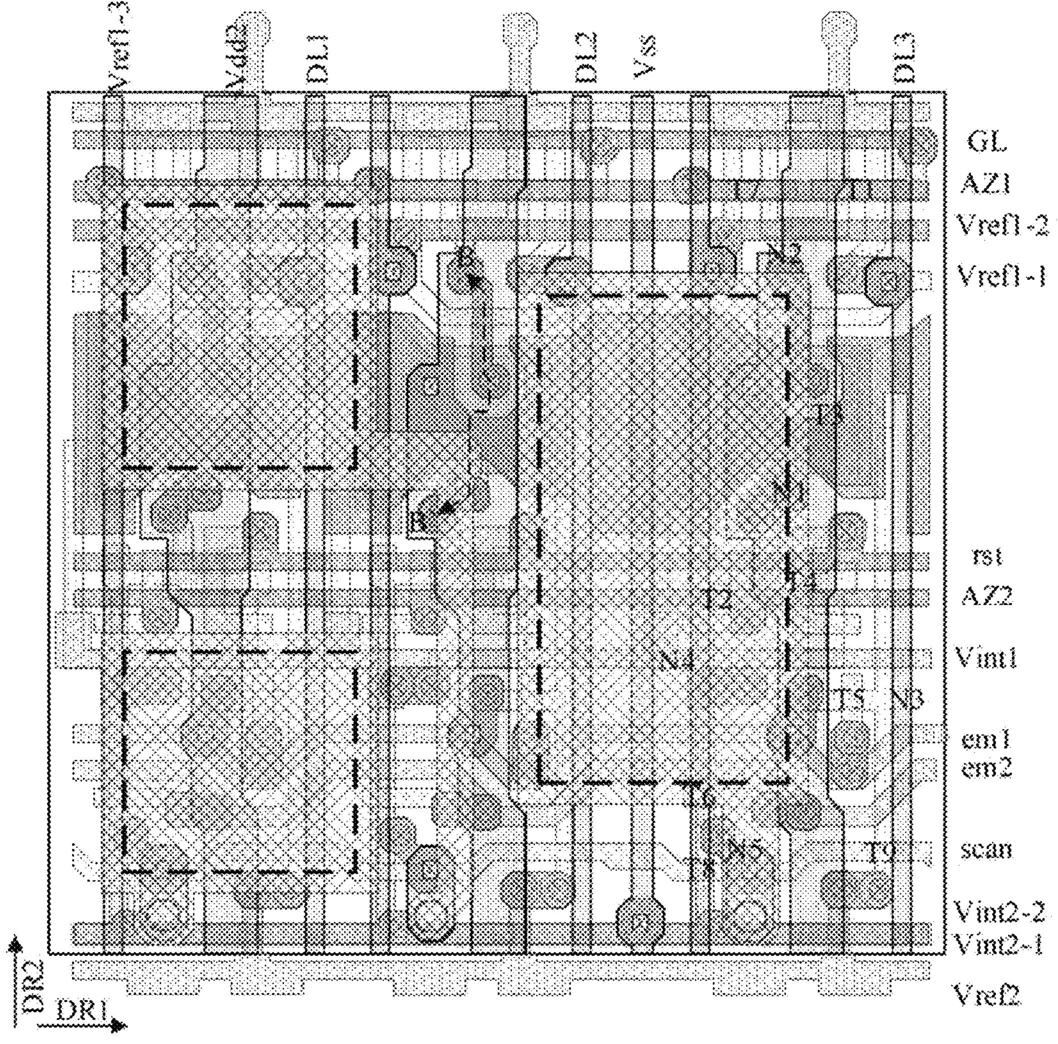
FIG. 13A is a diagram illustrating the structure of an array substrate in some embodiments according to the present disclosure.
Figure 13B:
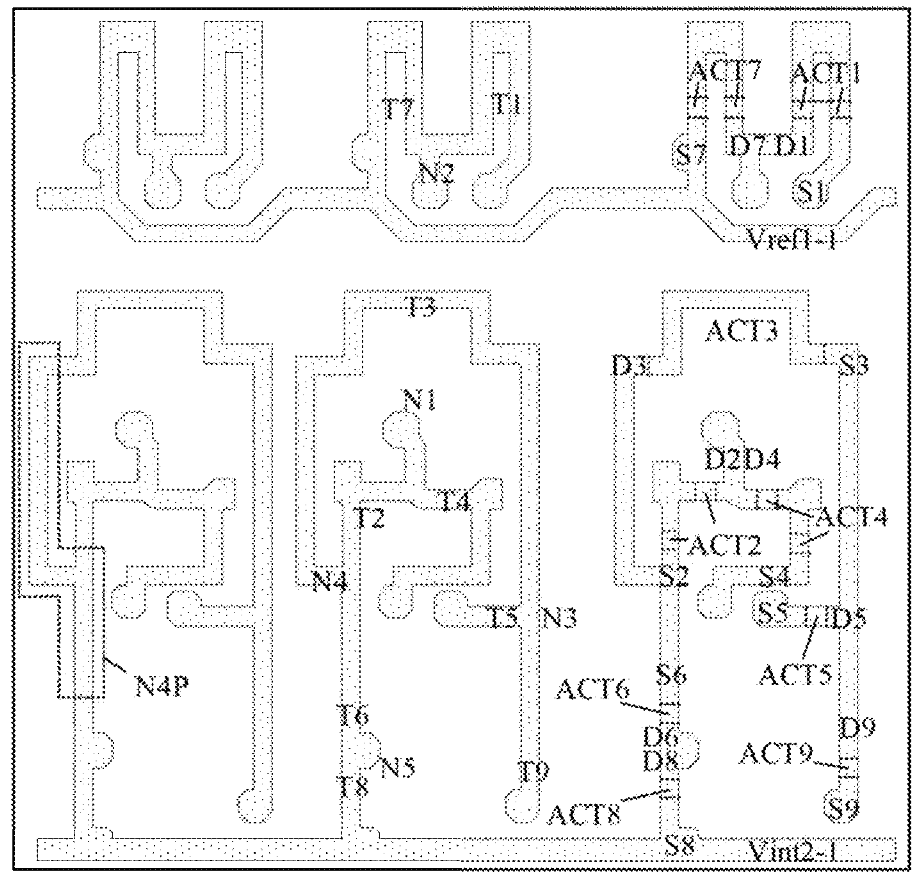
FIG. 13B is a diagram illustrating the structure of a semiconductor material layer in an array substrate depicted in FIG. 13A.
Figure 13C:
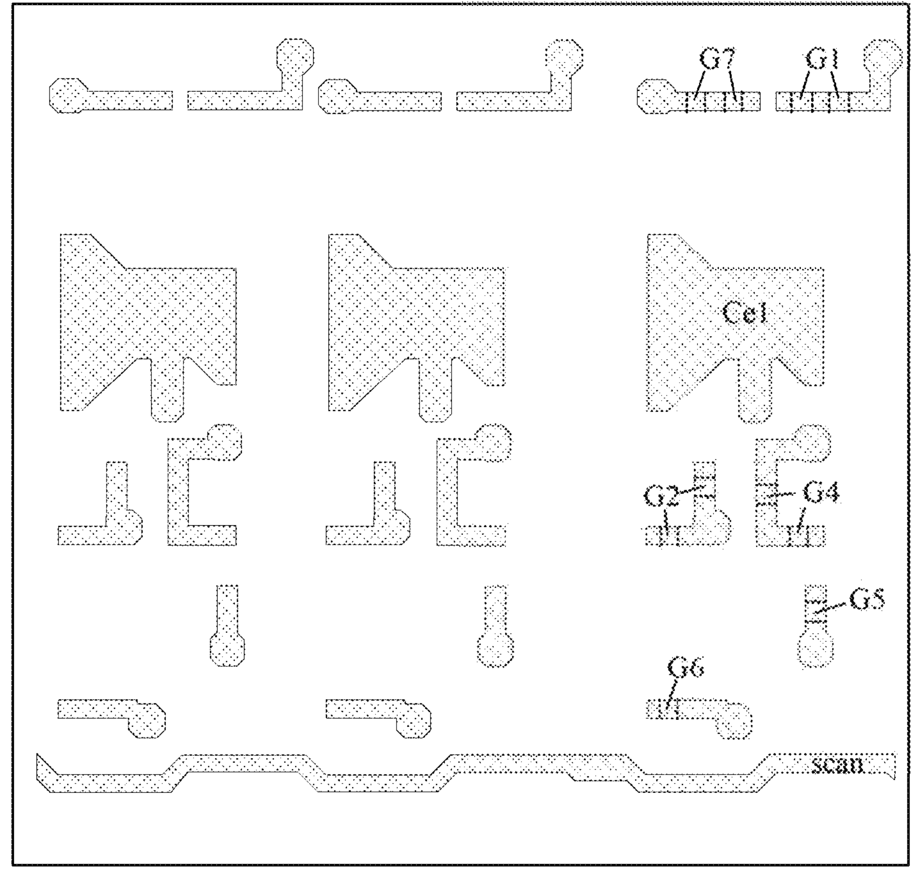
FIG. 13C is a diagram illustrating the structure of a first conductive layer in an array substrate depicted in FIG. 13A.
Figure 13D:
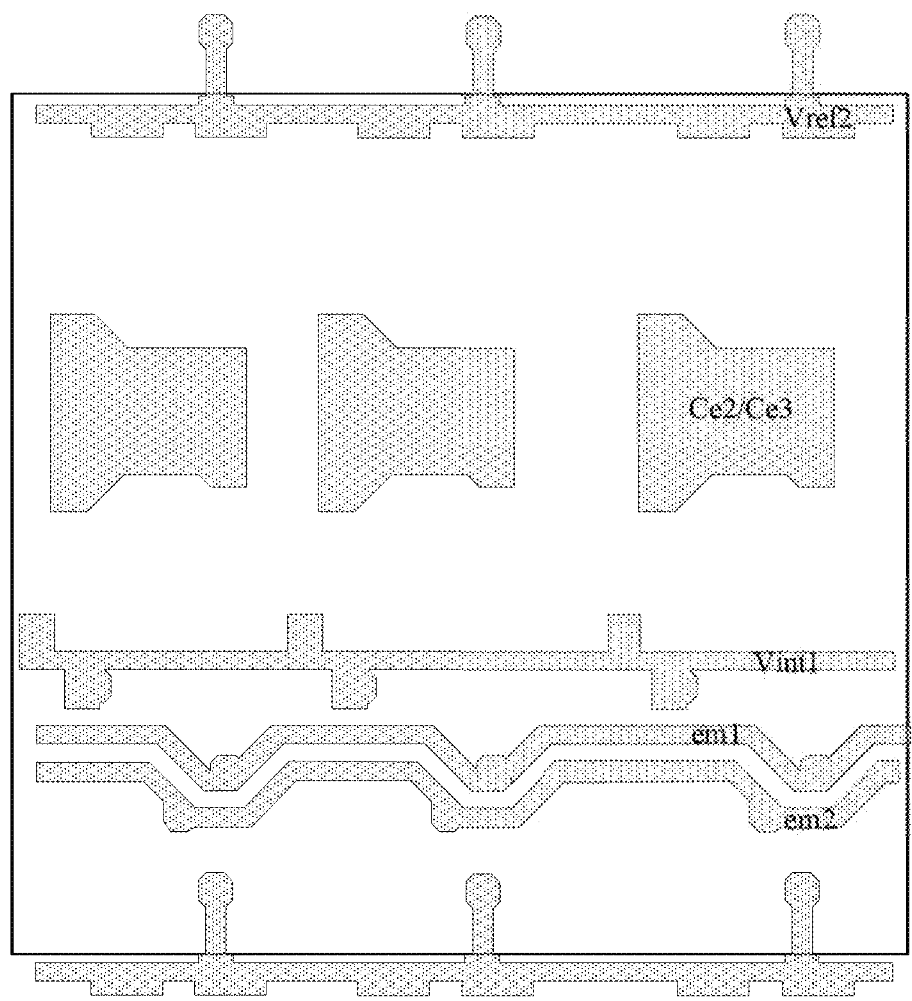
FIG. 13D is a diagram illustrating the structure of a second conductive layer in an array substrate depicted in FIG. 13A.
Figure 13E:
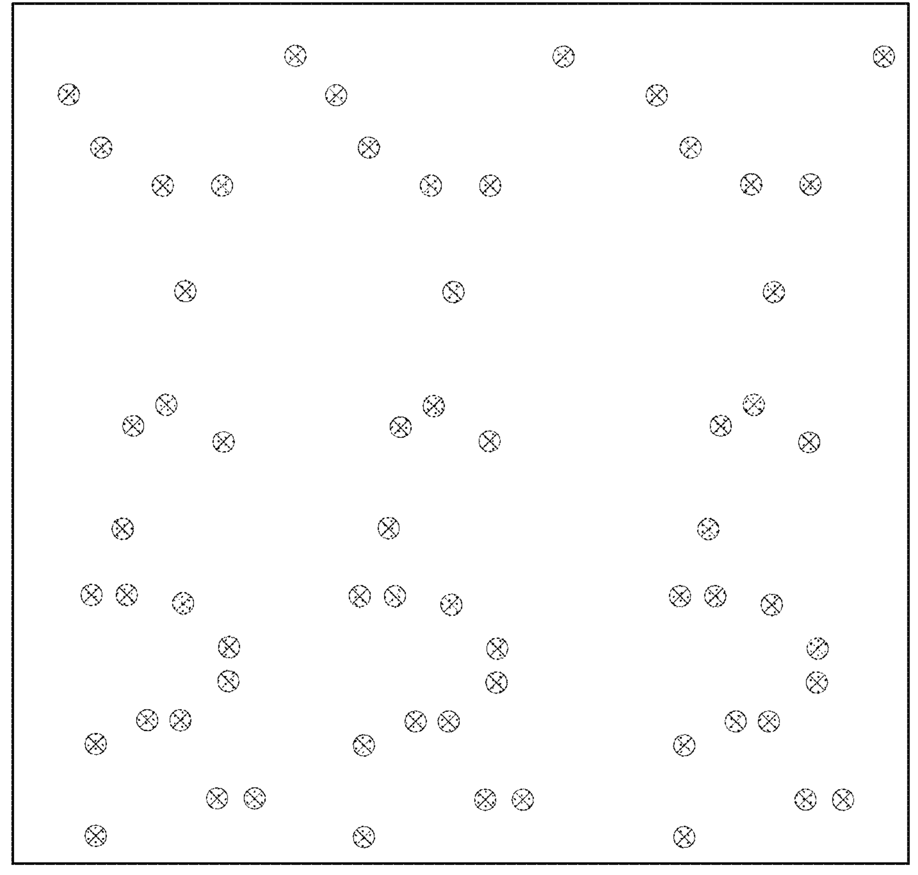
FIG. 13E is a diagram illustrating the structure of an inter-layer dielectric layer in an array substrate depicted in FIG. 13A.
Figure 13F:
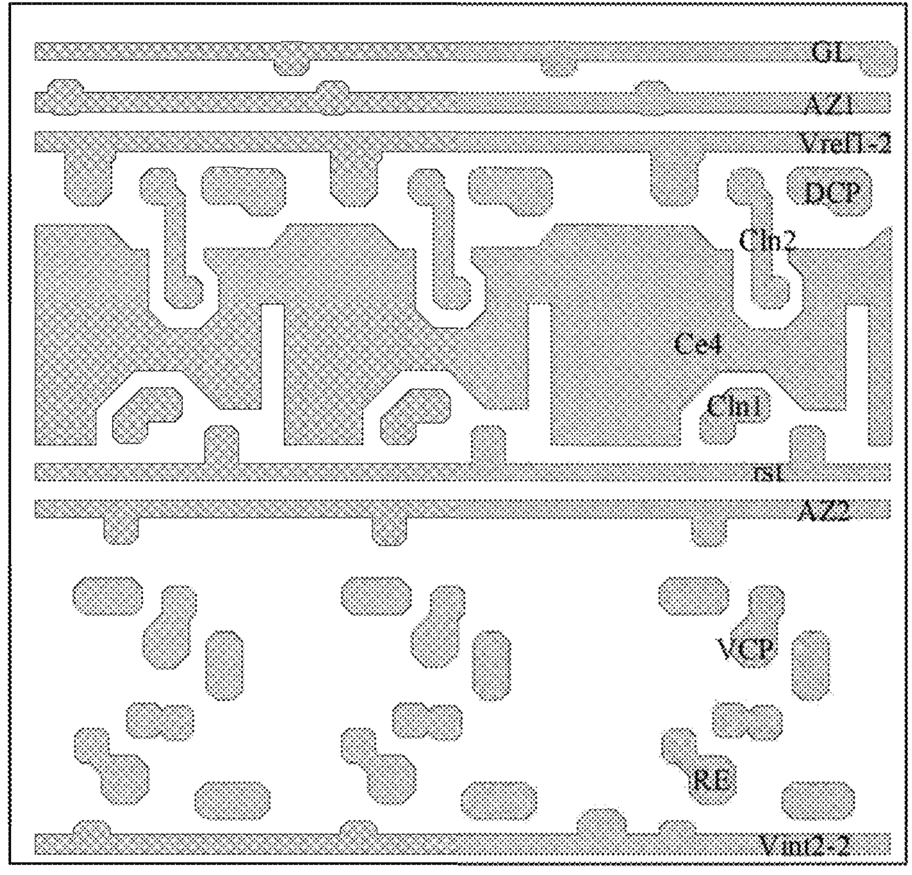
FIG. 13F is a diagram illustrating the structure of a first signal line layer in an array substrate depicted in FIG. 13A.
Figure 13G:
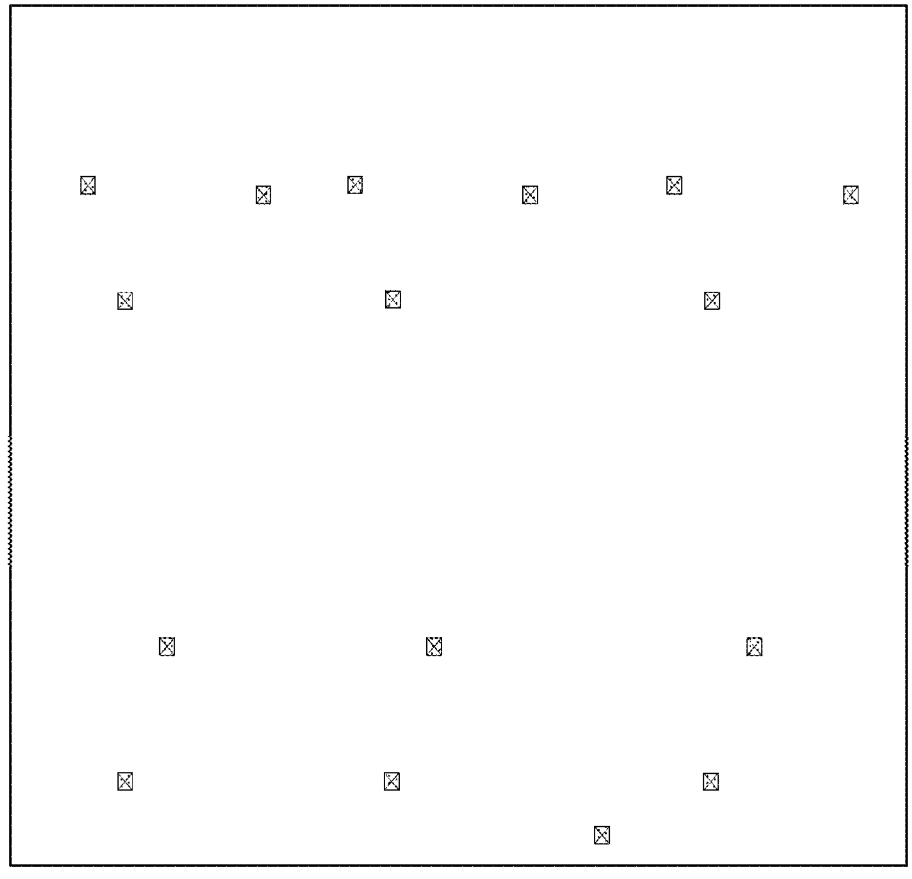
FIG. 13G is a diagram illustrating the structure of a first planarization layer in an array substrate depicted in FIG. 13A.
Figure 13H:
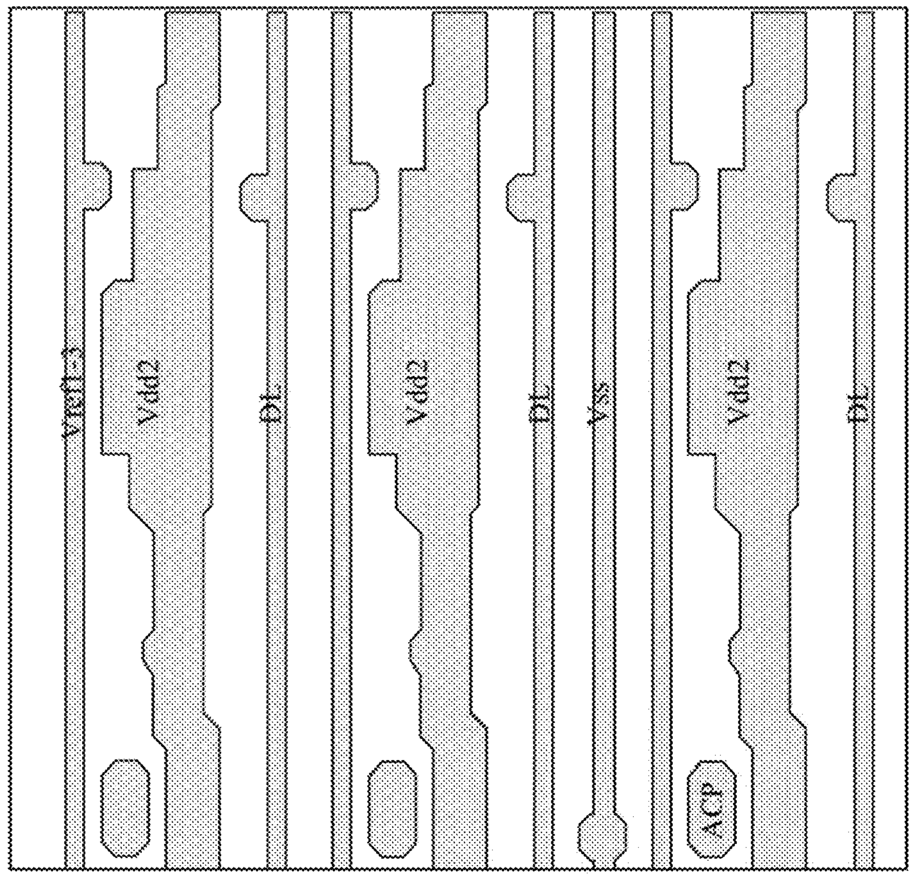
FIG. 13H is a diagram illustrating the structure of a second signal line layer in an array substrate depicted in FIG. 13A.
Figure 13I:
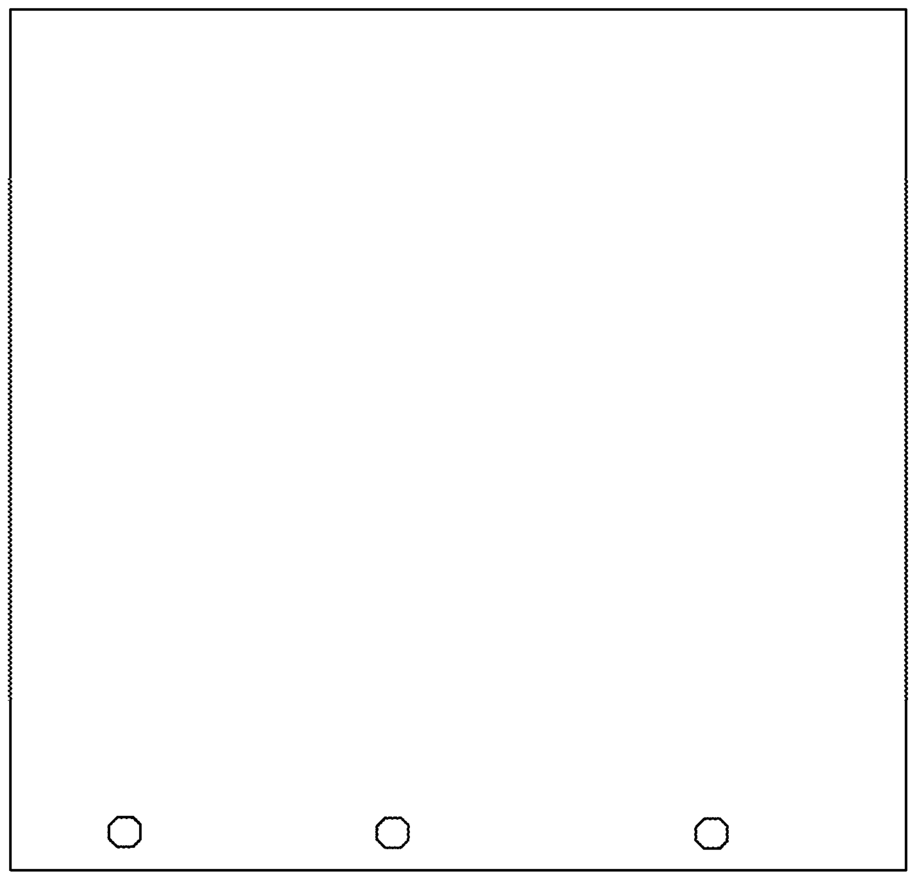
FIG. 13I is a diagram illustrating the structure of a second planarization layer in an array substrate depicted in FIG. 13A.
Figure 13J:
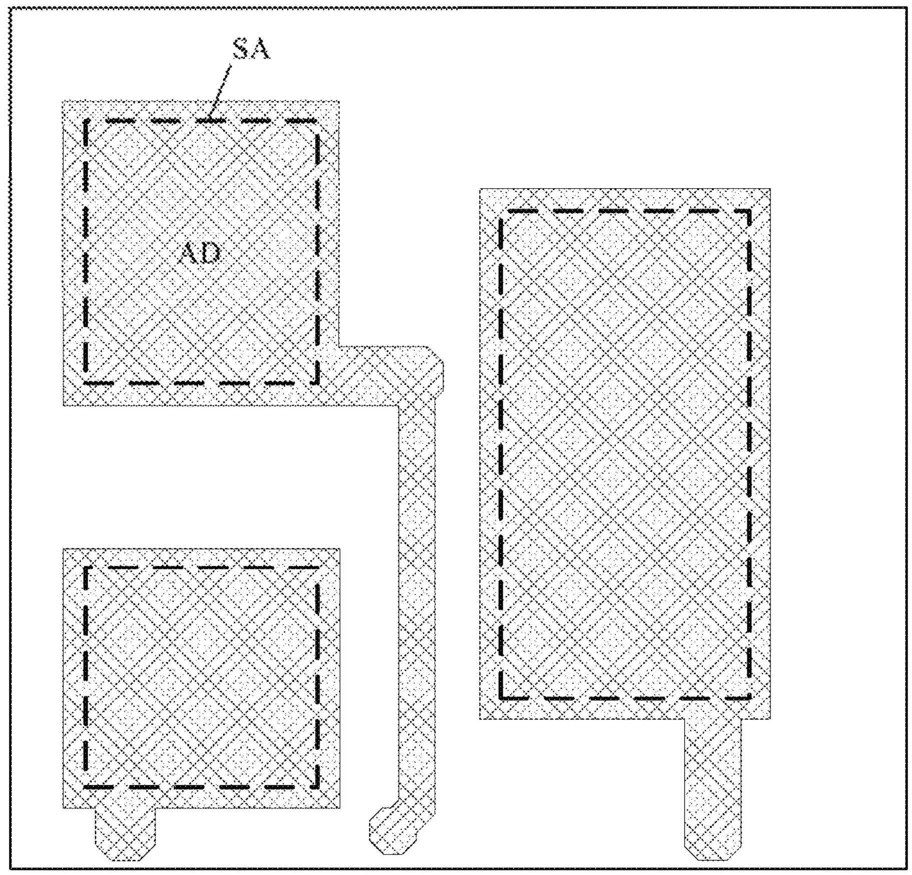
FIG. 13J is a diagram illustrating the structure of an anode layer in an array substrate depicted in FIG. 13A.
Figure 13K:
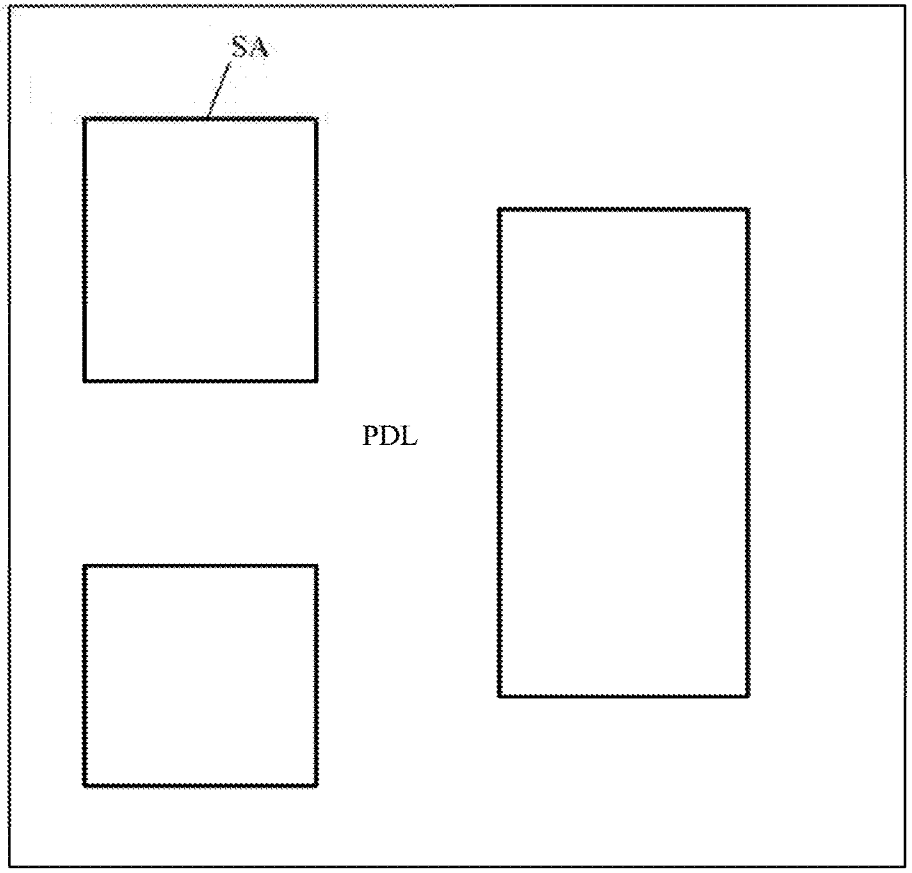
FIG. 13K is a diagram illustrating the structure of a pixel definition layer in an array substrate depicted in FIG. 13A.
Figure 14:
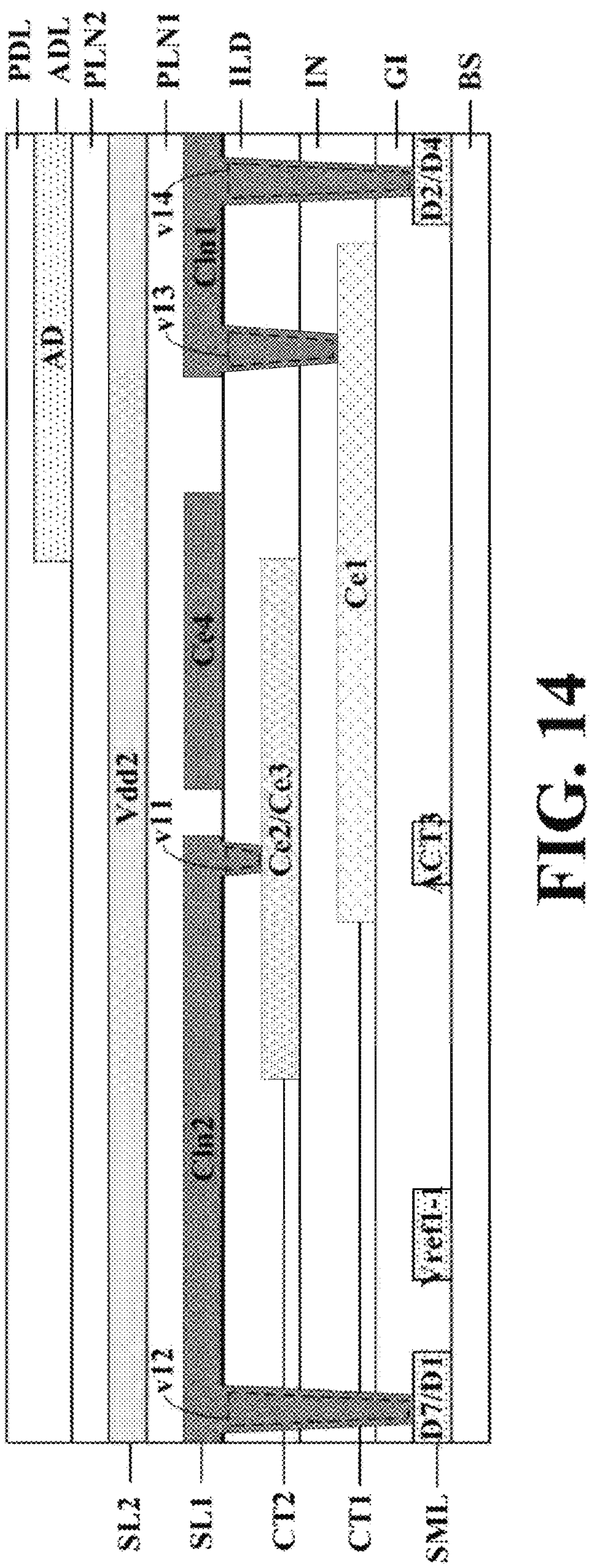
FIG. 14 is a cross-sectional view along a B-B' line in FIG. 13A.

FIG. 13A is a diagram illustrating the structure of an array substrate in some embodiments according to the present disclosure. FIG. 13B is a diagram illustrating the structure of a semiconductor material layer in an array substrate depicted in FIG. 13A. FIG. 13C is a diagram illustrating the structure of a first conductive layer in an array substrate depicted in FIG. 13A. FIG. 13D is a diagram illustrating the structure of a second conductive layer in an array substrate depicted in FIG. 13A. FIG. 13E is a diagram illustrating the structure of an inter-layer dielectric layer in an array substrate depicted in FIG. 13A. FIG. 13F is a diagram illustrating the structure of a first signal line layer in an array substrate depicted in FIG. 13A. FIG. 13G is a diagram illustrating the structure of a first planarization layer in an array substrate depicted in FIG. 13A. FIG. 13H is a diagram illustrating the structure of a second signal line layer in an array substrate depicted in FIG. 13A. FIG. 13I is a diagram illustrating the structure of a second planarization layer in an array substrate depicted in FIG. 13A. FIG. 13J is a diagram illustrating the structure of an anode layer in an array substrate depicted in FIG. 13A. FIG. 13K is a diagram illustrating the structure of a pixel definition layer in an array substrate depicted in FIG. 13A. FIG. 14 is a cross-sectional view along a B-B' line in FIG. 13A.

Referring to FIG. 13A to FIG. 13K, and FIG. 14, in some embodiments, the array substrate includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer CT1 away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, a second planarization layer PLN2 on a side of the second signal line layer SL2 away from the first planarization layer PLN1, an anode layer ADL on a side of the second planarization layer PLN2 away from the second signal line layer SL2, and a pixel definition layer PDL on a side of the anode layer ADL away from the base substrate BS. As compared to the array substrate depicted in FIG. 4A to FIG. 4M, and FIG. 5, the army substrate depicted in FIG. 13A to FIG. 13K, and FIG. 14 does not have a third conductive layer CT3. The first signal line layer in the array substrate depicted in FIG. 13A to FIG. 13K, and FIG. 14 further includes a fourth capacitor electrode Ce4. The array substrate depicted in FIG. 13A to FIG. 13K, and FIG. 14 does not include a plurality of first voltage supply line first branches (Vdd1 in the array substrate depicted in FIG. 4A to FIG. 4M, and FIG. 5).

In some embodiments, the array substrate further includes an eleventh via v11 and a twelfth via v12. The eleventh via v11 extends through the inter-layer dielectric layer ILD. The twelfth via v12 extends through the inter-layer dielectric layer ILD, the insulating layer IN, and the gate insulating layer GI. Optionally, the second node connecting line Cln2 is connected to the electrode block comprising the second capacitor electrode Ce2 and the third capacitor electrode Ce3 through the eleventh via v11, and is connected to the semiconductor material layer SML through the twelfth via v12. Optionally, the second node connecting line Cln2 is connected to the second electrode D7 of the seventh transistor and/or the second electrode D1 of the first transistor, as depicted in FIG. 14. In one example, the second node connecting line Cln2 corresponds to the second node N2.

In some embodiments, the array substrate further includes a thirteenth via v13 and a fourteenth via v14. The thirteenth via v13 extends through the inter-layer dielectric layer ILD and the insulating layer IN. The fourteenth via v14 extends through the inter-layer dielectric layer ILD, the insulating layer IN, and the gate insulating layer GI. Optionally, the first node connecting line Cln1 is connected to the first capacitor electrode Ce1 through the thirteenth via v13, and is connected to the semiconductor material layer SML through the fourteenth via v14. Optionally, the first node connecting line Cln1 is connected to the second electrode D2 of the second transistor and/or the second electrode D4 of the fourth transistor, as depicted in FIG. 14. In one example, the first node connecting line Cln1 corresponds to the first node N1.

In some embodiments, the array substrate includes a stacked structure of capacitor electrodes. In some embodiments, the stacked structure includes the first capacitor electrode Ce1, the insulating layer IN, the electrode block comprising the second capacitor electrode Ce2 and the third capacitor electrode Ce3, the inter-layer dielectric layer ILD, and the fourth capacitor electrode Ce4. The first capacitor electrode Ce1, the insulating layer IN, and the electrode block comprising the second capacitor electrode Ce2 and the third capacitor electrode Ce3 form the first capacitor. The electrode block comprising the second capacitor electrode Ce2 and the third capacitor electrode Ce3, the inter-layer dielectric layer ILD, and the fourth capacitor electrode Ce4 form the second capacitor.

In some embodiments, the first capacitor electrode Ce1 is in the first conductive layer CT1; the electrode block comprising the second capacitor electrode Ce2 and the third capacitor electrode Ce3 is in the second conductive layer CT2 on a side of the insulating layer IN away from the first conductive layer CT1; and the fourth capacitor electrode Ce4 is in the first signal line layer SL1 on a side of the inter-layer dielectric layer ILD away from the second conductive layer CT2.

Figure 15:
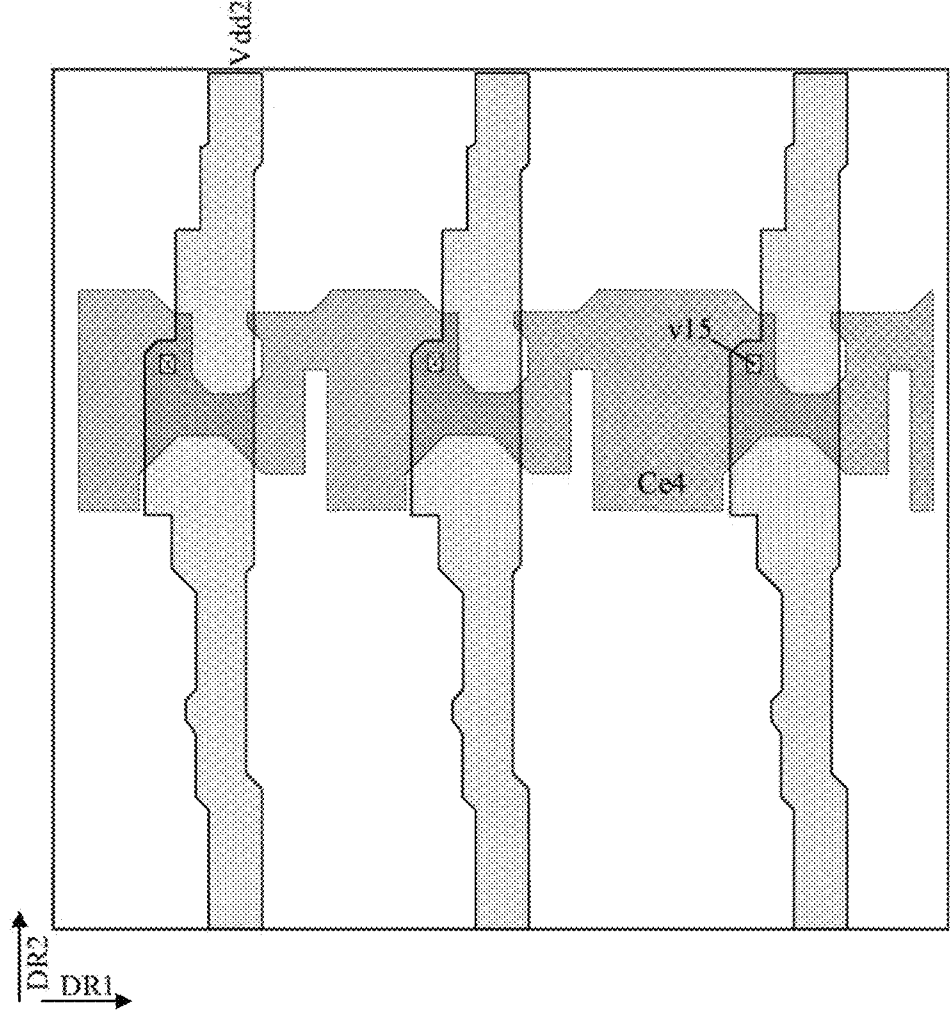
FIG. 15 is a schematic diagram illustrating the structure of an interconnected first voltage supply network in some embodiments according to the present disclosure.

FIG. 15 is a schematic diagram illustrating the structure of an interconnected first voltage supply network in some embodiments according to the present disclosure. Referring to FIG. 15, the interconnected first voltage supply network in some embodiments includes a plurality of first voltage supply line second branches Vdd2, and a unitary structure comprising multiple fourth capacitor electrodes in a same row. Optionally, the plurality of first voltage supply line second branches Vdd2 extend along a direction substantially parallel to the second direction DR2. Optionally, the unitary structure comprising multiple fourth capacitor electrodes in a same row extends along a direction substantially parallel to the first direction DR1. Referring to FIG. 15, a first voltage supply line second branch of the plurality of first voltage supply line second branches Vdd2 is connected to a fourth capacitor electrode Ce4 through a fifteenth via v15.

Figure 16A:
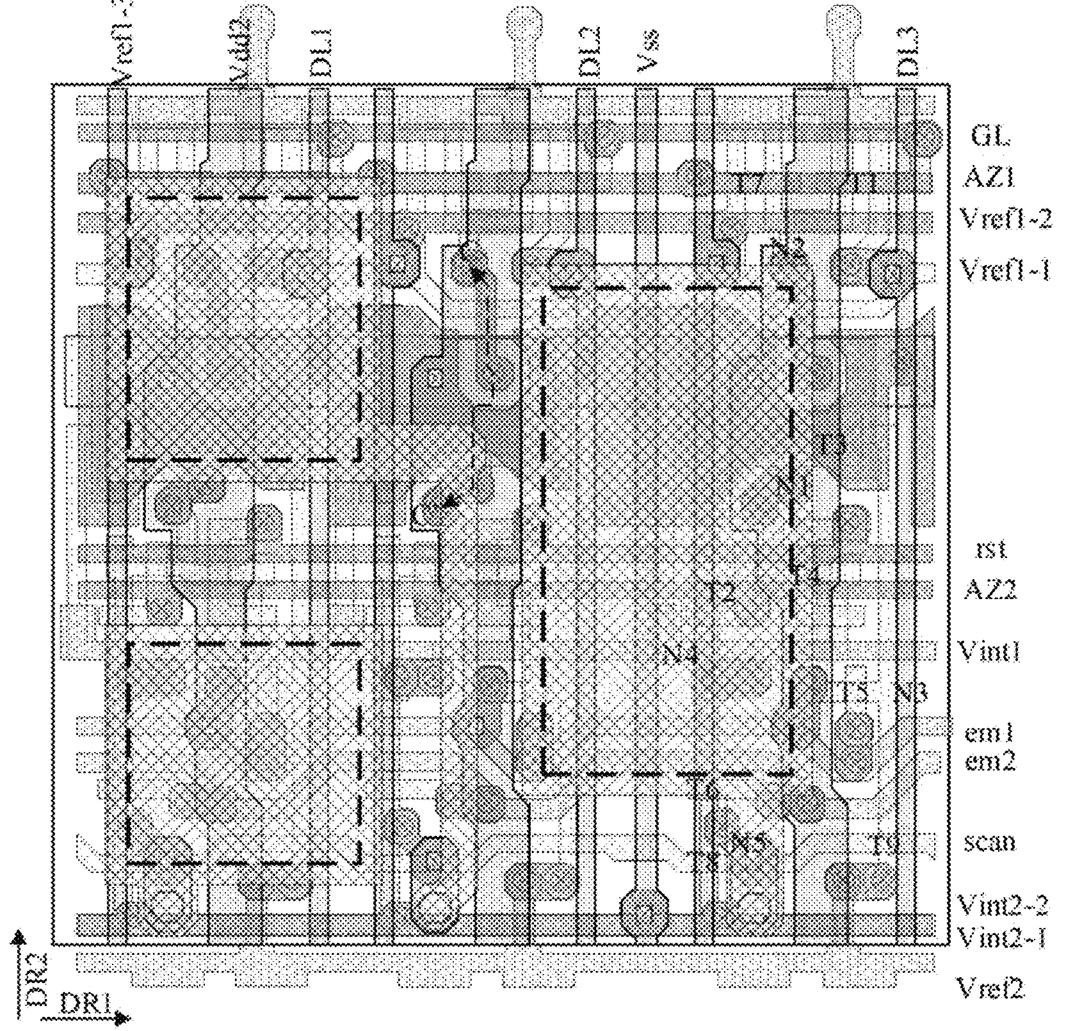
FIG. 16A is a diagram illustrating the structure of an array substrate in some embodiments according to the present disclosure.
Figure 16B:
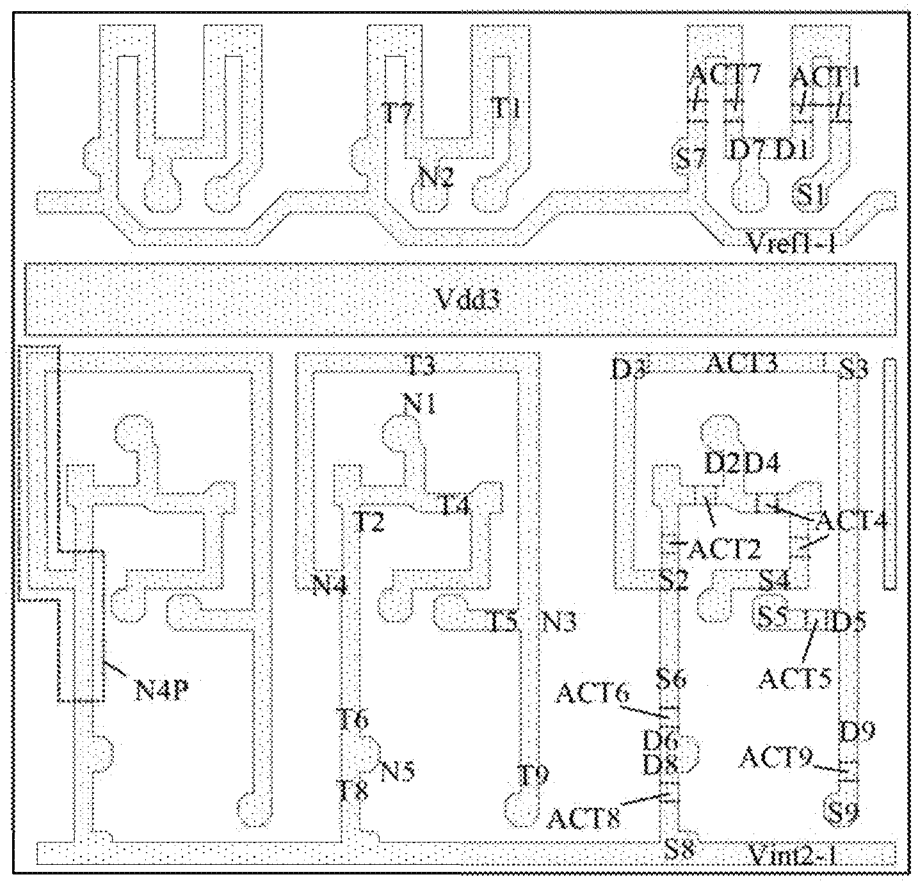
FIG. 16B is a diagram illustrating the structure of a semiconductor material layer in an array substrate depicted in FIG. 16A.
Figure 16C:
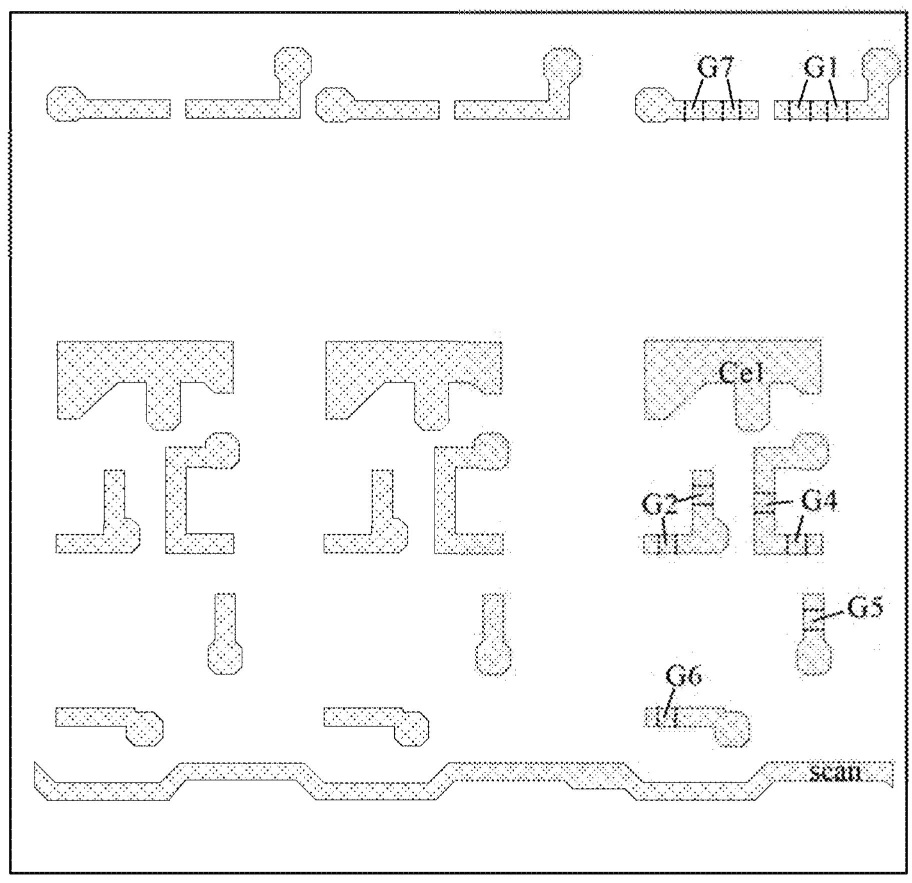
FIG. 16C is a diagram illustrating the structure of a first conductive layer in an array substrate depicted in FIG. 16A.
Figure 16D:
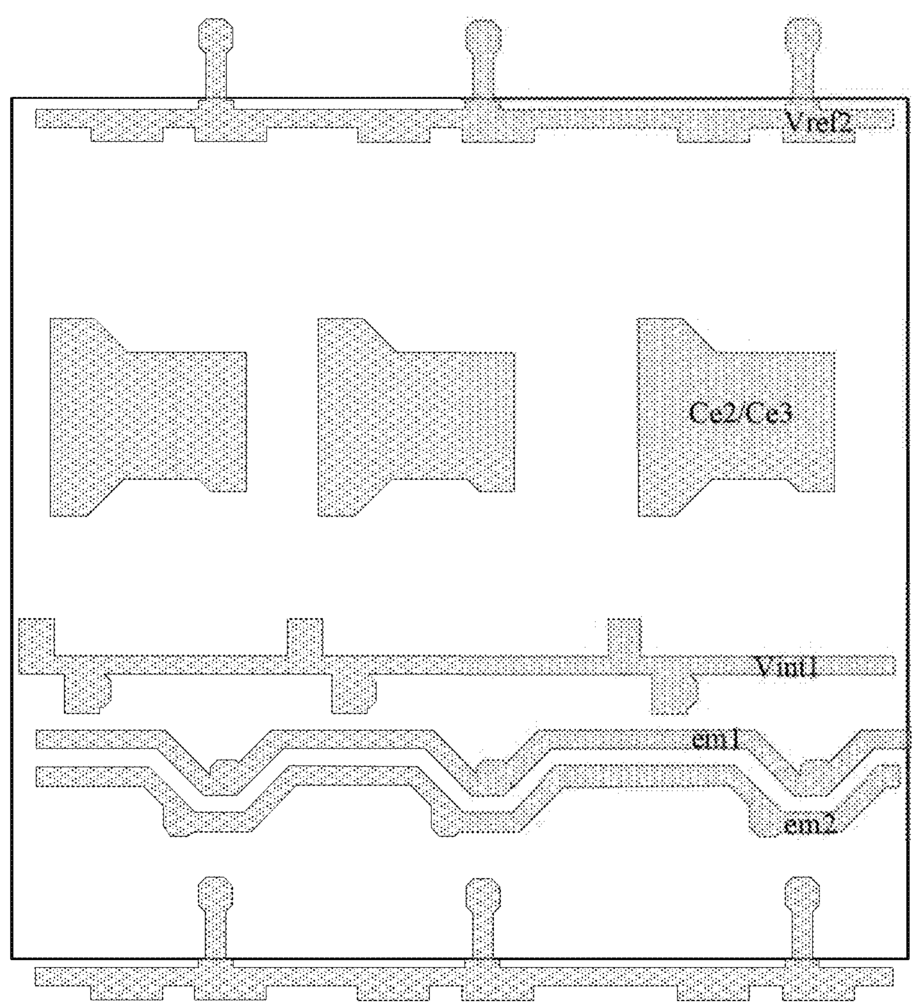
FIG. 16D is a diagram illustrating the structure of a second conductive layer in an array substrate depicted in FIG. 16A.
Figure 16E:
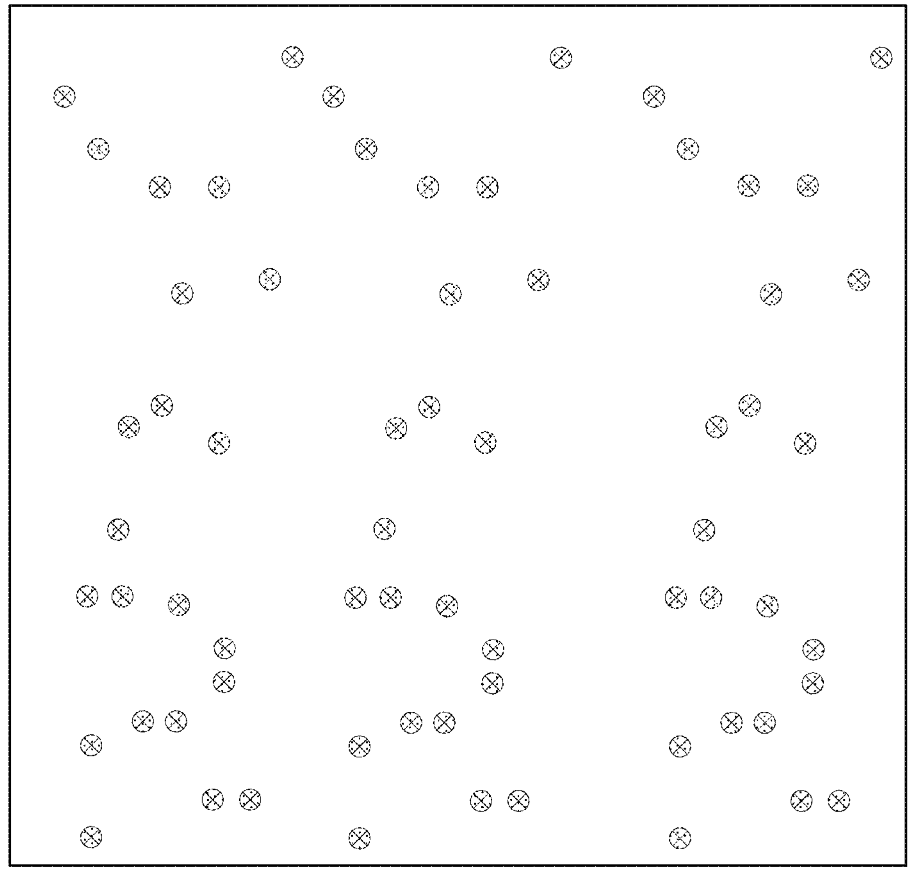
FIG. 16E is a diagram illustrating the structure of an inter-layer dielectric layer in an array substrate depicted in FIG. 16A.
Figure 16F:
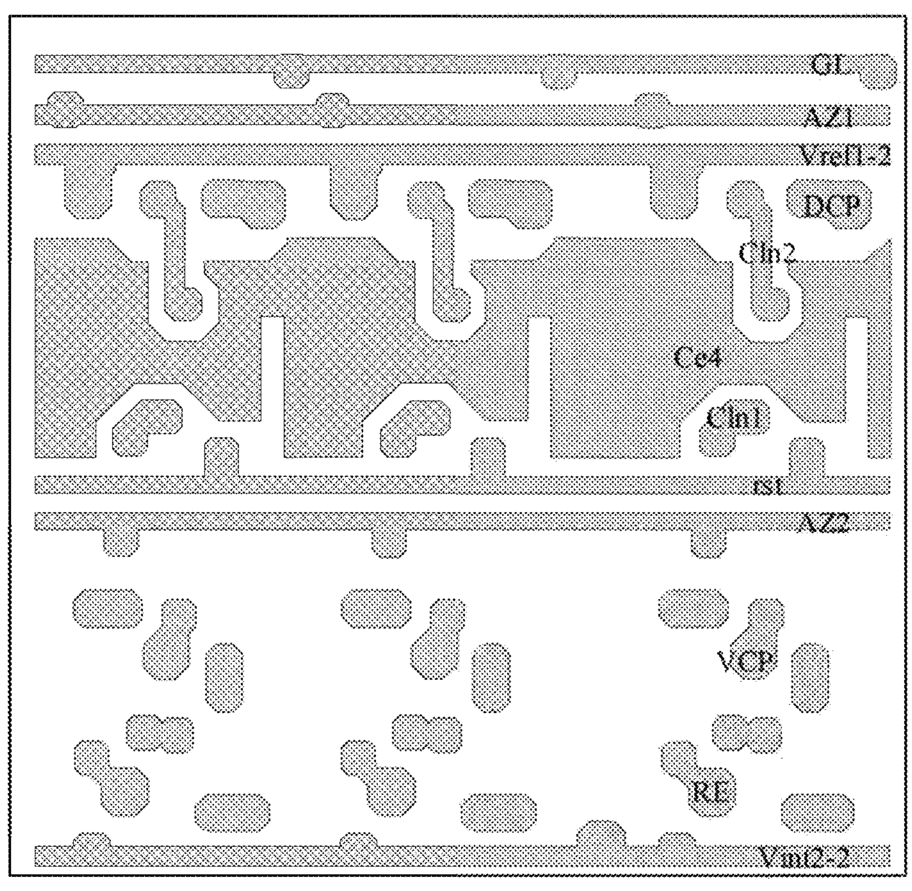
FIG. 16F is a diagram illustrating the structure of a first signal line layer in an array substrate depicted in FIG. 16A.
Figure 16G:
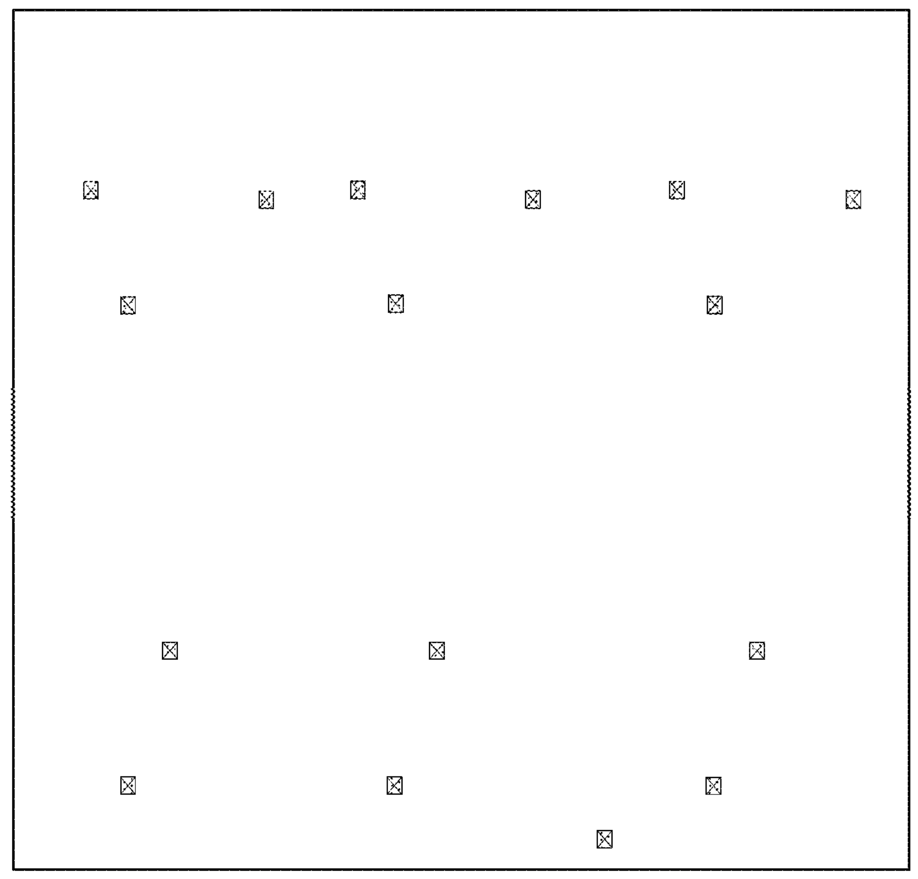
FIG. 16G is a diagram illustrating the structure of a first planarization layer in an array substrate depicted in FIG. 16A.
Figure 16H:
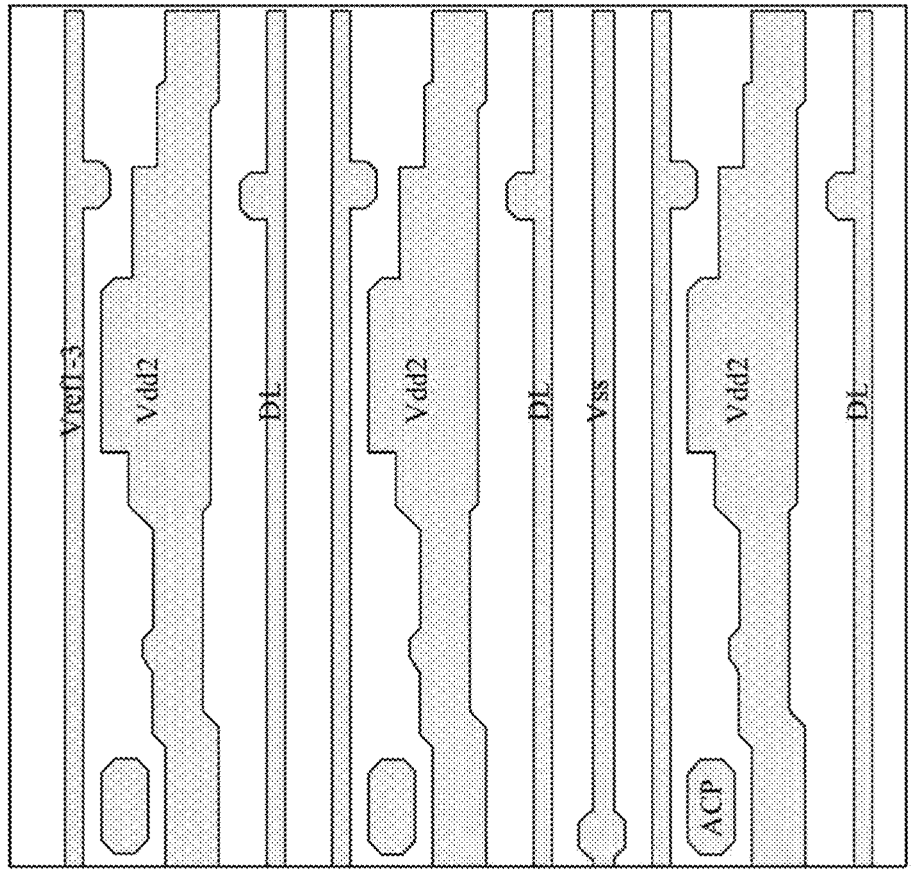
FIG. 16H is a diagram illustrating the structure of a second signal line layer in an array substrate depicted in FIG. 16A.
Figure 17:
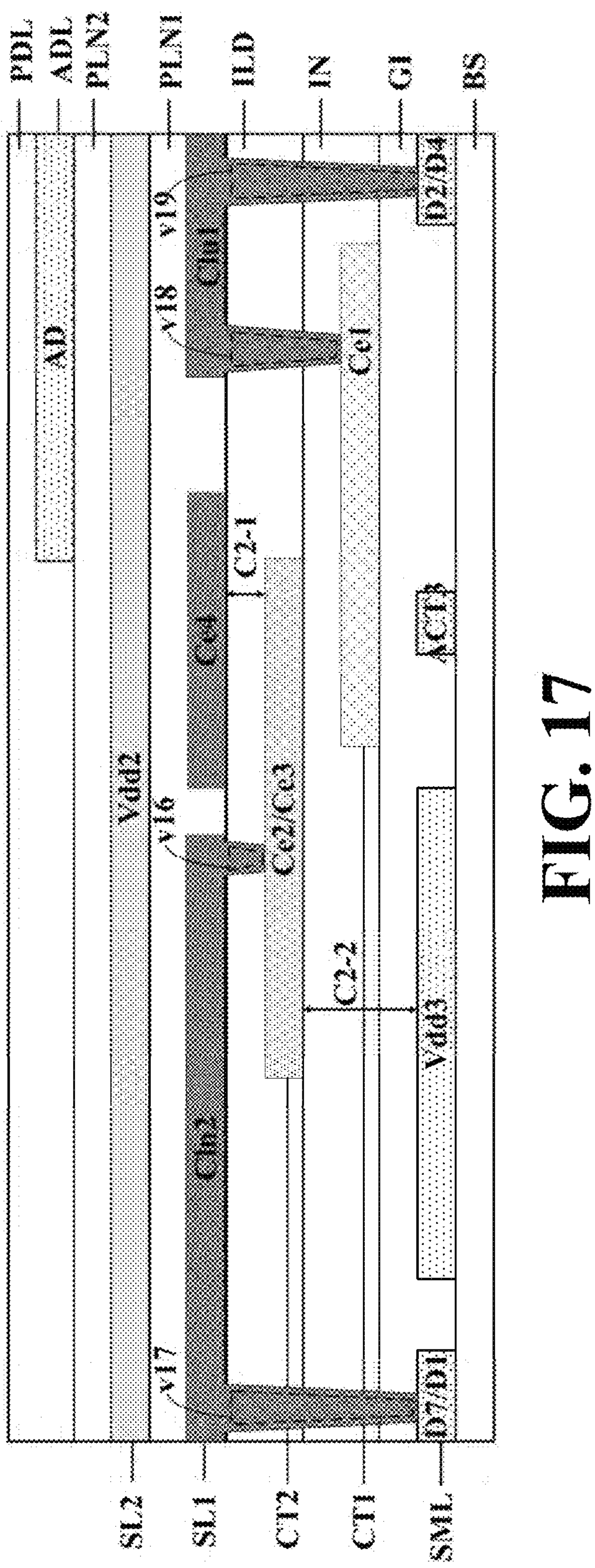
FIG. 17 is a cross-sectional view along a C-C' line in FIG. 16A.

FIG. 16A is a diagram illustrating the structure of an array substrate in some embodiments according to the present disclosure. FIG. 16B is a diagram illustrating the structure of a semiconductor material layer in an array substrate depicted in FIG. 16A. FIG. 16C is a diagram illustrating the structure of a first conductive layer in an array substrate depicted in FIG. 16A. FIG. 16D is a diagram illustrating the structure of a second conductive layer in an array substrate depicted in FIG. 16A. FIG. 16E is a diagram illustrating the structure of an inter-layer dielectric layer in an array substrate depicted in FIG. 16A. FIG. 16F is a diagram illustrating the structure of a first signal line layer in an array substrate depicted in FIG. 16A. FIG. 16G is a diagram illustrating the structure of a first planarization layer in an array substrate depicted in FIG. 16A. FIG. 16H is a diagram illustrating the structure of a second signal line layer in an array substrate depicted in FIG. 16A. FIG. 17 is a cross-sectional view along a C-C' line in FIG. 16A.

Referring to FIG. 16A to FIG. 16K, and FIG. 17, in some embodiments, the array substrate includes a base substrate BS, a semiconductor material layer SML on the base substrate BS, a gate insulating layer GI on a side of the semiconductor material layer SML away from the base substrate BS, a first conductive layer CT1 on a side of the gate insulating layer GI away from the semiconductor material layer SML, an insulating layer IN on a side of the first conductive layer CT1 away from the gate insulating layer GI, a second conductive layer CT2 on a side of the insulating layer IN away from the first conductive layer CT1, an inter-layer dielectric layer ILD on a side of the second conductive layer CT2 away from the insulating layer IN, a first signal line layer SL1 on a side of the inter-layer dielectric layer ILD away from the second conductive layer CT2, a first planarization layer PLN1 on a side of the first signal line layer SL1 away from the inter-layer dielectric layer ILD, a second signal line layer SL2 on a side of the first planarization layer PLN1 away from the first signal line layer SL1, a second planarization layer PLN2 on a side of the second signal line layer SL2 away from the first planarization layer PLN1, an anode layer ADL on a side of the second planarization layer PLN2 away from the second signal line layer SL2, and a pixel definition layer PDL on a side of the anode layer ADL away from the base substrate BS.

As compared to the array substrate depicted in FIG. 4A to FIG. 4M, and FIG. 5, the array substrate depicted in FIG. 16A to FIG. 16K, and FIG. 17 does not have a third conductive layer CT3. The first signal line layer in the array substrate depicted in FIG. 16A to FIG. 16K, and FIG. 17 further includes a fourth capacitor electrode Ce4. The array substrate depicted in FIG. 16A to FIG. 16K, and FIG. 17 does not include a plurality of first voltage supply line first branches (Vdd1 in the array substrate depicted in FIG. 4A to FIG. 4M, and FIG. 5).

As compared to the array substrate depicted in FIG. 13A to FIG. 13K, and FIG. 14, the array substrate depicted in FIG. 16A to FIG. 16K, and FIG. 17 further includes a plurality of first voltage supply line third branches Vdd3. Optionally, the plurality of first voltage supply line third branches Vdd3 are in the semiconductor material layer SML. Optionally, the plurality of first voltage supply line third branches Vdd3 extend along a direction substantially parallel to the first direction DR1. In one example as depicted in FIG. 16B, a respective first voltage supply line third branch of the plurality of first voltage supply line third branches Vdd3 is between a respective first reference signal line first branch of the plurality of first reference signal line first branches Vref1-1 and active layers of third transistors of pixel driving circuits in a same row.

In some embodiments, the array substrate further includes a sixteenth via v16 and a seventeenth via v17. The sixteenth via v16 extends through the inter-layer dielectric layer ILD. The seventeenth via v17 extends through the inter-layer dielectric layer ILD, the insulating layer IN, and the gate insulating layer GI. Optionally, the second node connecting line Cln2 is connected to the electrode block comprising the second capacitor electrode Ce2 and the third capacitor electrode Ce3 through the sixteenth via v16, and is connected to the semiconductor material layer SML through the seventeenth via v17. Optionally, the second node connecting line Cln2 is connected to the second electrode D7 of the seventh transistor and/or the second electrode D1 of the first transistor, as depicted in FIG. 17. In one example, the second node connecting line Cln2 corresponds to the second node N2.

In some embodiments, the array substrate further includes an eighteenth via v18 and a nineteenth via v19. The eighteenth via v18 extends through the inter-layer dielectric layer ILD and the insulating layer IN. The nineteenth via v19 extends through the inter-layer dielectric layer ILD, the insulating layer IN, and the gate insulating layer GI. Optionally, the first node connecting line Cln1 is connected to the first capacitor electrode Ce1 through the eighteenth via v18, and is connected to the semiconductor material layer SML through the nineteenth via v19. Optionally, the first node connecting line Cln1 is connected to the second electrode D2 of the second transistor and/or the second electrode D4 of the fourth transistor, as depicted in FIG. 17. In one example, the first node connecting line Cln1 corresponds to the first node N1.

In some embodiments, the array substrate includes a stacked structure of capacitor electrodes. In some embodiments, the stacked structure includes a respective first voltage supply line third branch of the plurality of first voltage supply line third branches Vdd3, the gate insulating layer GI, the first capacitor electrode Ce1, the insulating layer IN, the electrode block comprising the second capacitor electrode Ce2 and the third capacitor electrode Ce3, the inter-layer dielectric layer ILD, and the fourth capacitor electrode Ce4. The first capacitor electrode Ce1, the insulating layer IN, and the electrode block comprising the second capacitor electrode Ce2 and the third capacitor electrode Ce3 form the first capacitor. The electrode block comprising the second capacitor electrode Ce2 and the third capacitor electrode Ce3, the inter-layer dielectric layer ILD, and the fourth capacitor electrode Ce4 form a first part of the second capacitor (denoted as C2-1 in FIG. 17). The electrode block comprising the second capacitor electrode Ce2 and the third capacitor electrode Ce3, the insulating layer IN, the gate insulating layer GI, a portion of the respective first voltage supply line third branch of the plurality of first voltage supply line third branches Vdd3 form a second part of the second capacitor (denoted as C2-2 in FIG. 17).

In some embodiments, the respective first voltage supply line third branch of the plurality of first voltage supply line third branches Vdd3 is in the semiconductor material layer SML; the first capacitor electrode Ce1 is in the first conductive layer CT1 on a side of the gate insulating layer GI away from the semiconductor material layer SML; the electrode block comprising the second capacitor electrode Ce2 and the third capacitor electrode Ce3 is in the second conductive layer CT2 on a side of the insulating layer IN away from the first conductive layer CT1; and the fourth capacitor electrode Ce4 is in the first signal line layer SL1 on a side of the inter-layer dielectric layer ILD away from the second conductive layer CT2.

Figure 18:
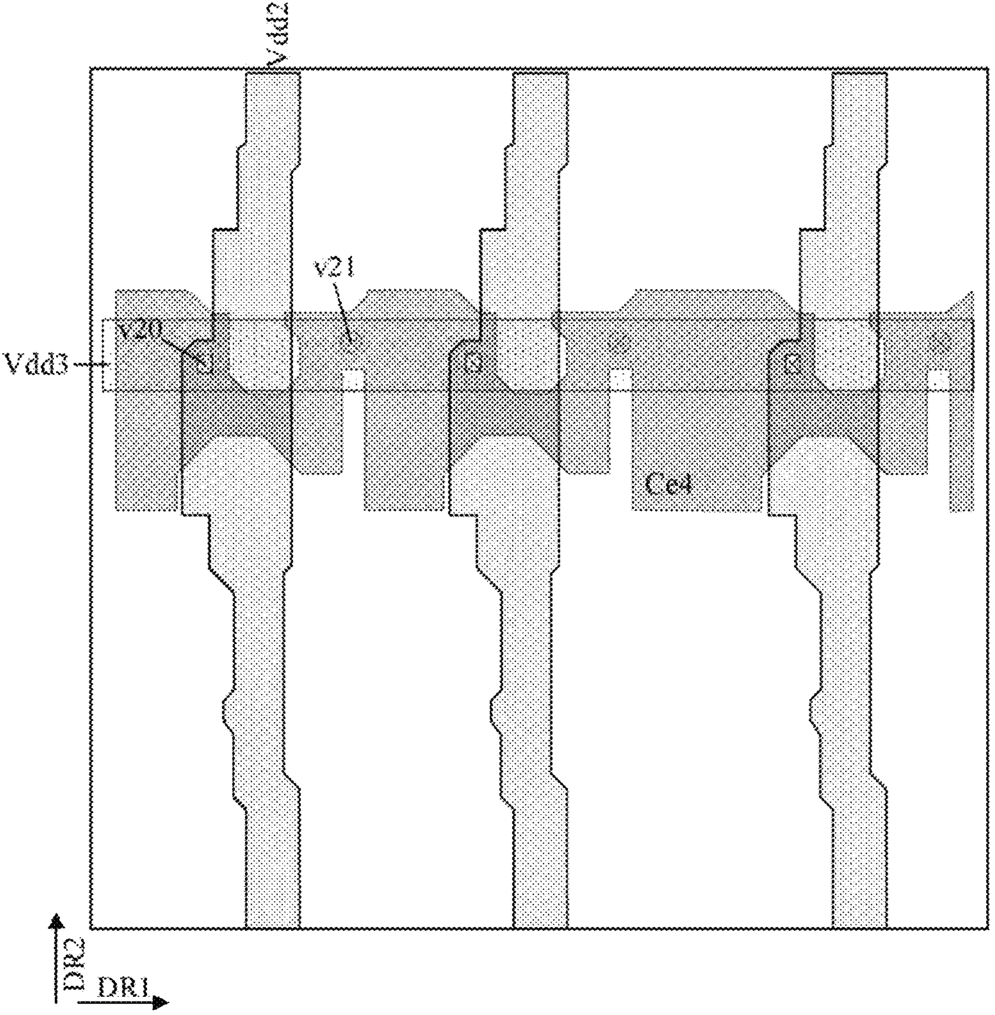
FIG. 18 is a schematic diagram illustrating the structure of an interconnected first voltage supply network in some embodiments according to the present disclosure.

FIG. 18 is a schematic diagram illustrating the structure of an interconnected first voltage supply network in some embodiments according to the present disclosure. Referring to FIG. 18, the interconnected first voltage supply network in some embodiments includes a plurality of first voltage supply line third branches Vdd3, a plurality of first voltage supply line second branches Vdd2, and a unitary structure comprising multiple fourth capacitor electrodes in a same row. Optionally, the plurality of first voltage supply line third branches Vdd3 extend along a direction substantially parallel to the first direction DR1. Optionally, the plurality of first voltage supply line second branches Vdd2 extend along a direction substantially parallel to the second direction DR2. Optionally, the unitary structure comprising multiple fourth capacitor electrodes in a same row extends along a direction substantially parallel to the first direction DR1.

Referring to FIG. 18, a first voltage supply line second branch of the plurality of first voltage supply line second branches Vdd2 is connected to a fourth capacitor electrode Ce4 through a twentieth via v20. A fourth capacitor electrode Ce4 is connected to a respective first voltage supply line third branch of the plurality of first voltage supply line third branches Vdd3 through a twenty first v21.

Figure 19A:
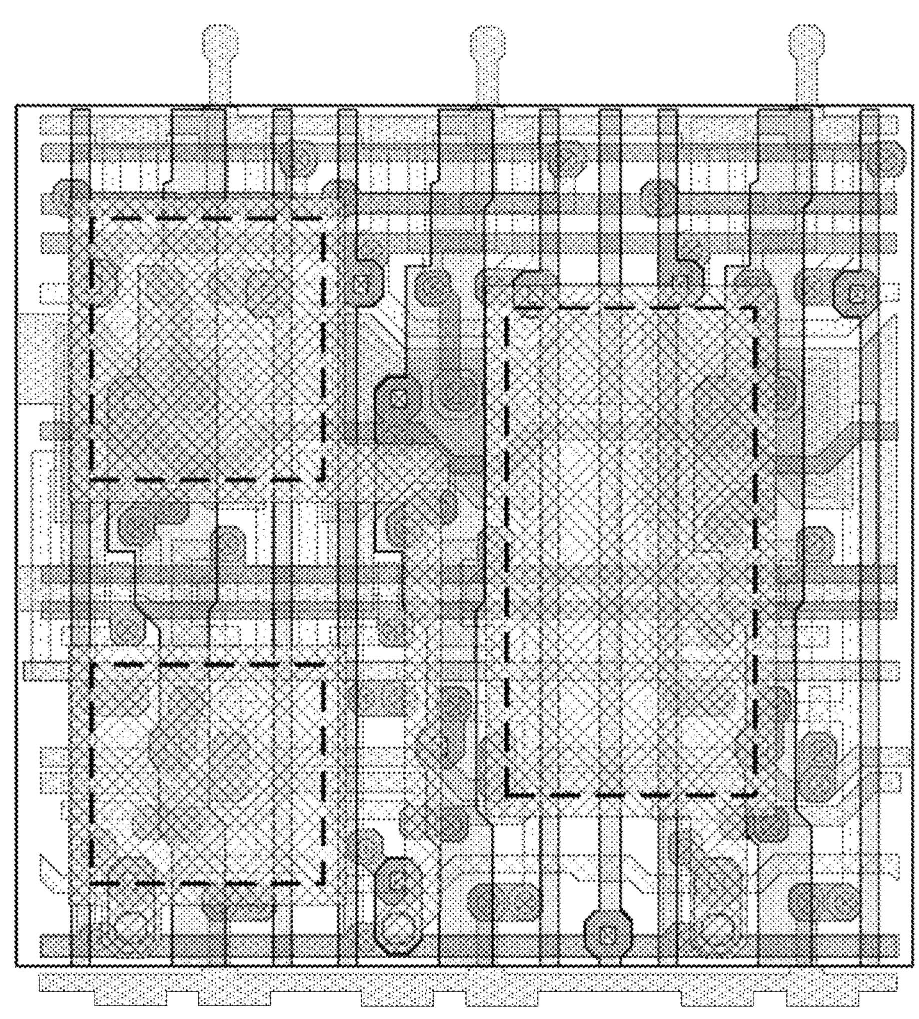
FIG. 19A is a diagram illustrating the structure of an array substrate in some embodiments according to the present disclosure.
Figure 19B:
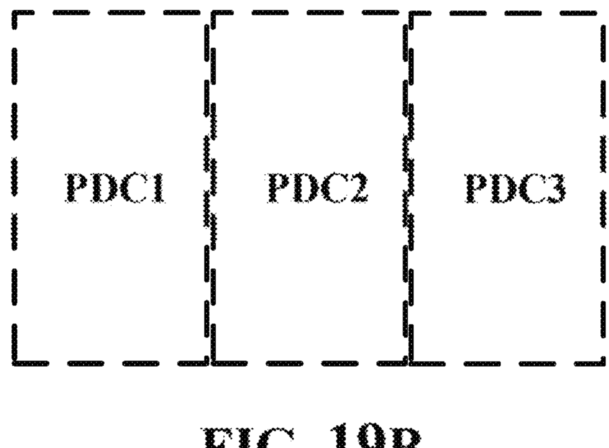
FIG. 19B is a schematic diagram illustrating an arrangement of a plurality of pixel driving circuits in an array substrate depicted in FIG. 19A.
Figure 19C:
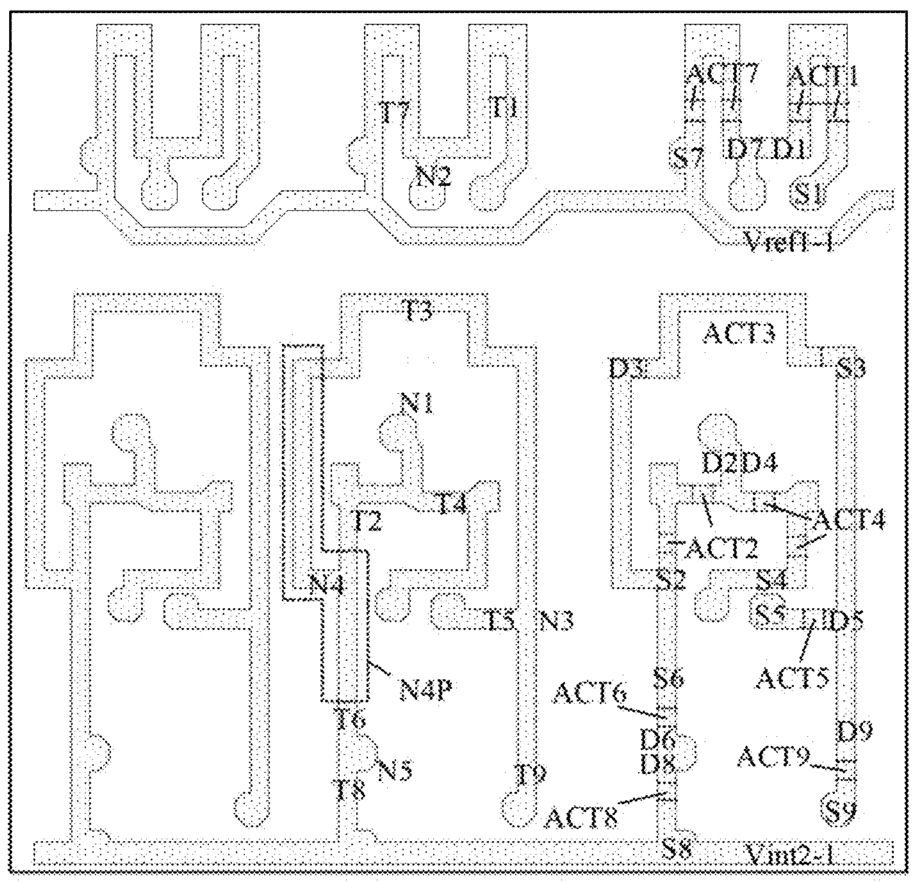
FIG. 19C is a diagram illustrating the structure of a semiconductor material layer in an array substrate depicted in FIG. 19A.
Figure 19D:
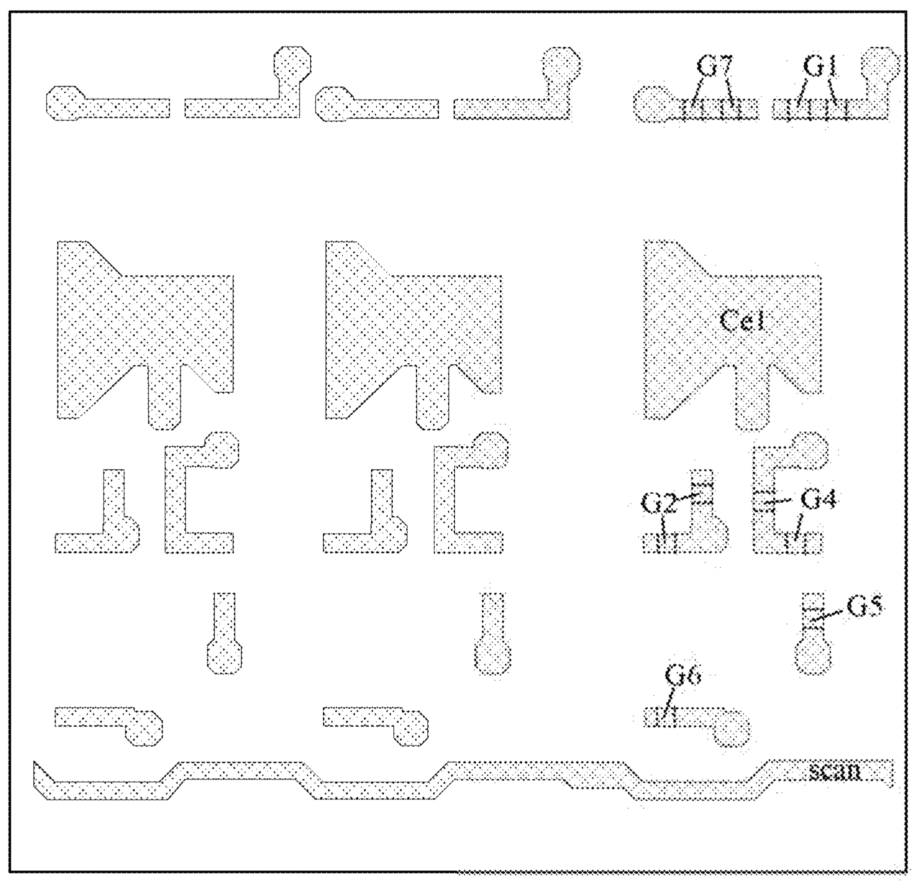
FIG. 19D is a diagram illustrating the structure of a first conductive layer in an array substrate depicted in FIG. 19A.
Figure 19E:
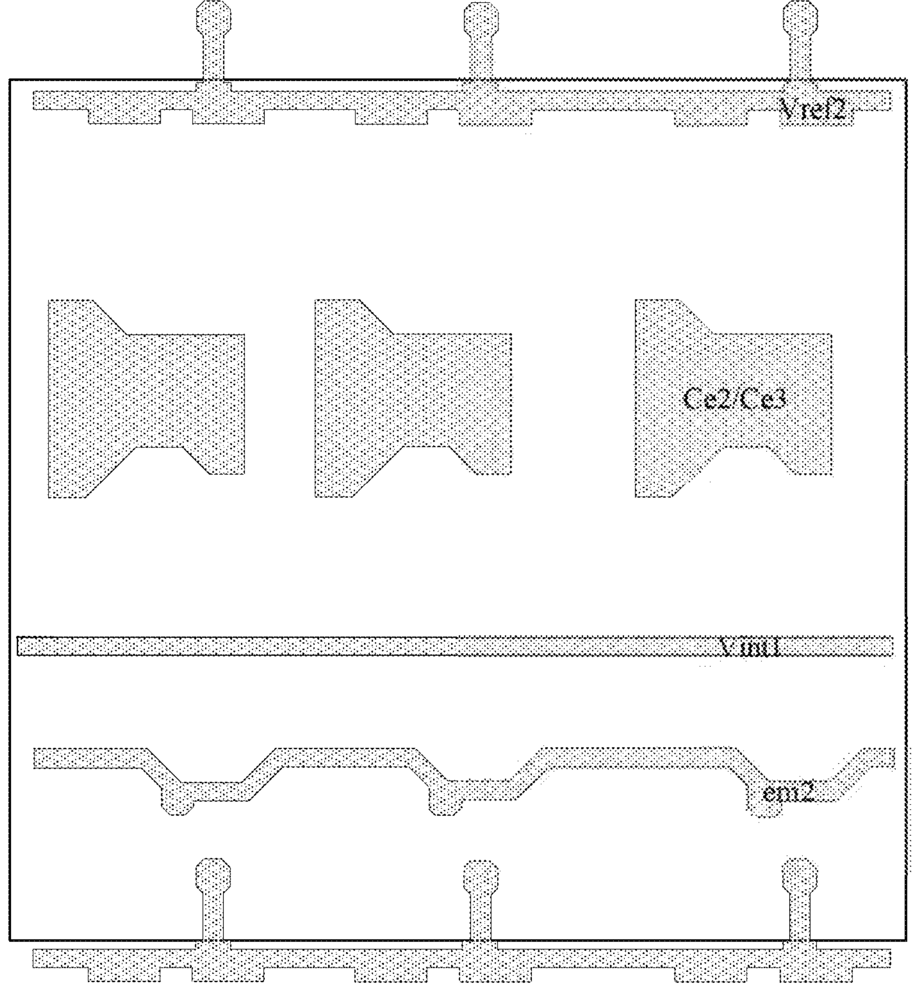
FIG. 19E is a diagram illustrating the structure of a second conductive layer in an array substrate depicted in FIG. 19A.
Figure 19F:
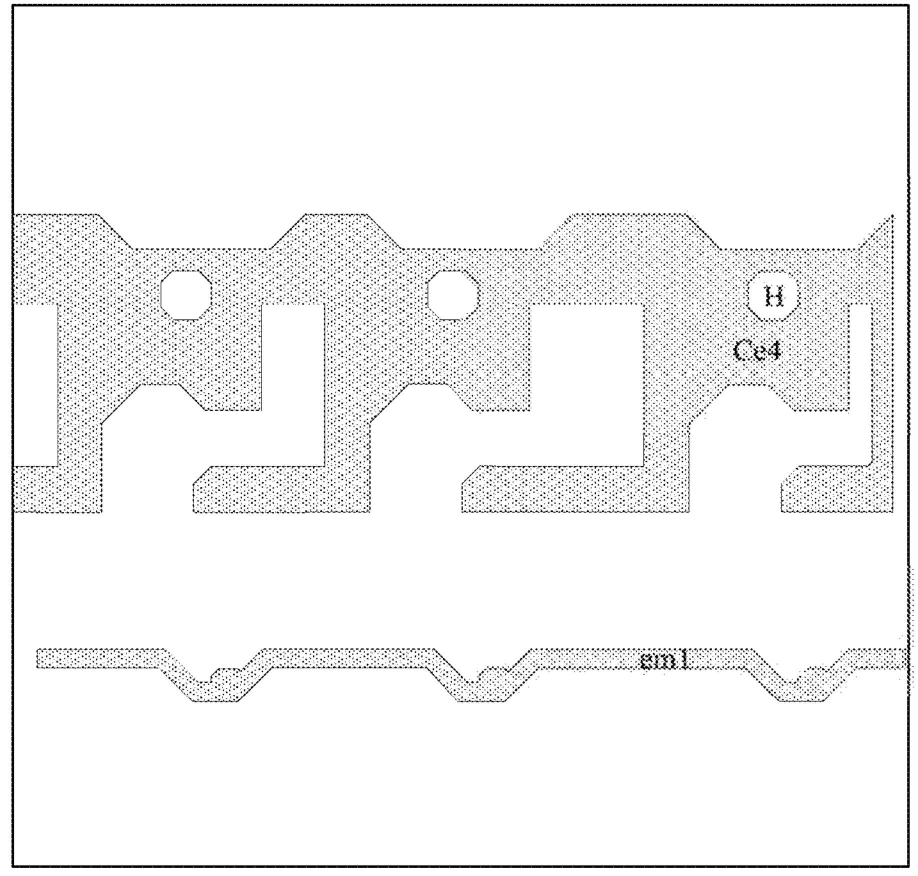
FIG. 19F is a diagram illustrating the structure of a third conductive layer in an array substrate depicted in FIG. 19A.
Figure 19G:
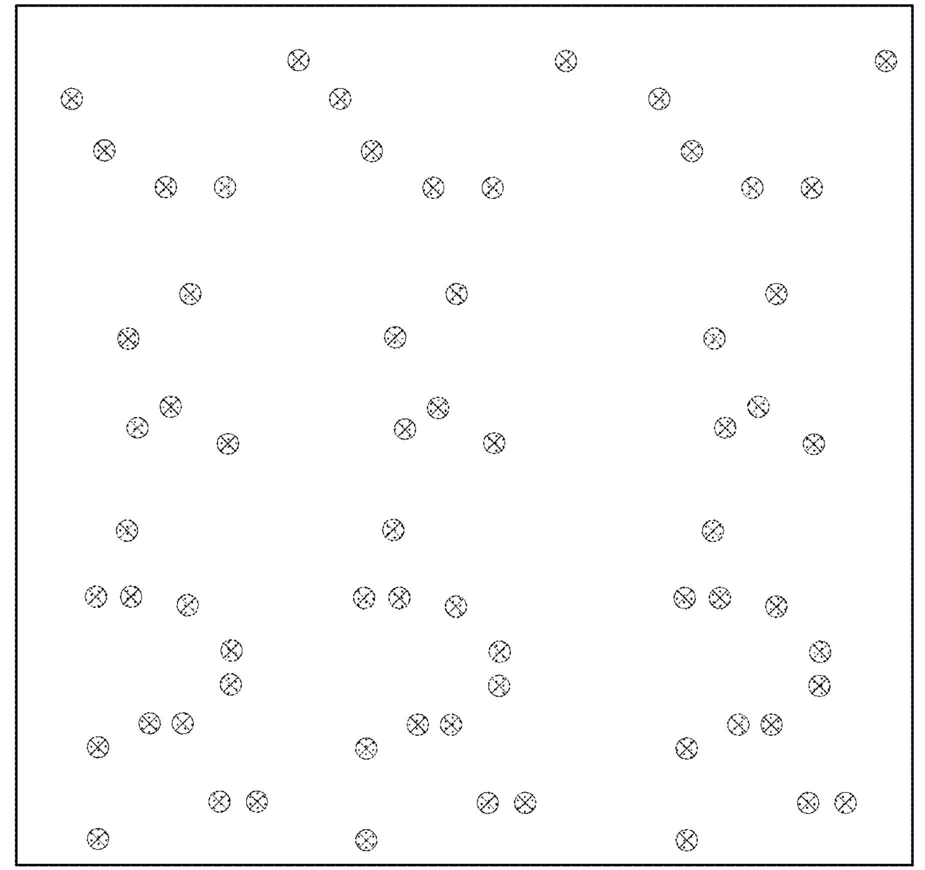
FIG. 19G is a diagram illustrating the structure of a first planarization layer in an array substrate depicted in FIG. 19A.
Figure 19H:
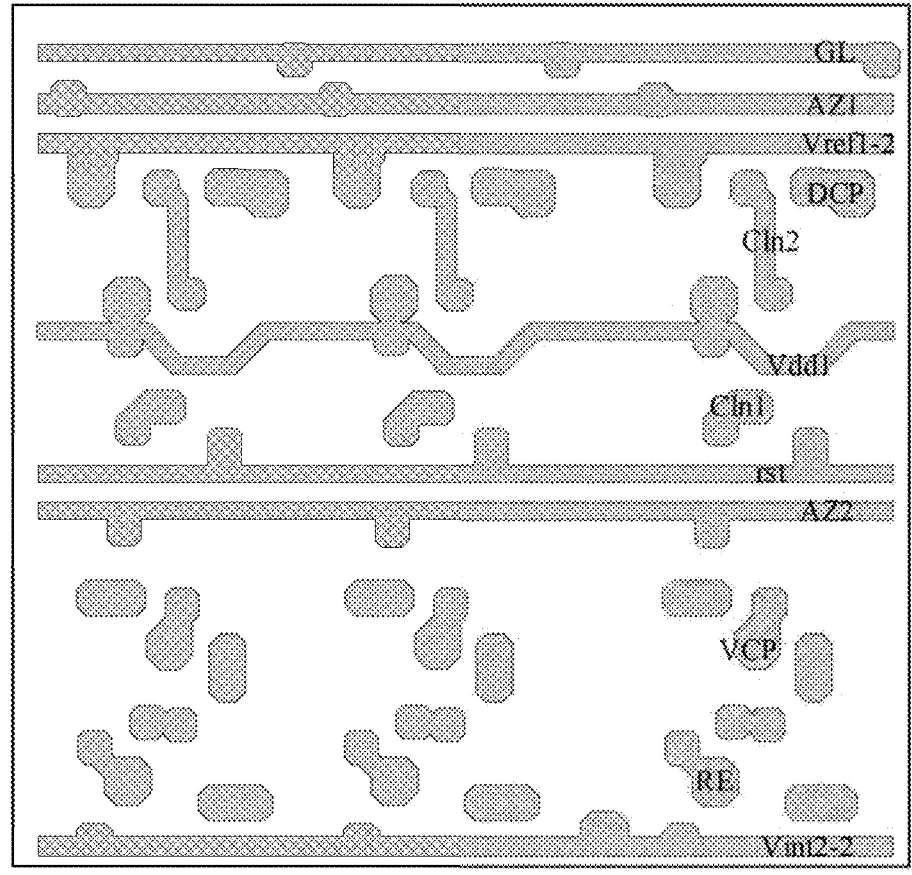
FIG. 19H is a diagram illustrating the structure of a first signal line layer in an array substrate depicted in FIG. 19A.
Figure 19I:
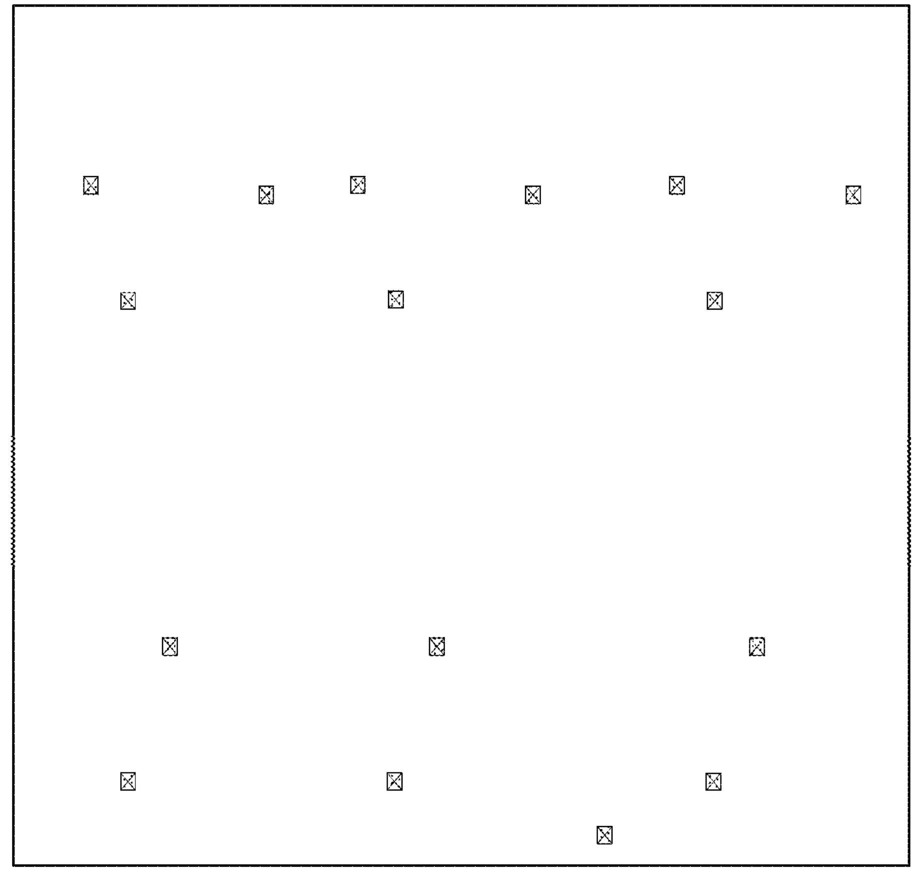
FIG. 19I is a diagram illustrating the structure of a second planarization layer in an array substrate depicted in FIG. 19A.
Figure 19J:
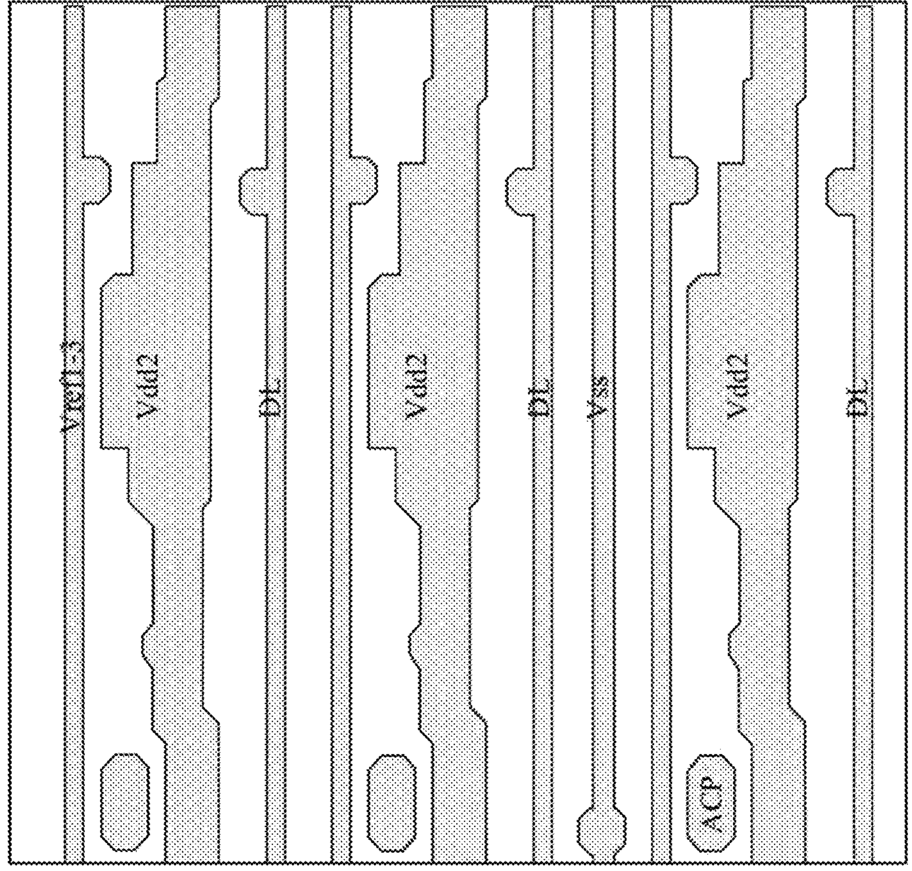
FIG. 19J is a diagram illustrating the structure of a second signal line layer in an array substrate depicted in FIG. 19A.
Figure 19K:
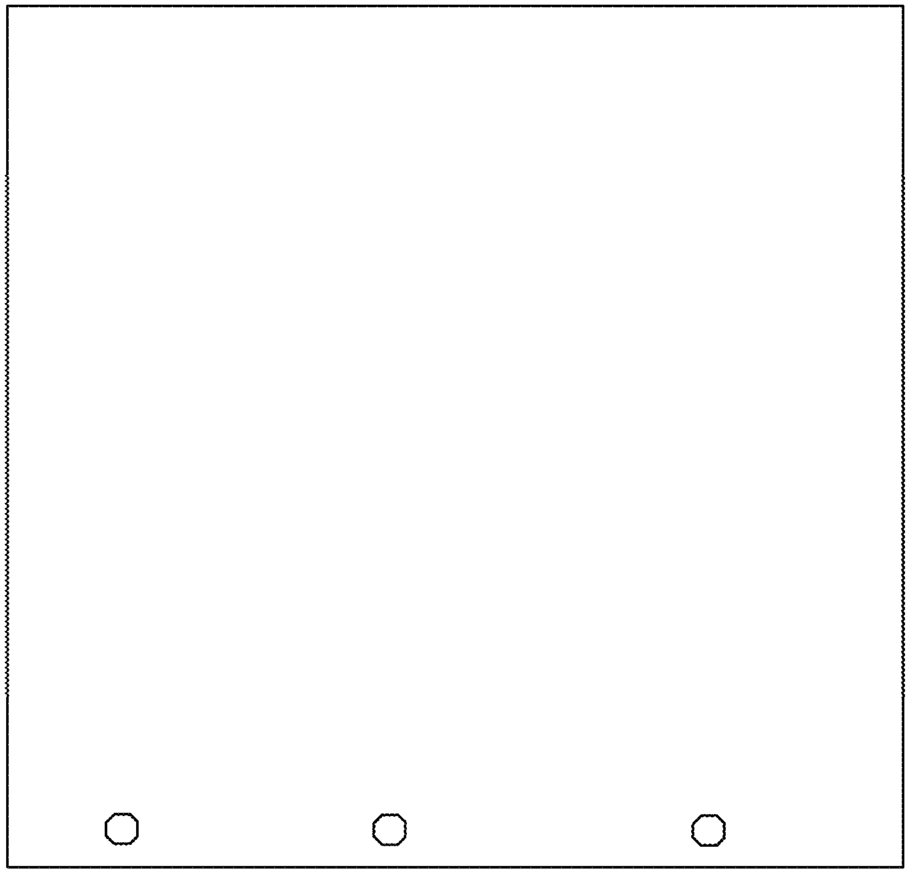
FIG. 19K is a diagram illustrating the structure of a third planarization layer in an array substrate depicted in FIG. 19A.
Figure 19L:
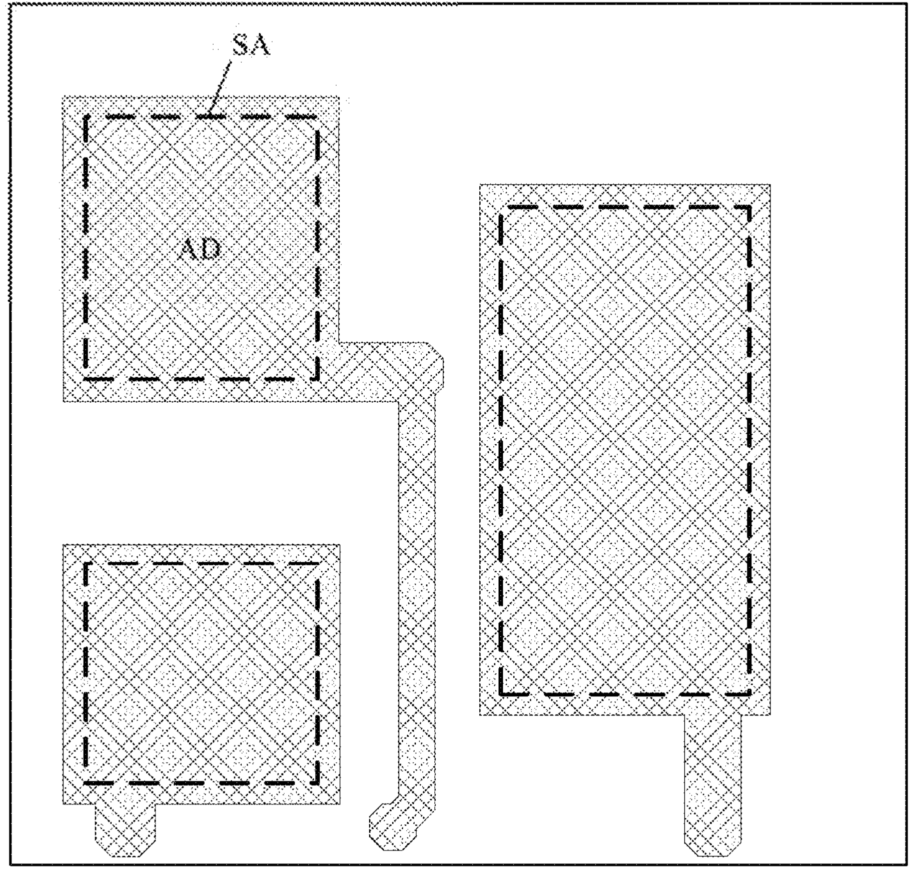
FIG. 19L is a diagram illustrating the structure of an anode layer in an array substrate depicted in FIG. 19A.
Figure 19M:
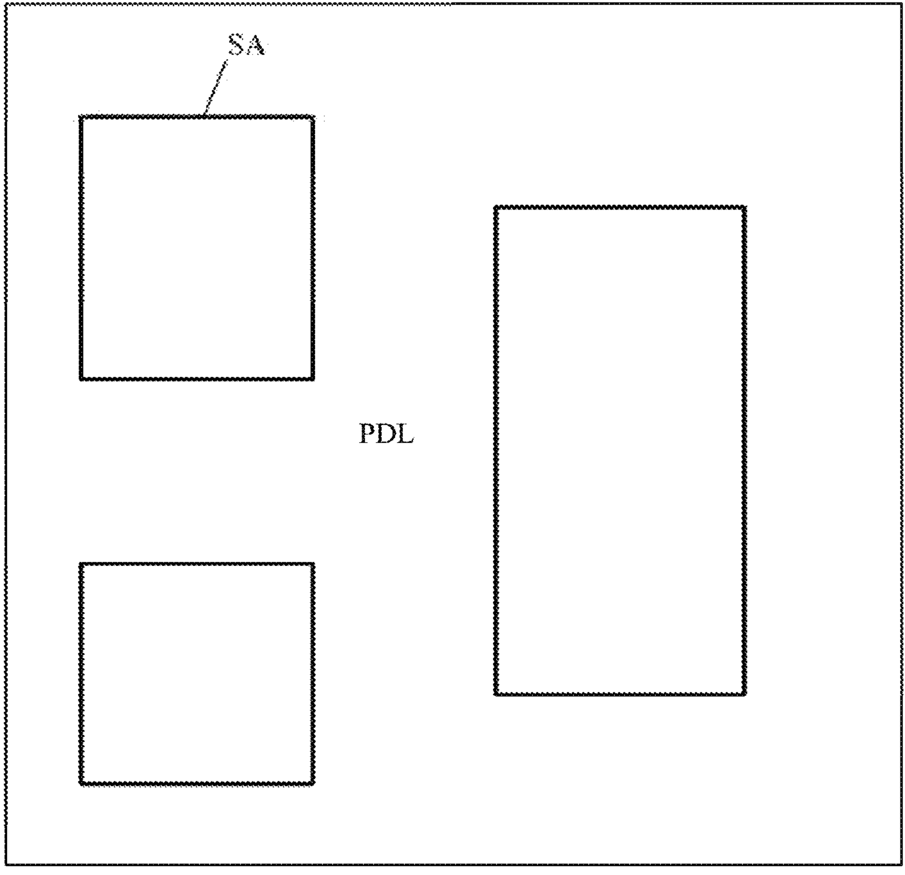
FIG. 19M is a diagram illustrating the structure of a pixel definition layer in an array substrate depicted in FIG. 19A.
Figure 20:
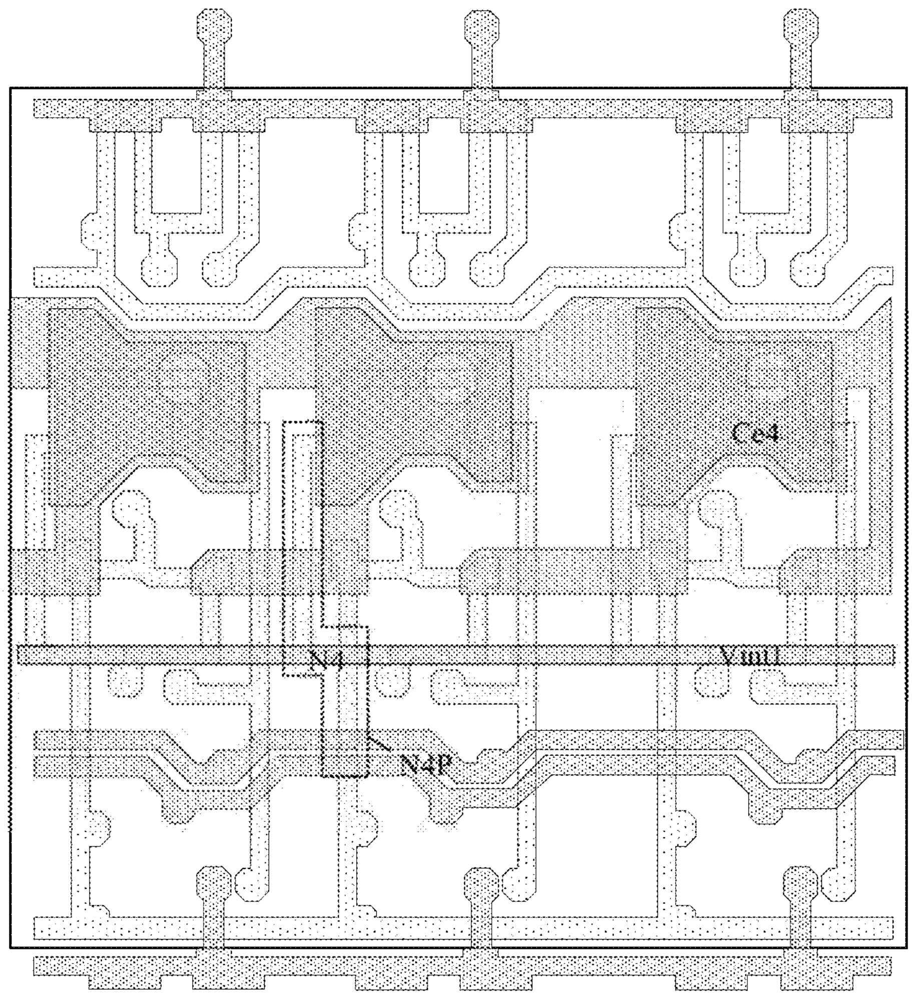
FIG. 20 is a diagram illustrating the structure of a semiconductor material layer, a second conductive layer, and a third conductive layer in an array substrate depicted in FIG. 19A.

FIG. 19A is a diagram illustrating the structure of an array substrate in some embodiments according to the present disclosure. FIG. 19B is a schematic diagram illustrating an arrangement of a plurality of pixel driving circuits in an array substrate depicted in FIG. 19A. FIG. 19C is a diagram illustrating the structure of a semiconductor material layer in an array substrate depicted in FIG. 19A. FIG. 19D is a diagram illustrating the structure of a first conductive layer in an array substrate depicted in FIG. 19A. FIG. 19E is a diagram illustrating the structure of a second conductive layer in an array substrate depicted in FIG. 19A. FIG. 19F is a diagram illustrating the structure of a third conductive layer in an array substrate depicted in FIG. 19A. FIG. 19G is a diagram illustrating the structure of a first planarization layer in an array substrate depicted in FIG. 19A. FIG. 19H is a diagram illustrating the structure of a first signal line layer in an array substrate depicted in FIG. 19A. FIG. 19I is a diagram illustrating the structure of a second planarization layer in an array substrate depicted in FIG. 19A. FIG. 19J is a diagram illustrating the structure of a second signal line layer in an array substrate depicted in FIG. 19A. FIG. 19K is a diagram illustrating the structure of a third planarization layer in an array substrate depicted in FIG. 19A. FIG. 19L is a diagram illustrating the structure of an anode layer in an array substrate depicted in FIG. 19A. FIG. 19M is a diagram illustrating the structure of a pixel definition layer in an array substrate depicted in FIG. 19A. FIG. 20 is a diagram illustrating the structure of a semiconductor material layer, a second conductive layer, and a third conductive layer in an array substrate depicted in FIG. 19A.

The array substrate depicted in FIG. 19A to FIG. 19M, and FIG. 20 differs from the array substrate depicted in FIG. 3A to FIG. 3M in that, in the array substrate depicted in FIG. 19A to FIG. 19M, and FIG. 20, an orthographic projection of the fourth capacitor electrode Ce4 on the base substrate overlaps with no more than 50% (e.g., no more than 45%, no more than 40%, no more than 35%, no more than 30%, no more than 25%, no more than 20%, no more than 15%, no more than 10%, or no more than 5%) an orthographic projection of a combination of a second electrode D3 of the third transistor T3 and a first electrode S2 of the second transistor T2 on the base substrate; whereas, in the array substrate depicted in FIG. 3A to FIG. 3M, an orthographic projection of the fourth capacitor electrode Ce4 on the base substrate overlaps with at least 50% (e.g., at least 55%, at least 60%, at least 65%, at least 70%, at least 75%, at least 80%, at least 85%, at least 90%, or at least 95%) an orthographic projection of a second electrode D3 of the third transistor T3 on the base substrate.

The array substrate depicted in FIG. 19A to FIG. 19M, and FIG. 20 further differs from the array substrate depicted in FIG. 3A to FIG. 3M in that, in the array substrate depicted in FIG. 19A to FIG. 19M, and FIG. 20, the respective first reset signal line of the plurality of first reset signal lines Vint1 does not include the first protrusion PR1 and the second protrusion PR2; whereas, in the array substrate depicted in FIG. 3A to FIG. 3M, the respective first reset signal line of the plurality of first reset signal lines Vint1 includes a main body MB, a first protrusion PR1 extending away from the main body MB, and a second protrusion PR2 extending away from the main body MB. Optionally, the respective first reset signal line in the array substrate depicted in FIG. 19A to FIG. 19M, and FIG. 20 has a substantially uniform line width.

The inventors of the present disclosure discover that by having the structure depicted in FIG. 19A to FIG. 19M, and FIG. 20, the parasitic capacitance between the node N4 and the fourth capacitor electrode Ce4, and between the node N4 and the respective first reset signal line, can be decreased. A reduced parasitic capacitance at the node N4 is conducive to achieving an enhanced display uniformity, particularly at a relatively high refresh rate.

Figure 21A:
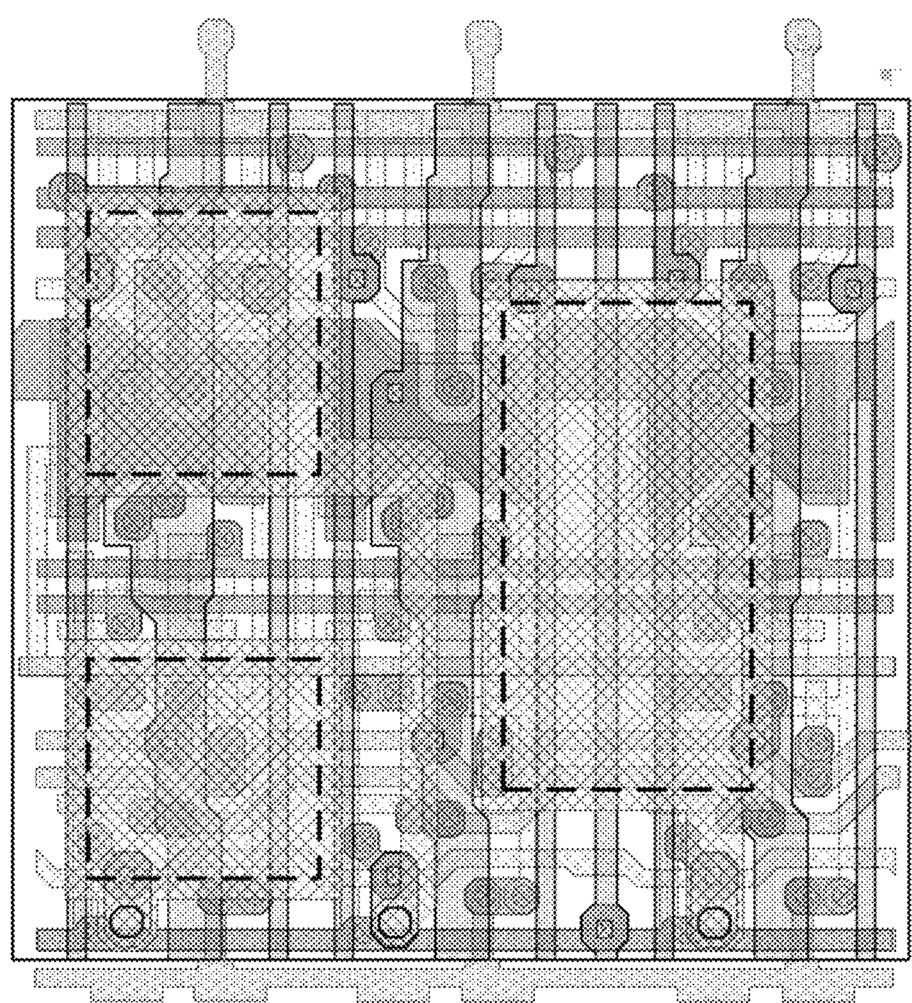
FIG. 21A is a diagram illustrating the structure of an array substrate in some embodiments according to the present disclosure.
Figure 21B:
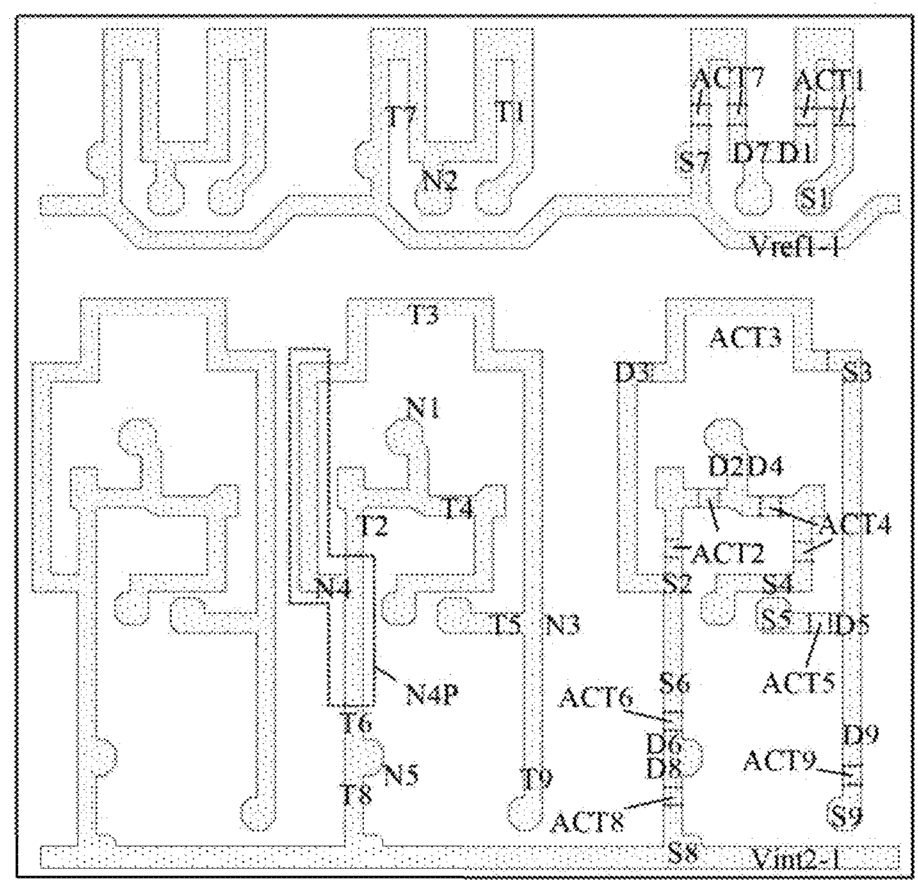
FIG. 21B is a diagram illustrating the structure of a semiconductor material layer in an array substrate depicted in FIG. 21A.
Figure 21C:
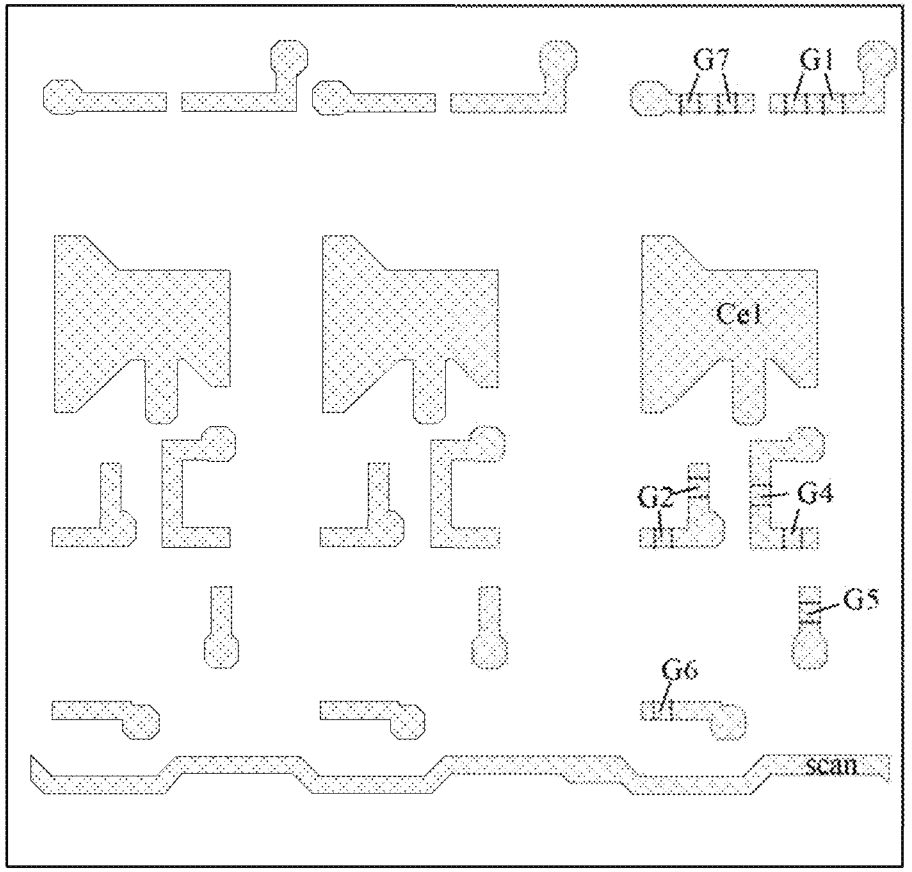
FIG. 21C is a diagram illustrating the structure of a first conductive layer in an array substrate depicted in FIG. 21A.
Figure 21D:
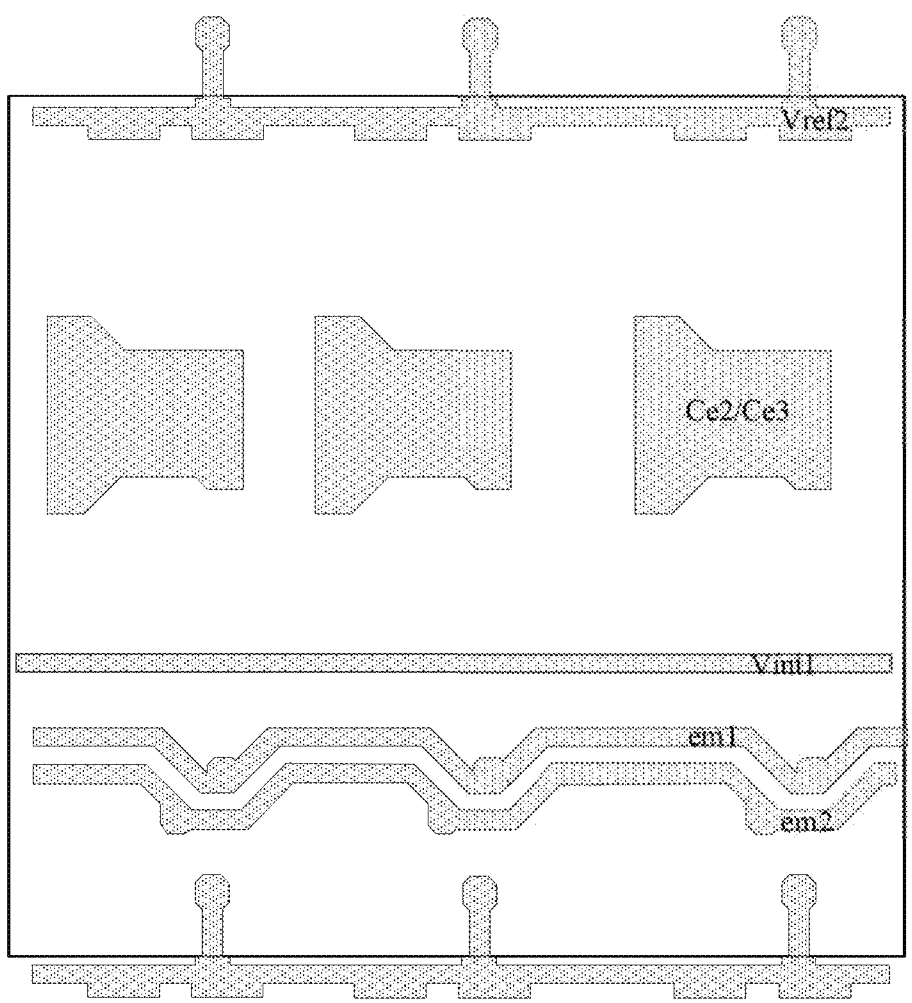
FIG. 21D is a diagram illustrating the structure of a second conductive layer in an array substrate depicted in FIG. 21A.
Figure 21E:
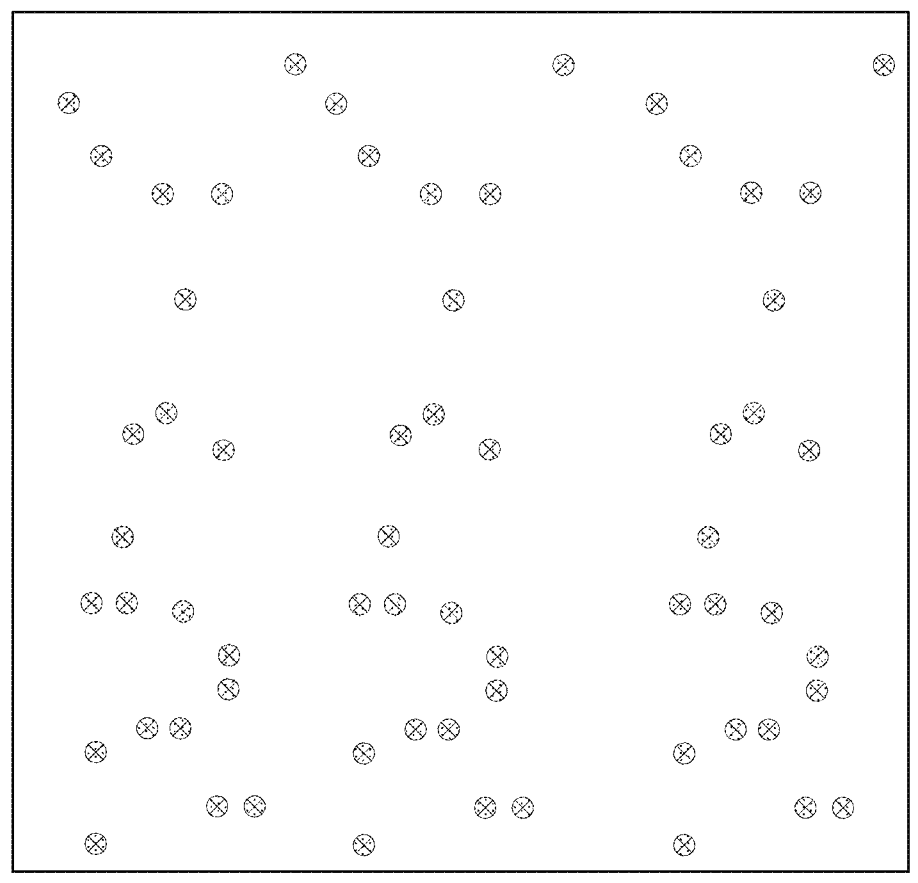
FIG. 21E is a diagram illustrating the structure of an inter-layer dielectric layer in an array substrate depicted in FIG. 21A.
Figure 21F:
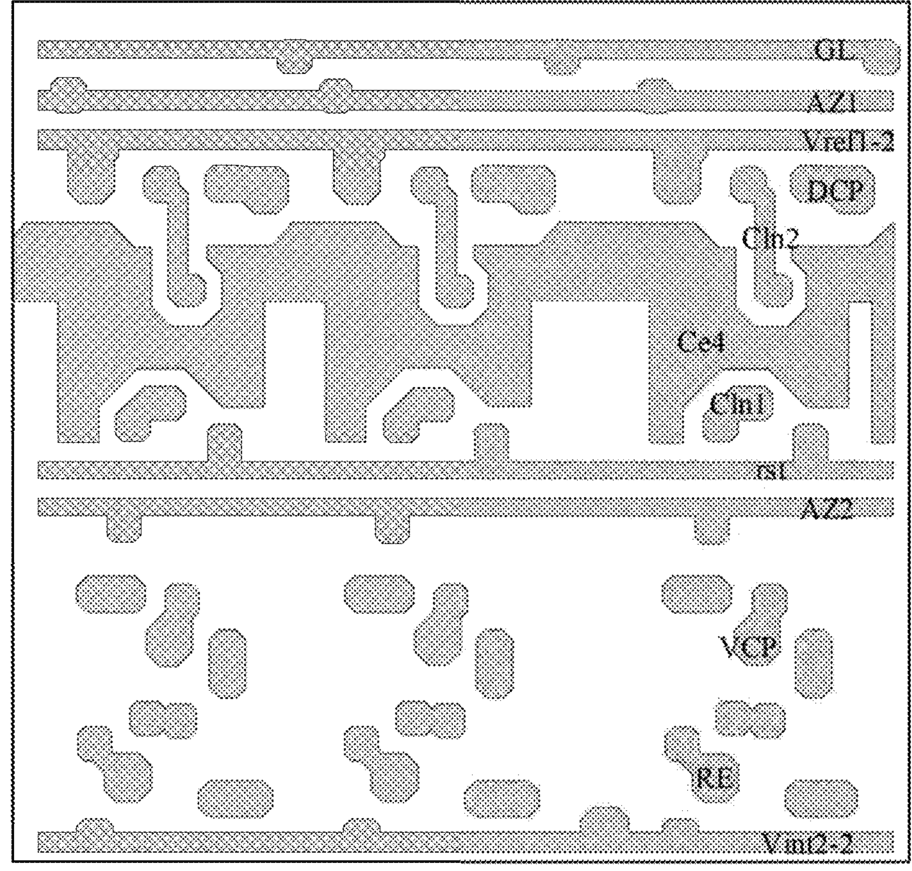
FIG. 21F is a diagram illustrating the structure of a first signal line layer in an array substrate depicted in FIG. 21A.
Figure 21G:
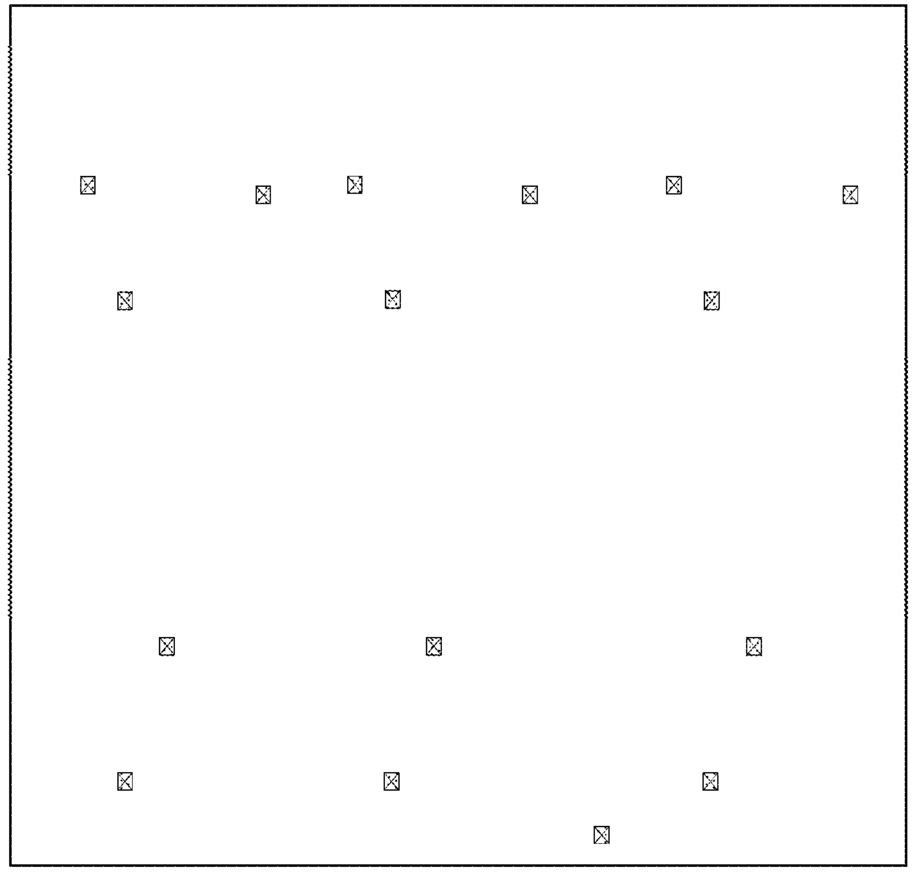
FIG. 21G is a diagram illustrating the structure of a first planarization layer in an array substrate depicted in FIG. 21A.
Figure 21H:
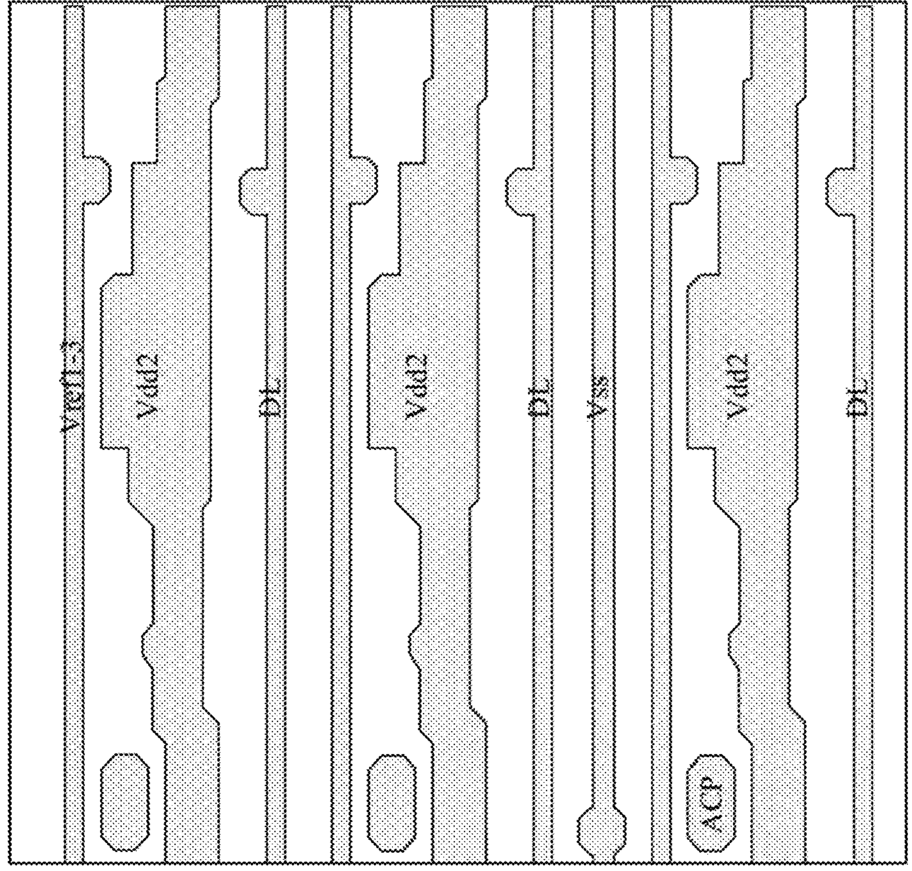
FIG. 21H is a diagram illustrating the structure of a second signal line layer in an array substrate depicted in FIG. 21A.
Figure 21I:
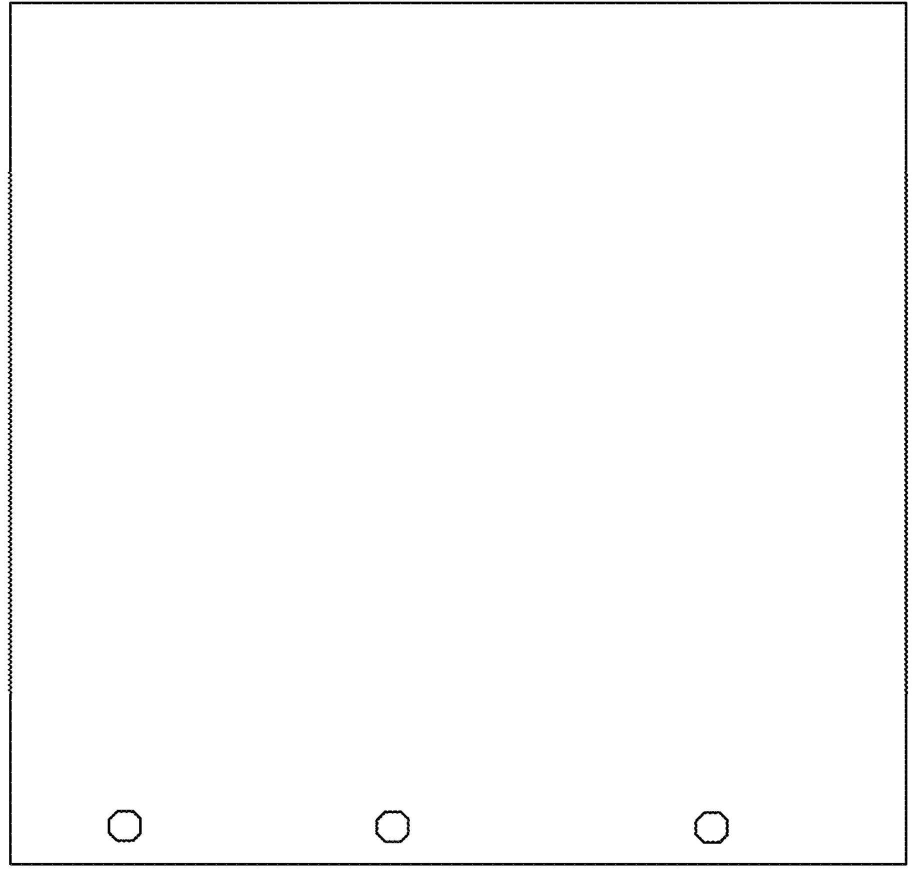
FIG. 21I is a diagram illustrating the structure of a second planarization layer in an array substrate depicted in FIG. 21A.
Figure 21J:
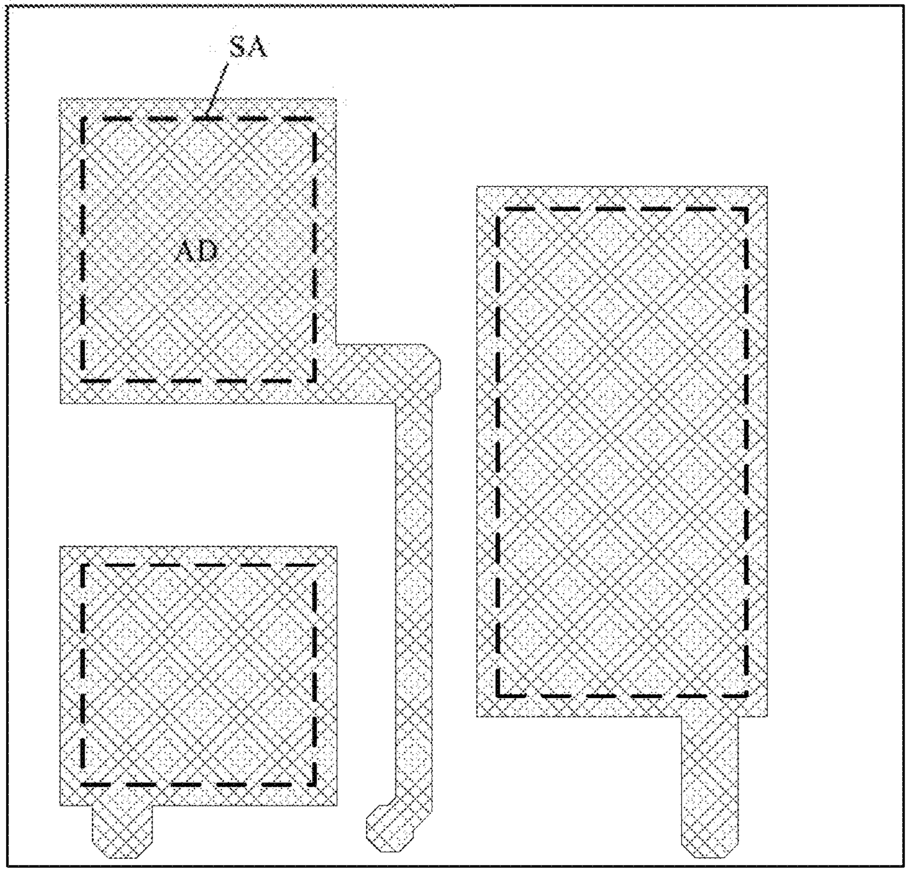
FIG. 21J is a diagram illustrating the structure of an anode layer in an array substrate depicted in FIG. 21A.
Figure 21K:
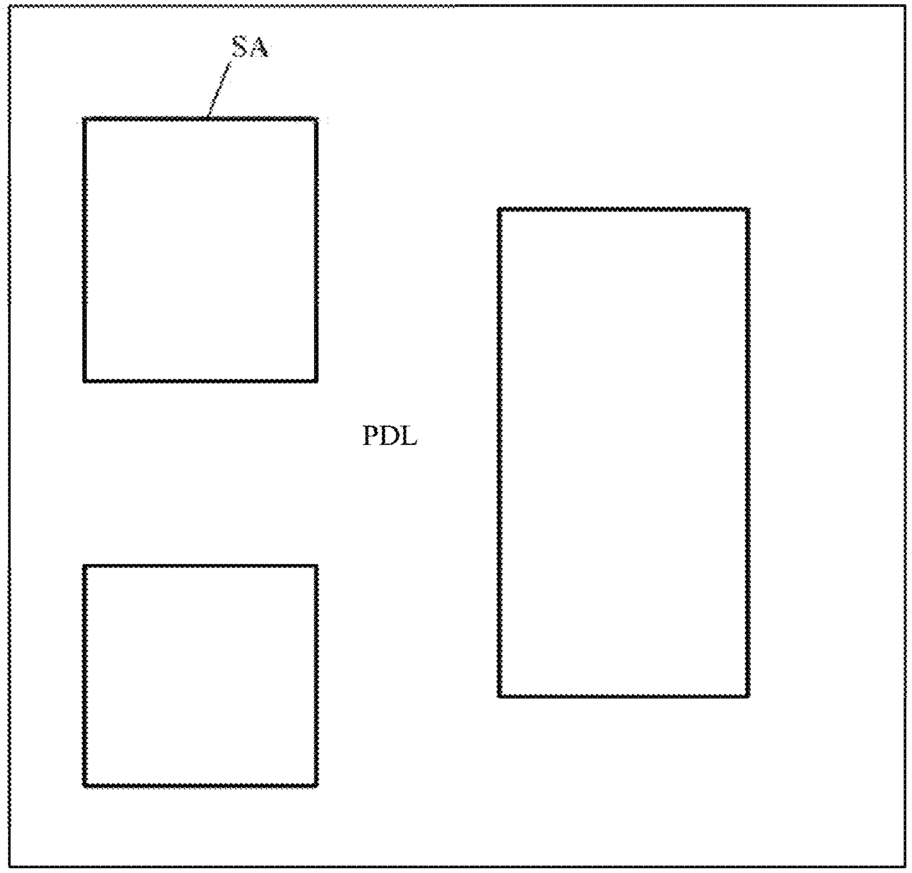
FIG. 21K is a diagram illustrating the structure of a pixel definition layer in an array substrate depicted in FIG. 21A.
Figure 22:
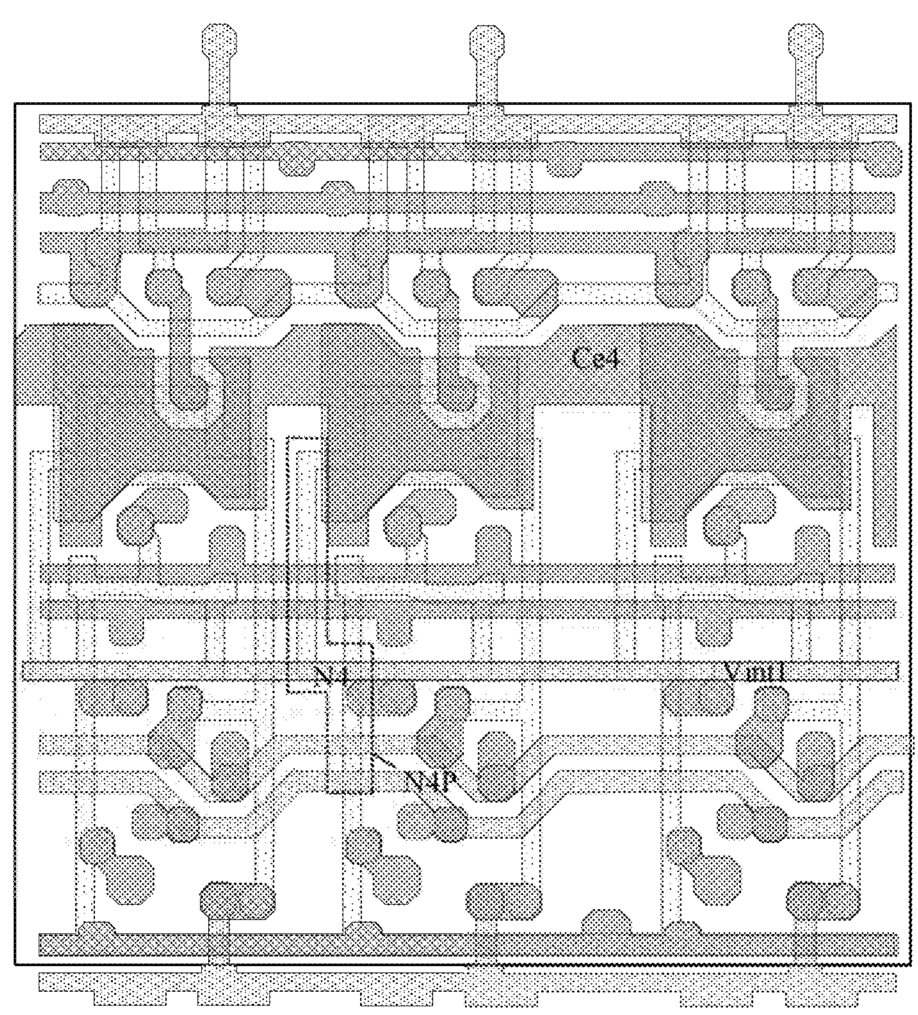
FIG. 22 is a diagram illustrating the structure of a semiconductor material layer, a second conductive layer, and a first signal line layer in an array substrate depicted in FIG. 21A.

FIG. 21A is a diagram illustrating the structure of an array substrate in some embodiments according to the present disclosure. FIG. 21B is a diagram illustrating the structure of a semiconductor material layer in an array substrate depicted in FIG. 21A. FIG. 21C is a diagram illustrating the structure of a first conductive layer in an array substrate depicted in FIG. 21A. FIG. 21D is a diagram illustrating the structure of a second conductive layer in an array substrate depicted in FIG. 21A. FIG. 21E is a diagram illustrating the structure of an inter-layer dielectric layer in an array substrate depicted in FIG. 21A. FIG. 21F is a diagram illustrating the structure of a first signal line layer in an array substrate depicted in FIG. 21A. FIG. 21G is a diagram illustrating the structure of a first planarization layer in an array substrate depicted in FIG. 21A. FIG. 21H is a diagram illustrating the structure of a second signal line layer in an array substrate depicted in FIG. 21A. FIG. 21I is a diagram illustrating the structure of a second planarization layer in an array substrate depicted in FIG. 21A. FIG. 21J is a diagram illustrating the structure of an anode layer in an array substrate depicted in FIG. 21A. FIG. 21K is a diagram illustrating the structure of a pixel definition layer in an array substrate depicted in FIG. 21A. FIG. 22 is a diagram illustrating the structure of a semiconductor material layer, a second conductive layer, and a first signal line layer in an array substrate depicted in FIG. 21A.

The array substrate depicted in FIG. 21A to FIG. 21K, and FIG. 22 differs from the array substrate depicted in FIG. 13A to FIG. 13K in that, in the array substrate depicted in FIG. 21A to FIG. 21K, and FIG. 22, an orthographic projection of the fourth capacitor electrode Ce4 on the base substrate overlaps with no more than 50% (e.g., no more than 45%, no more than 40%, no more than 35%, no more than 30%, no more than 25%, no more than 20%, no more than 15%, no more than 10%, or no more than 5%) an orthographic projection of a combination of a second electrode D3 of the third transistor T3 and a first electrode S2 of the second transistor T2 on the base substrate; whereas, in the array substrate depicted in FIG. 13A to FIG. 13K, an orthographic projection of the fourth capacitor electrode Ce4 on the base substrate overlaps with at least 50% (e.g., at least 55%, at least 60%, at least 65%, at least 70%, at least 75%, at least 80%, at least 85%, at least 90%, or at least 95%) an orthographic projection of a second electrode D3 of the third transistor T3 on the base substrate.

The array substrate depicted in FIG. 21A to FIG. 21K, and FIG. 22 further differs from the array substrate depicted in FIG. 13A to FIG. 13K in that, in the array substrate depicted in FIG. 21A to FIG. 21K, and FIG. 22, the respective first reset signal line of the plurality of first reset signal lines Vint1 does not include the first protrusion PR1 and the second protrusion PR2; whereas, in the array substrate depicted in FIG. 13A to FIG. 13K, the respective first reset signal line of the plurality of first reset signal lines Vint1 includes a main body MB, a first protrusion PR1 extending away from the main body MB, and a second protrusion PR2 extending away from the main body MB. Optionally, the respective first reset signal line in the array substrate depicted in FIG. 21A to FIG. 21K, and FIG. 22 has a substantially uniform line width.

The inventors of the present disclosure discover that by having the structure depicted in FIG. 21A to FIG. 21K, and FIG. 22, the parasitic capacitance between the node N4 and the fourth capacitor electrode Ce4, and between the node N4 and the respective first reset signal line, can be decreased. A reduced parasitic capacitance at the node N4 is conducive to achieving an enhanced display uniformity, particularly at a relatively high refresh rate.

Figure 23A:
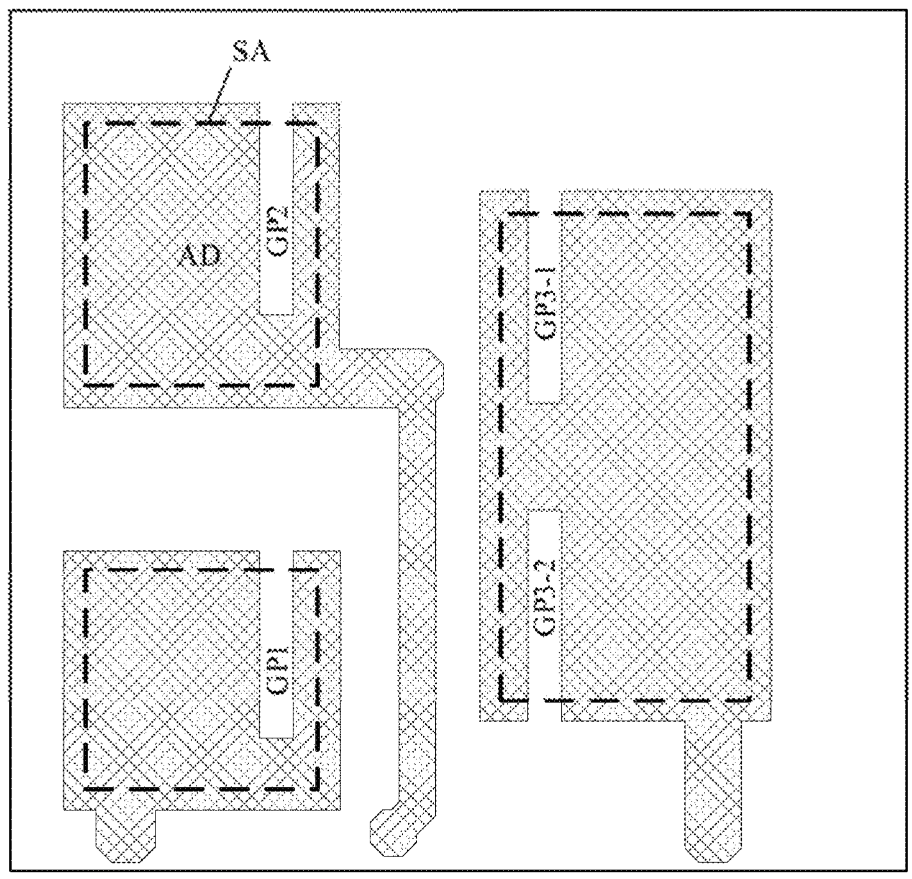
FIG. 23A is a diagram illustrating the structure of an anode layer in an array substrate in some embodiments according to the present disclosure.
Figure 23B:
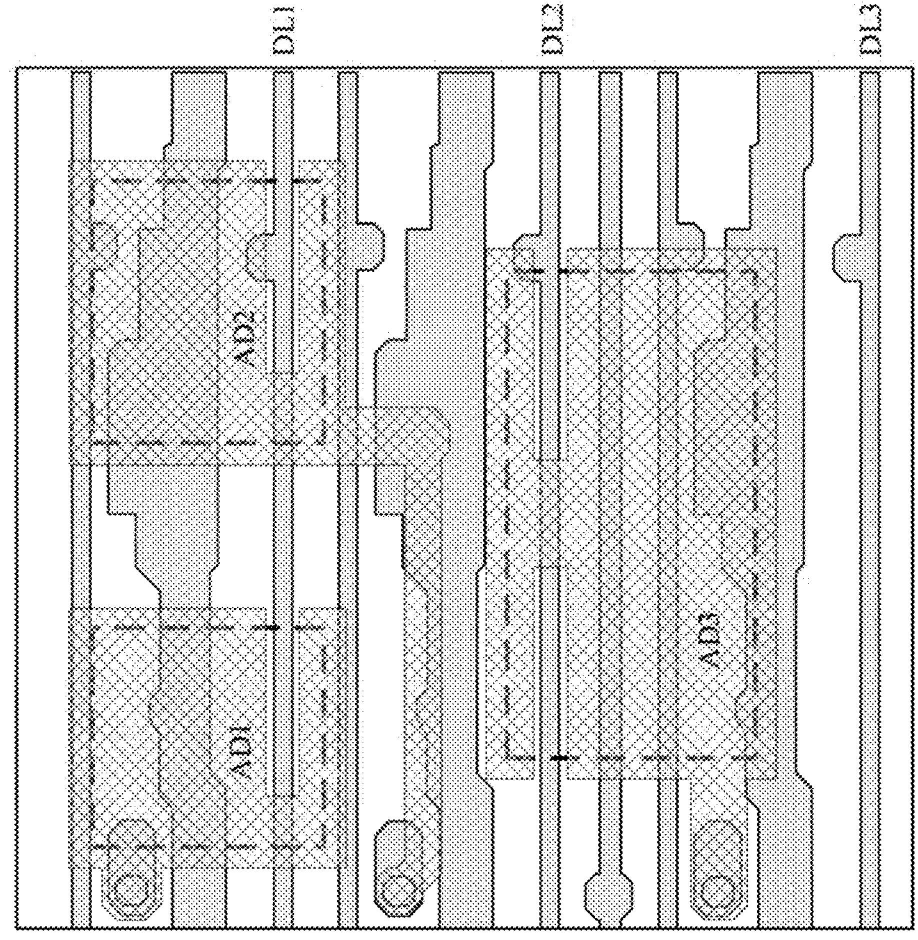
FIG. 23B is a diagram illustrating the structure of a second signal line layer and an anode layer in an array substrate in some embodiments according to the present disclosure.

FIG. 23A is a diagram illustrating the structure of an anode layer in an array substrate in some embodiments according to the present disclosure. FIG. 23B is a diagram illustrating the structure of a second signal line layer and an anode layer in an array substrate in some embodiments according to the present disclosure. Referring to FIG. 4A to FIG. 4K, FIG. 23A, and FIG. 23B, the array substrate includes a respective gap extending through a respective anode AD. For example, the array substrate includes a first gap GP1 extending through the first anode AD1, a second gap GP2 extending through the second anode AD2, a third gap GP3-1 and a fourth gap GP3-2 extending through the third anode AD3, respectively.

In some embodiments, an orthographic projection of an insulating material in the respective gap on the base substrate overlaps with an orthographic projection of a respective data line on the base substrate. For example, an orthographic projection of an insulating material in the first gap GP1 on the base substrate overlaps with an orthographic projection of the first data line DL1 on the base substrate. An orthographic projection of an insulating material in the second gap GP2 on the base substrate overlaps with an orthographic projection of the first data line DL1 on the base substrate. An orthographic projection of an insulating material in the third gap GAP3-1 on the base substrate overlaps with an orthographic projection of the second data line DL2 on the base substrate. An orthographic projection of an insulating material in the fourth gap GAP3-2 on the base substrate overlaps with an orthographic projection of the second data line DL2 on the base substrate.

In some embodiments, a length of a first overlapping area where an orthographic projection of the first anode AD1 on the base substrate overlaps with an orthographic projection of a first corresponding data line on the base substrate along an extension direction of the first corresponding data line is less than a total length of the first anode AD1 along the extension direction of the first corresponding data line. Optionally, a length of a second overlapping area where an orthographic projection of the second anode AD2 on the base substrate overlaps with an orthographic projection of a second corresponding data line on the base substrate along an extension direction of the second corresponding data line is less than a total length of the second anode AD2 along the extension direction of the second corresponding data line. Optionally, a length of a third overlapping area where an orthographic projection of the third anode AD3 on the base substrate overlaps with an orthographic projection of a third corresponding data line on the base substrate along an extension direction of the third corresponding data line is less than a total length of the third anode AD3 along the extension direction of the third corresponding data line. Optionally, the first corresponding data line, the second corresponding data line, and the third corresponding data line are selected from the first data line DL1 and the second data line DL2.

In one example, a length of a first overlapping area where an orthographic projection of the first anode AD1 on the base substrate overlaps with an orthographic projection of the first data line DL1 on the base substrate along an extension direction of the first data line DL1 is less than a total length of the first anode AD1 along the extension direction of the first data line DL1. A length of a second overlapping area where an orthographic projection of the second anode AD2 on the base substrate overlaps with an orthographic projection of the first data line DL1 on the base substrate along an extension direction of the first data line DL1 is less than a total length of the second anode AD2 along the extension direction of the first data line DL1. A length of a third overlapping area where an orthographic projection of the third anode AD3 on the base substrate overlaps with an orthographic projection of the second data line DL2 on the base substrate along an extension direction of the second data line DL2 is less than a total length of the third anode AD3 along the extension direction of the second data line DL2.

Figure 24A:
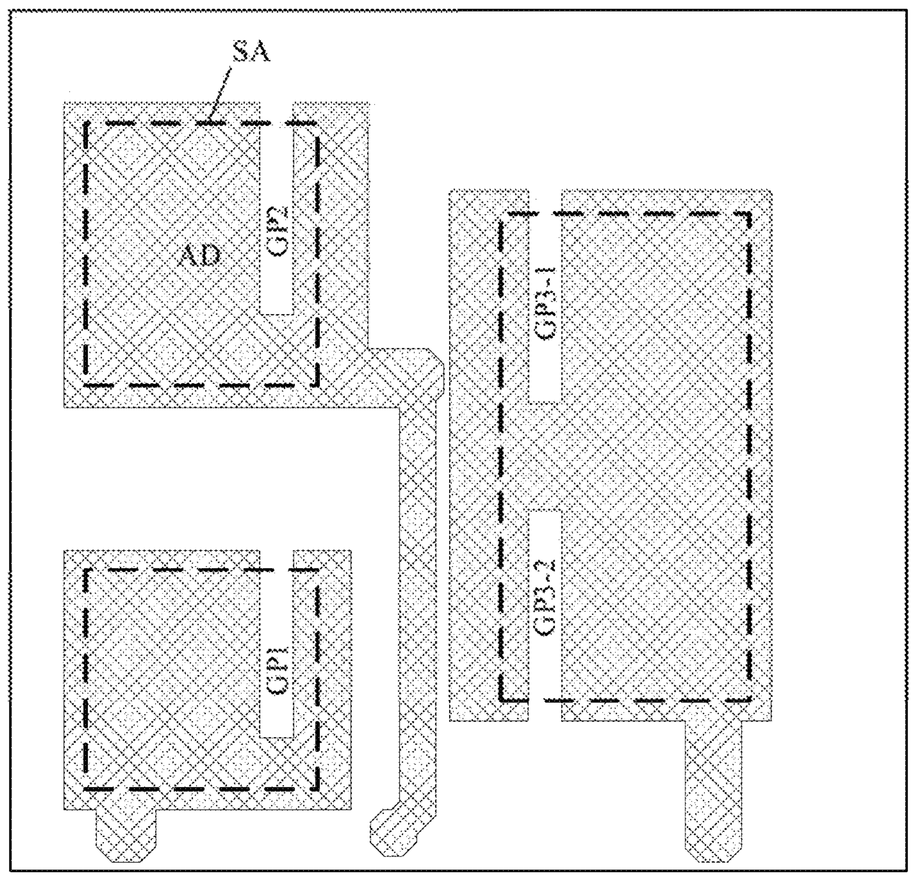
FIG. 24A is a diagram illustrating the structure of an anode layer in an array substrate in some embodiments according to the present disclosure.
Figure 24B:
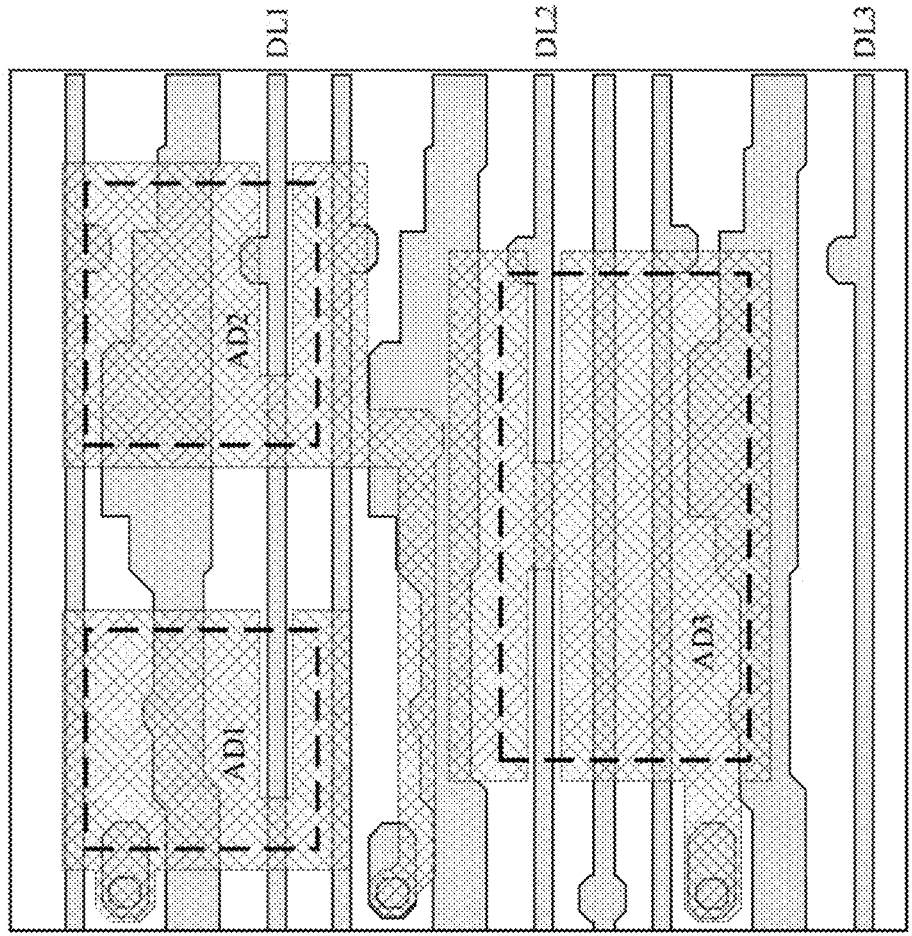
FIG. 24B is a diagram illustrating the structure of a second signal line layer and an anode layer in an array substrate in some embodiments according to the present disclosure.

FIG. 24A is a diagram illustrating the structure of an anode layer in an array substrate in some embodiments according to the present disclosure. FIG. 24B is a diagram illustrating the structure of a second signal line layer and an anode layer in an array substrate in some embodiments according to the present disclosure. The respective anode depicted in FIG. 24A and FIG. 24B has an increase area as compared to the respective anode depicted in FIG. 23A and FIG. 23B, to compensate the light emitting area reduced due to the presence of the respective gap. For example, the first anode AD1 has an additional portion on the right side as compared to the first anode AD1 in FIG. 23A and FIG. 23B, the second anode AD2 has an additional portion on the right side as compared to the second anode AD2 in FIG. 23A and FIG. 23B, and the third anode AD3 has an additional portion on the left side as compared to the third anode AD2 in FIG. 23A and FIG. 23B.

Figure 25A:
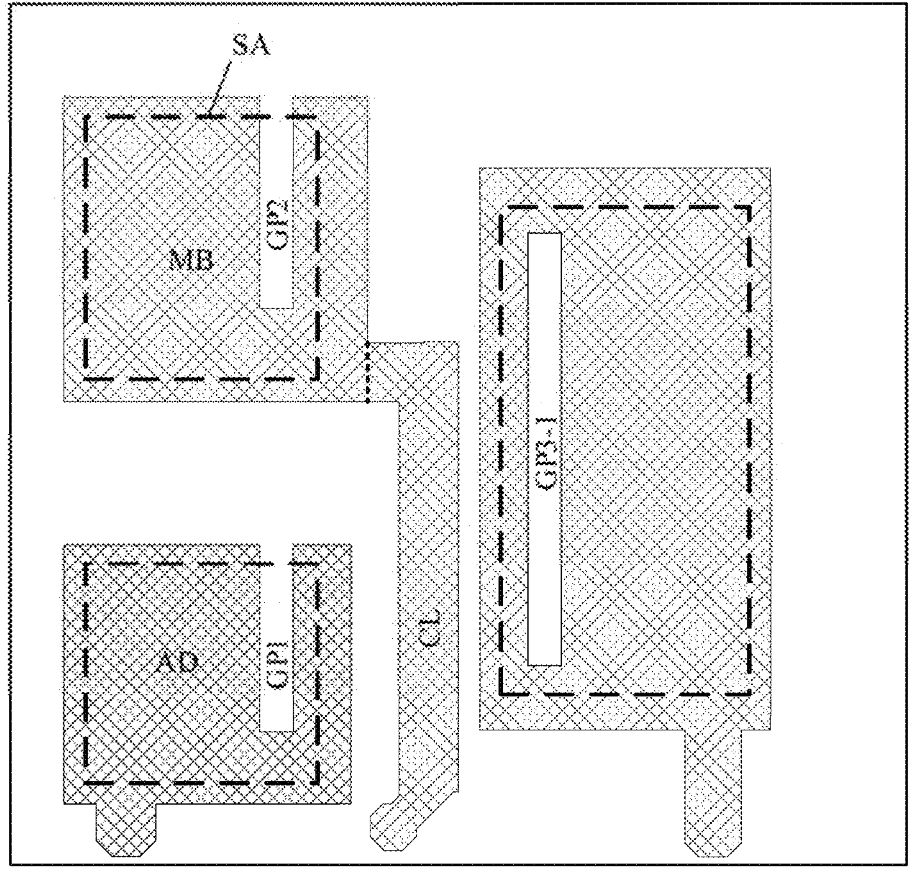
FIG. 25A is a diagram illustrating the structure of an anode layer in an array substrate in some embodiments according to the present disclosure.
Figure 25B:
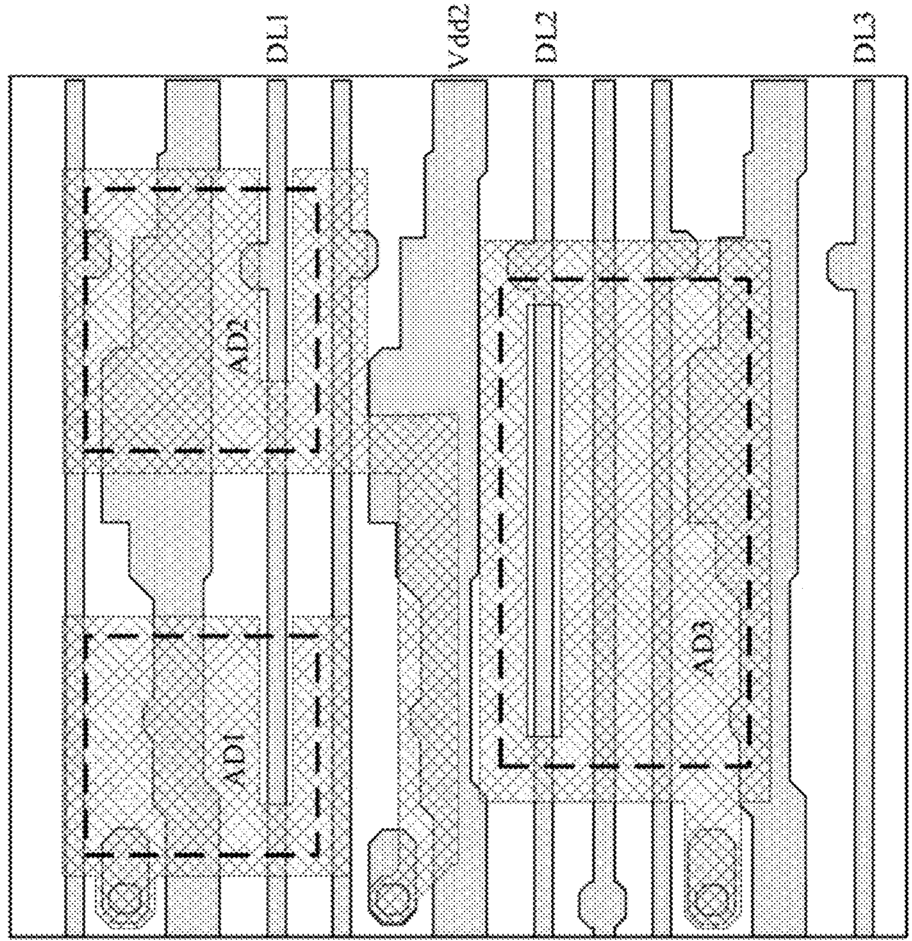
FIG. 25B is a diagram illustrating the structure of a second signal line layer and an anode layer in an array substrate in some embodiments according to the present disclosure.

FIG. 25A is a diagram illustrating the structure of an anode layer in an array substrate in some embodiments according to the present disclosure. FIG. 25B is a diagram illustrating the structure of a second signal line layer and an anode layer in an array substrate in some embodiments according to the present disclosure. As compared to the array substrate depicted in FIG. 4A to FIG. 4K, FIG. 24A, and FIG. 24B, an orthographic projection of the third anode AD3 on the base substrate is substantially non-overlapping (e.g., at least 80% non-overlapping, at least 85% non-overlapping, at least 90% non-overlapping, at least 95% non-overlapping, at least 97% non-overlapping, at least 98% non-overlapping, at least 99% non-overlapping, or completely non-overlapping) with an orthographic projection of the plurality of first voltage supply line second branches Vdd2 on the base substrate. In contrast, in the array substrate depicted in FIG. 4A to FIG. 4K, FIG. 24A, and FIG. 24B, an orthographic projection of the third anode AD3 on the base substrate at least partially (e.g., at least 1%, at least 2%, at least 5%, at least 10%, at least 15%, or at least 20%) overlaps with orthographic projection of the plurality of first voltage supply line second branches Vdd2 on the base substrate.

As compared to the array substrate depicted in FIG. 4A to FIG. 4K, FIG. 24A, and FIG. 24B, an overlapping area between an orthographic projection of the second anode AD2 on the base substrate and an orthographic projection of the plurality of first voltage supply line second branches Vdd2 on the base substrate increases.

In some embodiments, the second anode AD2 is an anode in a green subpixel, and the third anode AD3 is an anode in a blue subpixel. An increased overlapping area between the orthographic projection of the second anode AD2 on the base substrate and the orthographic projection of the plurality of first voltage supply line second branches Vdd2 on the base substrate results in an increased parasitic capacitance between the second anode AD2 and the plurality of first voltage supply line second branches Vdd2. A decreased overlapping area between the orthographic projection of the third anode AD3 on the base substrate and the orthographic projection of the plurality of first voltage supply line second branches Vdd2 on the base substrate results in a decreased parasitic capacitance between the third anode AD3 and the plurality of first voltage supply line second branches Vdd2.

The inventors of the present disclosure discover that the green subpixel has a relatively higher light emission efficiency as compared to the blue subpixel. By having the increased parasitic capacitance between the second anode AD2 and the plurality of first voltage supply line second branches Vdd2 and the decreased parasitic capacitance between the third anode AD3 and the plurality of first voltage supply line second branches Vdd2, light emission efficiencies of green subpixels and blue subpixels can be fine-tuned to achieve a higher display uniformity.

In some embodiments, the second anode AD2 includes a main body MB and a connecting line CL connecting the main body MB with a corresponding anode connecting pad. In some embodiments, an orthographic projection of the connecting line CL on the base substrate at least partially overlaps with an orthographic projection of the plurality of first voltage supply line second branches Vdd2 on the base substrate. Optionally, an orthographic projection of the main body MB on the base substrate is non-overlapping with the orthographic projection of the plurality of first voltage supply line second branches Vdd2 on the base substrate.

Figure 26A:
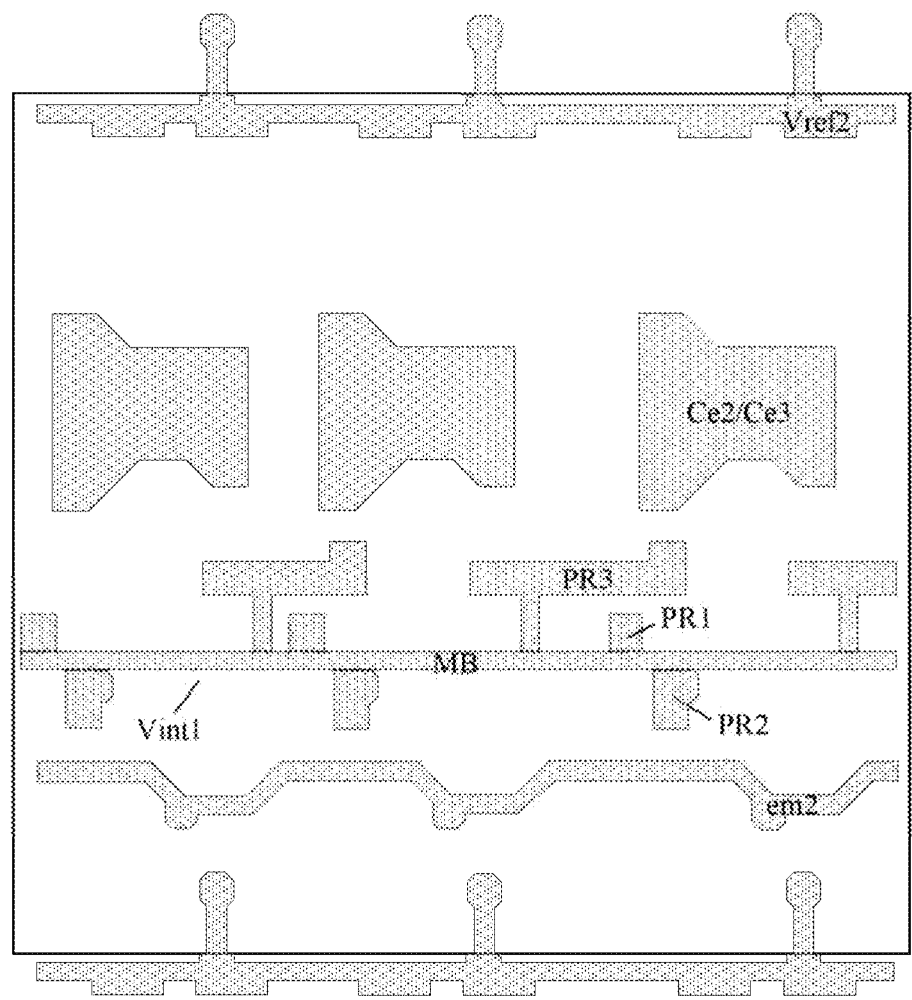
FIG. 26A is a diagram illustrating the structure of a second conductive layer in an array substrate in some embodiments according to the present disclosure.
Figure 26B:
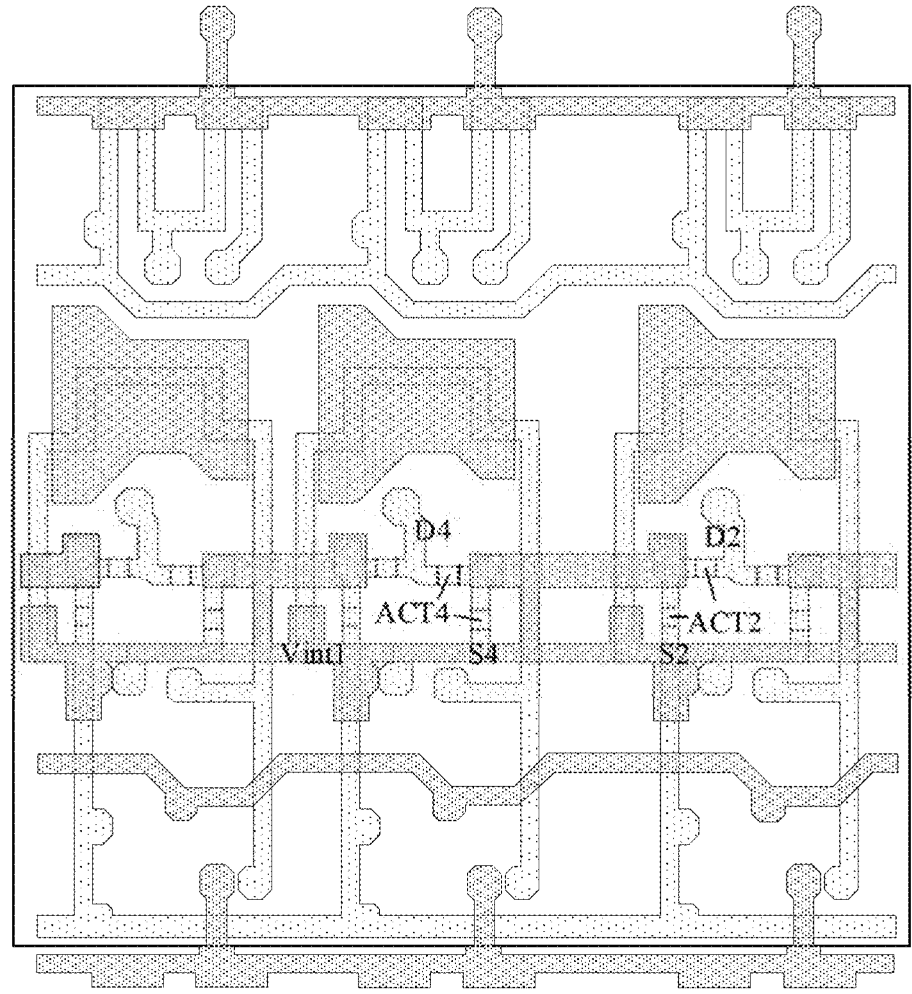
FIG. 26B is a diagram illustrating the structure of a semiconductor material layer and a second conductive layer in an array substrate in some embodiments according to the present disclosure.

FIG. 26A is a diagram illustrating the structure of a second conductive layer in an array substrate in some embodiments according to the present disclosure. FIG. 26B is a diagram illustrating the structure of a semiconductor material layer and a second conductive layer in an array substrate in some embodiments according to the present disclosure. As compared to the array substrate depicted in FIG. 4A to FIG. 4M, the respective first reset signal line of a plurality of first reset signal lines Vint1 in the array substrate depicted in FIG. 4A to FIG. 4K, FIG. 26A, and FIG. 26B further includes a third protrusion PR3 protruding away from the main body MB.

In some embodiments, an orthographic projection of the third protrusion PR3 on a base substrate at least partially overlaps with an orthographic projection of a portion of the semiconductor material layer between two active layer portions (e.g., two channel parts) of the second transistor T2 in a first adjacent pixel driving circuit of two adjacent pixel driving circuits in a same row on the base substrate, and at least partially overlaps with an orthographic projection of a portion of the semiconductor material layer between two active layer portions (e.g., two channel parts) of the fourth transistor T4 in a second adjacent pixel driving circuit of the two adjacent pixel driving circuits in the same row on the base substrate. The inventors of the present disclosure discover that this unique structure enhances stability of the second transistor T2 and the fourth transistor T4.

Figure 27A:
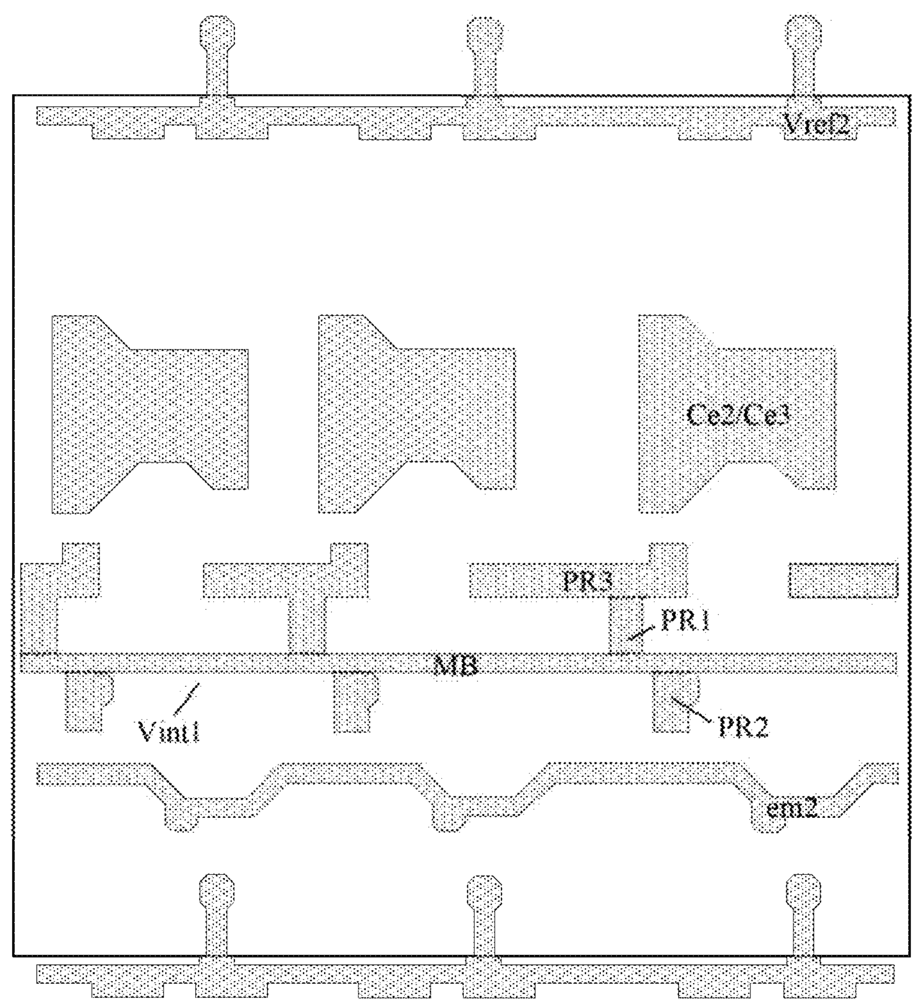
FIG. 27A is a diagram illustrating the structure of a second conductive layer in an array substrate in some embodiments according to the present disclosure.
Figure 27B:
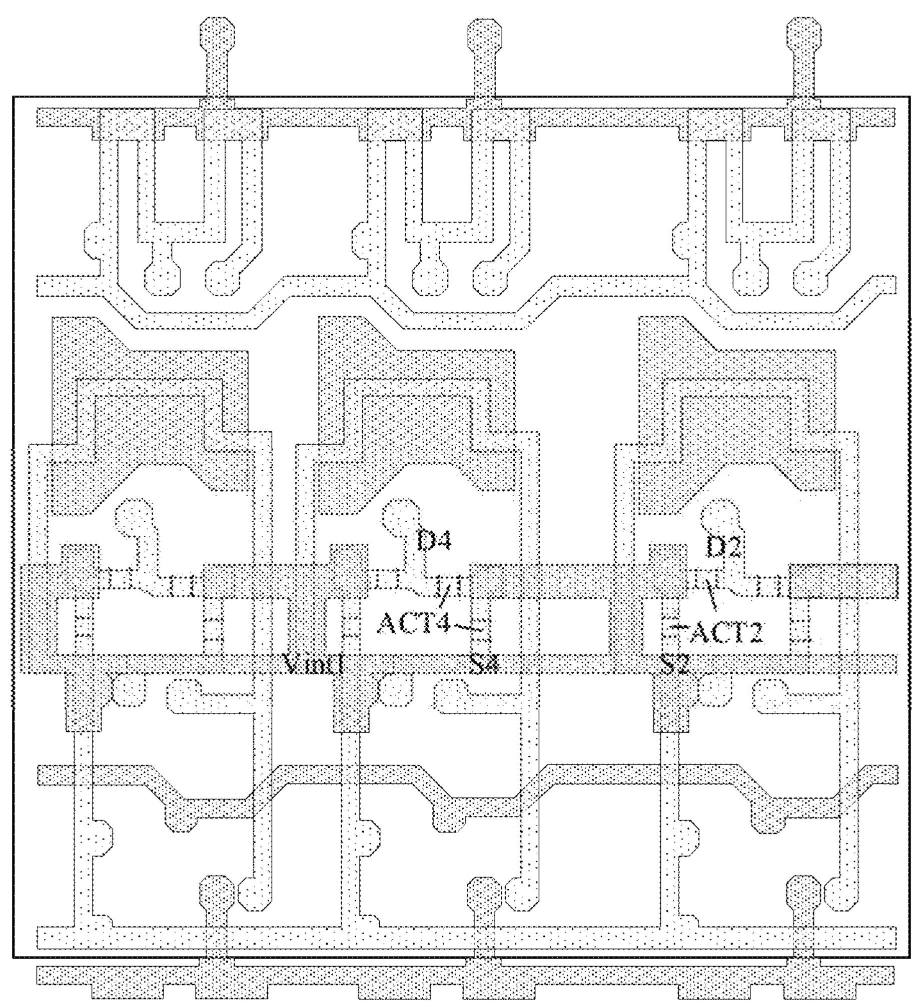
FIG. 27B is a diagram illustrating the structure of a semiconductor material layer and a second conductive layer in an array substrate in some embodiments according to the present disclosure.

FIG. 27A is a diagram illustrating the structure of a second conductive layer in an array substrate in some embodiments according to the present disclosure. FIG. 27B is a diagram illustrating the structure of a semiconductor material layer and a second conductive layer in an array substrate in some embodiments according to the present disclosure. As compared to the array substrate depicted in FIG. 4A to FIG. 4K, FIG. 26A, and FIG. 26B, the third protrusion PR3 in the array substrate depicted in FIG. 4A to FIG. 4K, FIG. 27A, and FIG. 27B is directly connected to the first protrusion PR1. Optionally, the first protrusion PR1 connects the third protrusion PR3 with the main body MB.

In some embodiments, an orthographic projection of the third protrusion PR3 on a base substrate at least partially overlaps with an orthographic projection of a portion of the semiconductor material layer between two active layer portions (e.g., two channel parts) of the second transistor T2 in a first adjacent pixel driving circuit of two adjacent pixel driving circuits in a same row on the base substrate, and at least partially overlaps with an orthographic projection of a portion of the semiconductor material layer between two active layer portions (e.g., two channel parts) of the fourth transistor T4 in a second adjacent pixel driving circuit of the two adjacent pixel driving circuits in the same row on the base substrate. The inventors of the present disclosure discover that this unique structure enhances stability of the second transistor T2 and the fourth transistor T4.

Figure 28A:
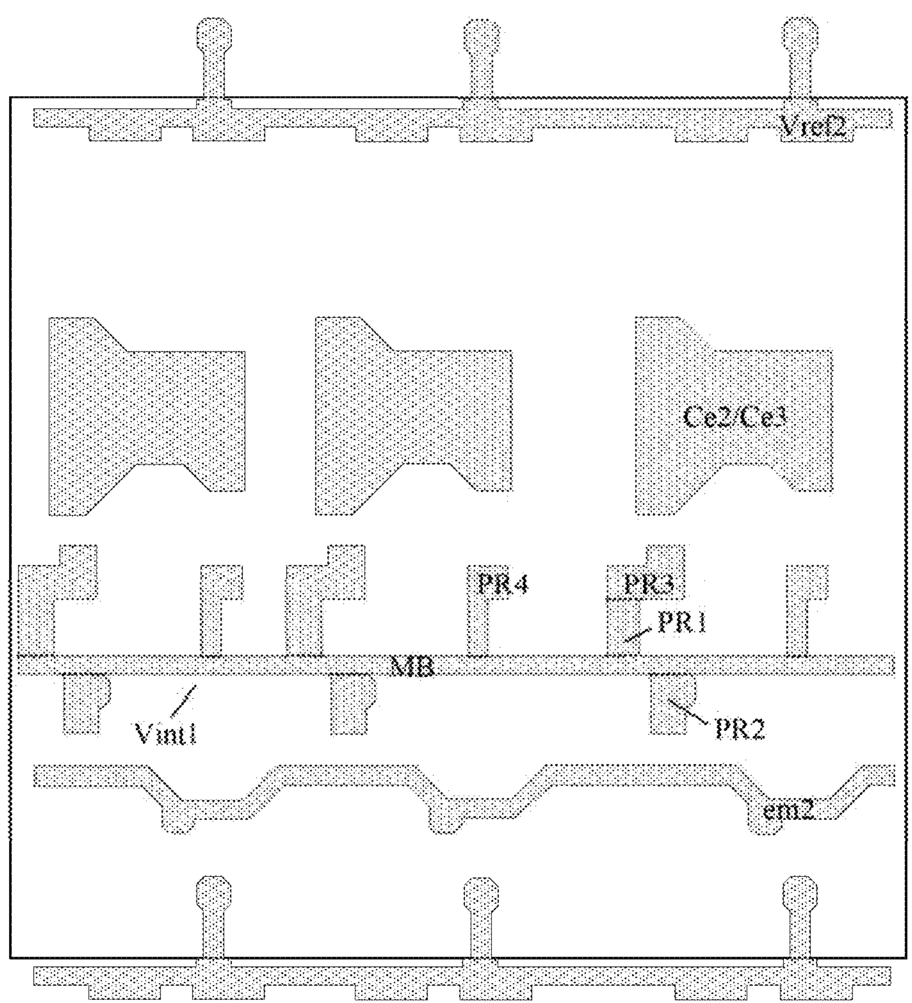
FIG. 28A is a diagram illustrating the structure of a second conductive layer in an array substrate in some embodiments according to the present disclosure.
Figure 28B:
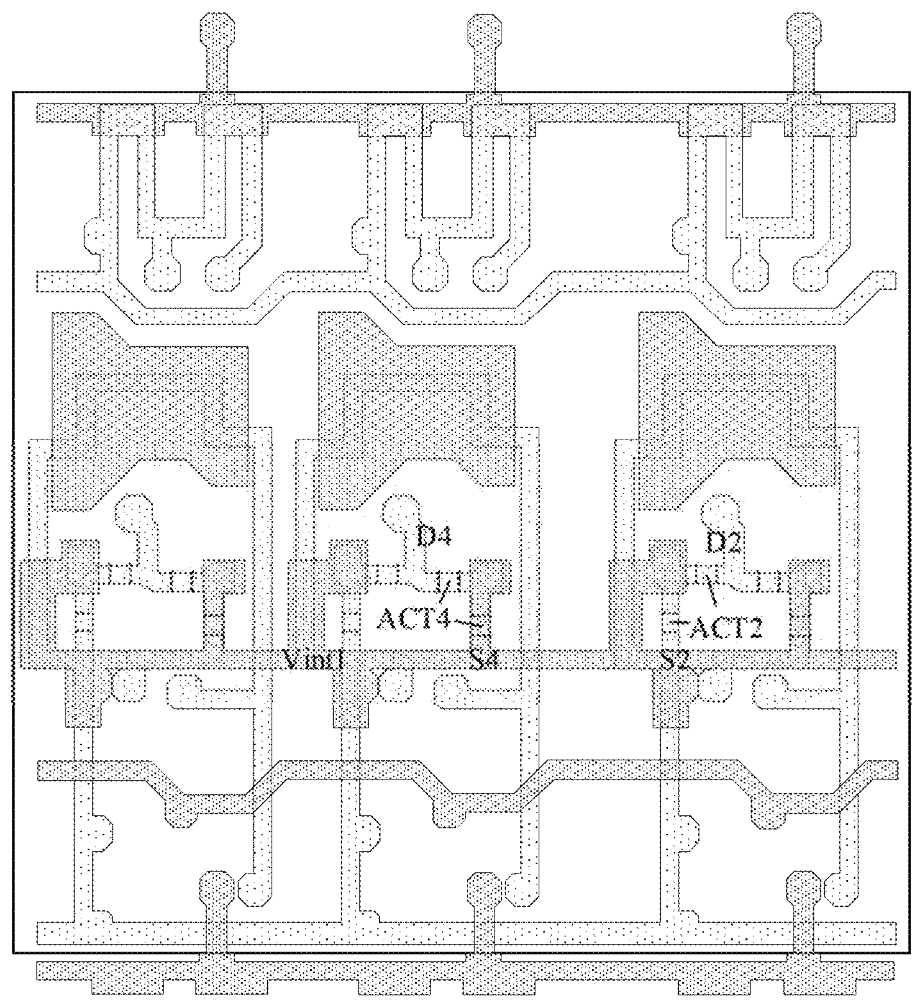
FIG. 28B is a diagram illustrating the structure of a semiconductor material layer and a second conductive layer in an array substrate in some embodiments according to the present disclosure.

FIG. 28A is a diagram illustrating the structure of a second conductive layer in an array substrate in some embodiments according to the present disclosure. FIG. 28B is a diagram illustrating the structure of a semiconductor material layer and a second conductive layer in an array substrate in some embodiments according to the present disclosure. As compared to the array substrate depicted in FIG. 4A to FIG. 4M, the respective first reset signal line of a plurality of first reset signal lines Vint1 in the array substrate depicted in FIG. 4A to FIG. 4K, FIG. 28A, and FIG. 28B further includes a third protrusion PR3 and a fourth protrusion PR4.

In some embodiments, the third protrusion PR3 in the array substrate depicted in FIG. 4A to FIG. 4K, FIG. 28A, and FIG. 28B is directly connected to the first protrusion PR1. Optionally, the first protrusion PR1 connects the third protrusion PR3 with the main body MB. In some embodiments, the fourth protrusion PR4 in the array substrate depicted in FIG. 4A to FIG. 4K, FIG. 28A, and FIG. 28B is directly connected to the main body MB.

In some embodiments, an orthographic projection of the third protrusion PR3 on a base substrate at least partially overlaps with an orthographic projection of a portion of the semiconductor material layer between two active layer portions (e.g., two channel parts) of the second transistor T2 in a first adjacent pixel driving circuit of two adjacent pixel driving circuits in a same row on the base substrate. In some embodiments, an orthographic projection of the fourth protrusion PR4 on the base substrate at least partially overlaps with an orthographic projection of a portion of the semiconductor material layer between two active layer portions (e.g., two channel parts) of the fourth transistor T4 in a second adjacent pixel driving circuit of the two adjacent pixel driving circuits in the same row on the base substrate. The inventors of the present disclosure discover that this unique structure enhances stability of the second transistor T2 and the fourth transistor T4.

In some embodiments, the orthographic projection of the third protrusion PR3 on the base substrate is substantially non-overlapping (e.g., at least 80% non-overlapping, at least 85% non-overlapping, at least 90% non-overlapping, at least 95% non-overlapping, at least 97% non-overlapping, at least 98% non-overlapping, at least 99% non-overlapping, or completely non-overlapping) with an orthographic projection of any data line on the base substrate. In some embodiments, the orthographic projection of the fourth protrusion PR4 on the base substrate is substantially non-overlapping (e.g., at least 80% non-overlapping, at least 85% non-overlapping, at least 90% non-overlapping, at least 95% non-overlapping, at least 97% non-overlapping, at least 98% non-overlapping, at least 99% non-overlapping, or completely non-overlapping) with an orthographic projection of any data line on the base substrate. The inventors of the present disclosure discover that this unique structure is conducive to image display with a relatively high refresh rate.

In another aspect, the present invention provides a display apparatus, including the array substrate described herein or fabricated by a method described herein, and one or more integrated circuits connected to the array substrate. Examples of appropriate display apparatuses include, but are not limited to, an electronic paper, a mobile phone, a tablet computer, a television, a monitor, a notebook computer, a digital album, a GPS, etc. Optionally, the display apparatus is an organic light emitting diode display apparatus. Optionally, the display apparatus is a micro light emitting diode display apparatus. Optionally, the display apparatus is a mini light emitting diode display apparatus.

In another aspect, the present disclosure provides a method of fabricating an array substrate. In some embodiments, the method includes forming a plurality of pixel driving circuits. Optionally, forming a respective pixel driving circuit of the plurality of pixel driving circuits comprises forming a driving transistor, forming a data write transistor, forming a first capacitor comprising a first capacitor electrode and a second capacitor electrode, and forming a second capacitor comprising a third capacitor electrode and a fourth capacitor electrode. Optionally, the second capacitor electrode and the third capacitor electrode are coupled to a second electrode of the data write transistor. Optionally, the method comprises forming a stacked structure of capacitor electrodes. Optionally, forming the stacked structure comprises forming the first capacitor electrode; forming an insulating layer on the first capacitor electrode; forming an electrode block comprising the second capacitor electrode and the third capacitor electrode on a side of the insulating layer away from the first capacitor electrode; forming an inter-layer dielectric layer on a side of the electrode block away from the insulating layer; and forming the fourth capacitor electrode on a side of the inter-layer dielectric layer away from the electrode block.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term “the invention”, “the present invention” or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use “first”, “second”, etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An array substrate, comprising a plurality of pixel driving circuits;

wherein a respective pixel driving circuit of the plurality of pixel driving circuits comprises a driving transistor, a data write transistor, a first capacitor comprising a first capacitor electrode and a second capacitor electrode, and a second capacitor comprising a third capacitor electrode and a fourth capacitor electrode;

wherein the second capacitor electrode and the third capacitor electrode are coupled to a second electrode of the data write transistor;

wherein the array substrate comprises a stacked structure of capacitor electrodes;

wherein the stacked structure comprises:

the first capacitor electrode;

an insulating layer on the first capacitor electrode;

an electrode block comprising the second capacitor electrode and the third capacitor electrode on a side of the insulating layer away from the first capacitor electrode;

an inter-layer dielectric layer on a side of the electrode block away from the insulating layer; and the fourth capacitor electrode on a side of the inter-layer dielectric layer away from the electrode block;

wherein the array substrate further comprises a first node connecting line and a second node connecting line in a first signal line layer;

wherein the respective pixel driving circuit further comprises a compensating transistor, a first reset transistor, and a second reset transistor;

the first node connecting line connects the first capacitor electrode with a second electrode of the compensating transistor and/or a second electrode of the first reset transistor;

the second node connecting line connects the electrode block with a second electrode of the data write transistor and/or a second electrode of the second reset transistor; and the first node connecting line and the second node connecting line are in a same layer as the fourth capacitor electrode.

2. The array substrate of claim 1, wherein the fourth capacitor electrode is connected to a first voltage supply line.

3. The array substrate of claim 1, wherein the first capacitor electrode, the insulating layer, and the electrode block form the first capacitor; and the electrode block, the inter-layer dielectric layer, and the fourth capacitor electrode form at least a part of the second capacitor.

4. The array substrate of claim 1, further comprising a plurality of first voltage supply line third branches in a semiconductor material layer;

wherein the stacked structure further comprises:

a gate insulating layer on a side of the first capacitor electrode away from the insulating layer; and a respective first voltage supply line third branch of the plurality of first voltage supply line third branches on a side of the gate insulating layer away from the first capacitor electrode.

5. The array substrate of claim 4, wherein the first capacitor electrode, the insulating layer, and the electrode block form the first capacitor;

the electrode block, the inter-layer dielectric layer, and the fourth capacitor electrode form a first part of the second capacitor; and the electrode block, the insulating layer, the gate insulating layer, a portion of the respective first voltage supply line third branch form a second part of the second capacitor.

6. The array substrate of claim 1, wherein the first node connecting line and the second node connecting line are on a side of the fourth capacitor electrode away from the electrode block.

7. The array substrate of claim 1, further comprising an interconnected first voltage supply network;

wherein the interconnected first voltage supply network comprises:

a plurality of first voltage supply line third branches in a semiconductor material layer;

a unitary structure comprising multiple fourth capacitor electrodes in a same row in a first signal line layer on a side of the semiconductor material layer away from a base substrate; and a plurality of first voltage supply line second branches in a second signal line layer on a side of the first signal line layer away from the semiconductor material layer.

8. The array substrate of claim 7, wherein a portion of a respective first voltage supply line third branch of the plurality of first voltage supply line third branches, the electrode block, and one or more insulating material layers between the respective first voltage supply line third branch and the electrode block form a part of the second capacitor.

9. The array substrate of claim 1, wherein the respective pixel driving circuit further comprises a compensating transistor, a first reset transistor, a first light emitting control transistor, a second light emitting control transistor, a second reset transistor, a third reset transistor, a fourth reset transistor, a first node, a second node, a third node, and a fourth node;

wherein the first node is connected to the first capacitor electrode of the first capacitor, a second electrode of the compensating transistor, and a gate electrode of the driving transistor;

the second node is connected to the second capacitor electrode of the first capacitor, the third capacitor electrode of the second capacitor, a second electrode of the data write transistor, and a second electrode of the second reset transistor;

the third node is connected to a second electrode of the first light emitting control transistor, a second electrode of the fourth reset transistor, and a first electrode of the driving transistor; and the fourth node is connected to a second electrode of the driving transistor, a first electrode of the compensating transistor, and a first electrode of the second light emitting control transistor.

10. A display apparatus, comprising the array substrate of claim 1, and one or more integrated circuits connected to the array substrate.

11. An array substrate, comprising a plurality of pixel driving circuits;

wherein a respective pixel driving circuit of the plurality of pixel driving circuits comprises a driving transistor, a data write transistor, a first capacitor comprising a first capacitor electrode and a second capacitor electrode, and a second capacitor comprising a third capacitor electrode and a fourth capacitor electrode;

wherein the second capacitor electrode and the third capacitor electrode are coupled to a second electrode of the data write transistor;

wherein the array substrate comprises a stacked structure of capacitor electrodes;

wherein the stacked structure comprises:

the first capacitor electrode;

an insulating layer on the first capacitor electrode;

an electrode block comprising the second capacitor electrode and the third capacitor electrode on a side of the insulating layer away from the first capacitor electrode;

an inter-layer dielectric layer on a side of the electrode block away from the insulating layer; and the fourth capacitor electrode on a side of the inter-layer dielectric layer away from the electrode block;

wherein the array substrate further comprises a fourth node portion in a semiconductor material layer;

wherein the respective pixel driving circuit further comprises a compensating transistor and a second light emitting control transistor;

wherein the fourth node portion comprises at least a portion of a second electrode of the driving transistor, at least a portion of a first electrode of the compensating transistor, and at least a portion of a first electrode of the second light emitting control transistor; and an orthographic projection of the fourth node portion on a base substrate at least partially overlaps with an orthographic projection of a respective data line of a plurality of data lines on the base substrate.

12. The array substrate of claim 11, wherein the orthographic projection of the fourth node portion on the base substrate is at least 50% covered by an orthographic projection of a combination of the fourth capacitor electrode and a respective first reset signal line of a plurality of first reset signal lines.

13. The array substrate of claim 11, wherein the fourth capacitor electrode comprises a first portion and a second portion;

an orthographic projection of the first portion on the base substrate substantially covers an orthographic projection of the electrode block on the base substrate;

an orthographic projection of the second portion on the base substrate is non-overlapping with the orthographic projection of the electrode block on the base substrate; and the orthographic projection of the fourth node portion on the base substrate partially overlaps with the orthographic projection of the second portion on the base substrate.

14. The array substrate of claim 13, wherein the orthographic projection of the second portion on the base substrate partially overlaps with an orthographic projection of a respective reset control signal line of a plurality of reset control signal lines on the base substrate, and partially overlaps with an orthographic projection of a respective second compensation control signal line of a plurality of second compensation control signal lines on the base substrate.

15. The array substrate of claim 12, wherein the respective first reset signal line comprises a main body, a first protrusion extending away from the main body, and a second protrusion extending away from the main body;

the first protrusion and the second protrusion extend away from the main body along substantially opposite directions; and the orthographic projection of the fourth node portion on a base substrate partially overlaps with an orthographic projection of the first protrusion and the second protrusion on the base substrate, and partially overlaps with an orthographic projection of a portion of the main body connecting the first protrusion and the second protrusion on the base substrate.

16. An array substrate, comprising a plurality of pixel driving circuits;

wherein a respective pixel driving circuit of the plurality of pixel driving circuits comprises a driving transistor, a data write transistor, a first capacitor comprising a first capacitor electrode and a second capacitor electrode, and a second capacitor comprising a third capacitor electrode and a fourth capacitor electrode;

wherein the second capacitor electrode and the third capacitor electrode are coupled to a second electrode of the data write transistor;

wherein the array substrate comprises a stacked structure of capacitor electrodes;

wherein the stacked structure comprises:

the first capacitor electrode;

an insulating layer on the first capacitor electrode;

an electrode block comprising the second capacitor electrode and the third capacitor electrode on a side of the insulating layer away from the first capacitor electrode;

an inter-layer dielectric layer on a side of the electrode block away from the insulating layer; and the fourth capacitor electrode on a side of the inter-layer dielectric layer away from the electrode block;

wherein the array substrate further comprises:

a first data line configured to provide data signals to a first subpixel;

a second data line configured to provide data signals to a second subpixel;

a third data line configured to provide data signals to a third subpixel;

a first anode in the first subpixel;

a second anode in the second subpixel; and a third anode in the third subpixel;

wherein an orthographic projection of a combination of the first anode, the second anode, and the third anode on a base substrate partially overlaps with an orthographic projection of the first data line on the base substrate, partially overlaps with an orthographic projection of the second data line on the base substrate, and is non-overlapping with an orthographic projection of the third data line on the base substrate.

17. The array substrate of claim 16, wherein the orthographic projection of the first data line on the base substrate partially overlaps with an orthographic projection of the first anode on the base substrate, and partially overlaps with an orthographic projection of the second anode on the base substrate; and the orthographic projection of the second data line on the base substrate partially overlaps with an orthographic projection of the third anode on the base substrate.

18. The array substrate of claim 16, wherein a length of a first overlapping area where an orthographic projection of the first anode on the base substrate overlaps with an orthographic projection of a first corresponding data line on the base substrate along an extension direction of the first corresponding data line is less than a total length of the first anode along the extension direction of the first corresponding data line;

a length of a second overlapping area where an orthographic projection of the second anode on the base substrate overlaps with an orthographic projection of a second corresponding data line on the base substrate along an extension direction of the second corresponding data line is less than a total length of the second anode along the extension direction of the second corresponding data line;

a length of a third overlapping area where an orthographic projection of the third anode on the base substrate overlaps with an orthographic projection of a third corresponding data line on the base substrate along an extension direction of the third corresponding data line is less than a total length of the third anode along the extension direction of the third corresponding data line; and the first corresponding data line, the second corresponding data line, and the third corresponding data line are selected from the first data line and the second data line.

* * * * *